United States Patent
Lee et al.

(10) Patent No.: US 11,476,211 B2
(45) Date of Patent: Oct. 18, 2022

(54) SEMICONDUCTOR PACKAGE AND MANUFACTURING METHOD THEREOF

(71) Applicant: Nepes CO., LTD., Samseong-myeon (KR)

(72) Inventors: Jun Kyu Lee, Cheongju-si (KR); Su Yun Kim, Cheongju-si (KR); Dong Hoon Oh, Cheongju-si (KR); Yong Tae Kwon, Cheongju-si (KR); Ju Hyun Nam, Cheongju-si (KR)

(73) Assignee: NEPES CO., LTD., Samseong-myeon (KR)

( * ) Notice: Subject to any disclaimer, the term of this patent is extended or adjusted under 35 U.S.C. 154(b) by 0 days.

(21) Appl. No.: 17/121,804

(22) Filed: Dec. 15, 2020

(65) Prior Publication Data

US 2021/0193602 A1 Jun. 24, 2021

(30) Foreign Application Priority Data

Dec. 19, 2019 (KR) .................. 10-2019-0170748
Sep. 25, 2020 (KR) .................. 10-2020-0124559

(51) Int. Cl.
*H01L 23/00* (2006.01)

(52) U.S. Cl.
CPC .............. *H01L 24/05* (2013.01); *H01L 24/03* (2013.01); *H01L 24/11* (2013.01); *H01L 24/13* (2013.01); *H01L 24/16* (2013.01); *H01L 2224/024* (2013.01); *H01L 2224/0239* (2013.01); *H01L 2224/02311* (2013.01); *H01L 2224/02377* (2013.01); *H01L 2224/02379* (2013.01); *H01L 2224/02381* (2013.01); *H01L 2224/0345* (2013.01); *H01L 2224/0346* (2013.01); *H01L 2224/03825* (2013.01); *H01L 2224/0401* (2013.01); *H01L 2224/0557* (2013.01); *H01L 2224/05541* (2013.01); *H01L 2224/05573* (2013.01); *H01L 2224/05644* (2013.01); *H01L 2224/05647* (2013.01); *H01L 2224/05655* (2013.01); *H01L 2224/05664* (2013.01);

(Continued)

(58) Field of Classification Search
CPC ....................................... H01L 24/05
See application file for complete search history.

(56) References Cited

U.S. PATENT DOCUMENTS 8,912,668 B2 * 12/2014 Chen .............. H01L 21/311
257/784
10,141,275 B2 * 11/2018 Lin .................. H01L 24/05

(Continued)

FOREIGN PATENT DOCUMENTS

KR 20060047829 A 5/2006
KR 20190017266 A 2/2019

(Continued)

*Primary Examiner* — William A Harriston
(74) *Attorney, Agent, or Firm* — Bayramoglu Law Offices LLC

(57) ABSTRACT

A semiconductor package and a manufacturing method thereof are provided. The semiconductor package includes a lower structure including a semiconductor chip having a chip terminal; an external connection terminal connecting the semiconductor chip to an external device; and an intermediate connection structure including an upper surface and a lower surface opposite to the upper surface, and positioned between the lower structure and the external connection terminal.

18 Claims, 29 Drawing Sheets

(52) U.S. Cl.
CPC ............ *H01L 2224/11849* (2013.01); *H01L 2224/13006* (2013.01); *H01L 2224/13023* (2013.01); *H01L 2224/13025* (2013.01); *H01L 2224/16225* (2013.01); *H01L 2924/3511* (2013.01)

(56) References Cited

U.S. PATENT DOCUMENTS

| | | | |
|---|---|---|---|
| 10,797,012 B2* | 10/2020 | Mohammed | H01L 24/03 |
| 2003/0222353 A1* | 12/2003 | Yamada | H01L 24/05 257/773 |
| 2009/0283903 A1* | 11/2009 | Park | H01L 24/03 257/737 |
| 2011/0108981 A1* | 5/2011 | Rahim | H01L 23/3171 257/737 |
| 2015/0294948 A1 | 10/2015 | Ayotte et al. | |
| 2016/0118312 A1* | 4/2016 | Hu | H01L 21/481 174/251 |
| 2016/0118328 A1* | 4/2016 | Hu | H01L 21/4853 438/123 |
| 2018/0040575 A1* | 2/2018 | Lin | H01L 24/03 |
| 2018/0082963 A1* | 3/2018 | Lin | H01L 23/49811 |

FOREIGN PATENT DOCUMENTS

| | | |
|---|---|---|
| TW | 201511203 A | 3/2015 |
| TW | 201913905 A | 4/2019 |

* cited by examiner

SEMICONDUCTOR PACKAGE AND MANUFACTURING METHOD THEREOF

CROSS-REFERENCE TO RELATED APPLICATION

This application claims priority to and the benefit of Korean Patent Application No. 10-2019-0170748, filed on Dec. 19, 2019, and Korean Patent Application No. 10-2020-0124559, filed on Sep. 25, 2020, the disclosure of which is incorporated herein by reference in its entirety.

TECHNICAL FIELD

The present invention relates to a semiconductor package and a manufacturing method thereof, and more specifically, the present invention relates to a semiconductor package capable of reducing a difference in thermal expansion with an external device such as a board and the like, and a manufacturing method thereof.

BACKGROUND

In general, a semiconductor package is manufactured by performing a semiconductor packaging process for semiconductor chips manufactured by performing various semiconductor processes on a wafer. Recently, in order to reduce the production cost of a semiconductor package, a wafer-level package technology has been proposed that performs a semiconductor package process at the wafer level and individualizes the wafer-level semiconductor package that has undergone a semiconductor package process into individual units.

FIG. 1 is a diagram illustrating a difference in thermal expansion between a semiconductor package and a board.

Meanwhile, referring to FIG. 1, the semiconductor package 10 may be manufactured and then mounted on an external device using an external connection terminal 11 thereof. For example, such an external device may be a board 20 such as a printed circuit board and the like. In this case, a difference in thermal expansion ($CTE_1 \neq CTE_2$, provided that CTE is an abbreviation of Coefficient of Expansion and refers to the coefficient of thermal expansion) occurs between the semiconductor package 10 and the board 20, and it may affect the external connection terminal 11 of the semiconductor package 10. In particular, when repetitive deformation occurs between the semiconductor package 10 and the board 20 due to such difference in thermal expansion, the existing semiconductor package 10 has a problem in that cracks may occur in the external connection terminal 11 as fatigue increases.

SUMMARY

Therefore, the present invention has been made to solve the above problems of the related art, and the present invention is directed to providing a semiconductor package having a structure capable of reducing the occurrence of cracks in the external connection terminal by reducing a difference in thermal expansion with a board, and a manufacturing method thereof.

In addition, the present invention is also directed to providing a semiconductor package having a structure capable of improving a stress distribution effect, and a manufacturing method thereof.

However, the problems to be solved in the present invention are not limited to the above-mentioned problems, and other problems that are not mentioned will be clearly understood by those skilled in the art from the following description.

In order to solve the above problems, the semiconductor package according to an exemplary embodiment of the present invention includes a lower structure including a semiconductor chip having a chip terminal; an external connection terminal connecting the semiconductor chip to an external device; and an intermediate connection structure including an upper surface and a lower surface opposite thereto, and positioned between the lower structure and the external connection terminal.

The present invention configured as the above has a structure capable of reducing a difference in thermal expansion with an external device such as a board and the like, and thus, it has an advantage of reducing the occurrence of cracks in the external connection terminal.

In addition, the present invention has an advantage in that the structure formed by an insulating pattern and an external pad has a structure having a thickness suitable for stress distribution, thereby improving the stress distribution effect.

However, the effects that can be obtained in the present invention are not limited to the above-mentioned effects, and other effects not mentioned will be clearly understood by those of ordinary skill in the art from the following description.

EXPLANATION OF REFERENCE NUMERALS

Figure 1:
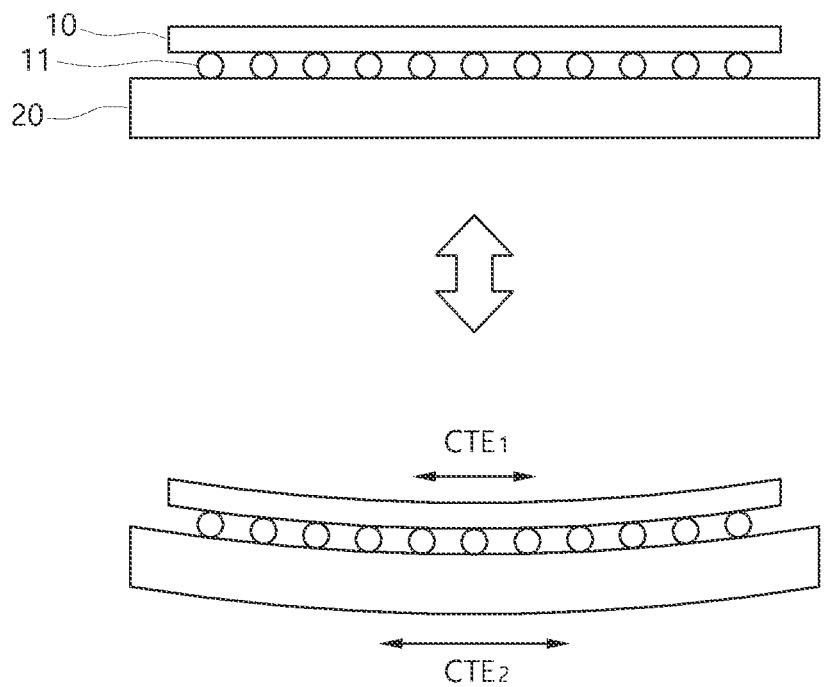
FIG. 1 is a diagram illustrating a difference in thermal expansion between a semiconductor package and a board.

| | |
|---|---|
| 100: Semiconductor package | 110: Semiconductor chip |
| 111: Chip terminal | 120: Protective layer |
| 130: Insulating pattern | 131: First insulating layer |
| 132: Second insulating layer | 133: Third insulating layer |
| 140: Redistributed pattern | 141: Redistributed layer |
| 142: First conductive via | 143: Second conductive via |
| 150: External pad | 160: External connection terminal |

DETAILED DESCRIPTION OF THE EMBODIMENTS

The above objects and means of the present invention and effects thereof will become more apparent from the following detailed description taken in conjunction with the accompanying drawings, and accordingly, those having ordinary skill in the art to which the present invention pertains may easily practice the technical spirit of the present invention. In addition, in describing the present invention, when it is determined that the detailed description of the known technology related to the present invention may unnecessarily obscure the gist of the present invention, the detailed description thereof will be omitted.

The terminology as used herein is for the purpose of describing exemplary embodiments only and is not intended to be limiting the invention. In the present specification, the singular forms also include the plural forms unless the case otherwise indicates. In the present specification, terms such as "comprise", "include", "provide with" or "have" do not exclude the presence or addition of one or more other components than the components mentioned.

In the present specification, terms such as "or", "at least one", and the like may refer to one of the words listed together, or may represent a combination of two or more. For example, "A or B" and "at least one of A and B" may include only one of A or B. and may include both A and B.

In the present specification, descriptions that follow "for example" and the like may not exactly match the information presented, such as the recited characteristics, variables, or values, and the exemplary embodiments of the present invention according to various examples of the present invention should not be limited to effects such as variations including tolerance errors, measurement errors, limits of measurement accuracy, and other commonly known factors.

In the present specification, when a component is described as being 'connected' or 'joined' to another component, it should be understood that it may be directly connected to or joined to the other component, but another component may be present therebetween. On the other hand, when a component is mentioned to be 'directly connected' or 'directly joined' to another component, it should be understood that there is no other component therebetween.

In the present specification, when a component is described as being 'on' or 'in contact' with another component, it should be understood that the component may be directly in contact with or connected to another component, but another component may be present therebetween. On the other hand, when a component is described as being "directly on" or "directly in contact" with another component, it may be understood that there is no other component therebetween. Other expressions describing the relationship between the components, such as 'between' and 'directly between', may be interpreted in the same manner.

In the present specification, terms such as 'first', 'second', and the like may be used to describe various components, but the corresponding components should not be limited by the above terms. In addition, the above terms should not be construed as limiting the order of each component, but may be used for the purpose of distinguishing one component from another. For example, a 'first component' may be referred to as a 'second component', and similarly, a 'second component' may also be referred to as a 'first component'.

Unless otherwise defined, all terms used in the present specification may be used in a sense that can be commonly understood by those having ordinary skill in the art. In addition, terms that are defined in a commonly used dictionary are not ideally or excessively interpreted unless they are specifically defined clearly.

Hereinafter, preferred exemplary embodiments according to the present invention will be described in detail with reference to the accompanying drawings.

However, the z-axis direction in which each component of the semiconductor package 100 according to various exemplary embodiments of the present invention is stacked is referred to as "a first direction", and the x-axis direction or the y-axis direction which is a direction in a plane perpendicular to the z-axis is referred to as "a second direction" In addition, for each component of the semiconductor package 100 according to various exemplary embodiments of the present invention, the length in the first direction (z-axis direction) is referred to as "thickness", "depth", or "height" of the component, and each length in the second direction (the x-axis direction and y-axis direction) is referred to as "width" and "breadth" of the component.

FIGS. 2, 4, 6, 8, 10, 12, 14, 16, 18, and 20 are cross-sectional diagrams of the semiconductor package 100 according to various exemplary embodiments of the present invention, respectively FIGS. 31 to 34 are application examples of the semiconductor package 100 according to various exemplary embodiments of the present invention, and show application examples in which a protective layer 120 is variously formed on the first semiconductor package 100a. However, although the protective layer 120 is not separately illustrated in FIGS. 1 to 23, the present invention is not limited thereto, and the semiconductor package 100 according to various exemplary embodiments of the present invention may include the protective layer 120. That is, the protective layer 120 illustrated in FIGS. 31 to 34 may be applied to the remaining semiconductor packages 100b to 100j.

The semiconductor package 100 according to various exemplary embodiments of the present invention includes a wafer-level package (WLP), a fan-out wafer-level package (FOWLP), or a panel level package (PLP), but is not limited thereto.

Referring to FIGS. 2 to 34, the semiconductor package 100 according to various exemplary embodiments of the present invention may include a semiconductor chip 110, a protective layer 120, an insulating pattern 130, a redistributed pattern 140, an external pad 150, and an external connection terminal 160. Such a semiconductor package 100 may be mounted on an external device using its own external connection terminal 160. For example, such an external device may be a board 20 such as a printed circuit board and the like.

The semiconductor chip 110 may include a plurality of individual devices of various types. For example, a plurality of individual devices may include photoelectric devices such as microelectronic devices, complementary metal insulator-semiconductor transistors (CMOS transistors), metal-oxide semiconductor field effect transistors (MOSFET), system large scale integration (LSI), CMOS imaging sensors (CIS), micro-electro-mechanical systems (MEMS), acoustic wave filter devices, active devices, passive devices, and the like, but are not limited thereto.

The semiconductor chip 110 may be a memory semiconductor chip. For example, the memory semiconductor chip may be a volatile memory semiconductor chip such as dynamic random access memory (DRAM) or static random access memory (SRAM), or a nonvolatile memory semiconductor chip such as phase-change random access memory (PRAM), magneto-resistive random access memory (MRAM), ferroelectric random access memory (FeRAM), or resistive random access memory (RRAM), but is not limited thereto.

The semiconductor chip 110 may be a logic chip. For example, the logic chip may be a central processor unit (CPU), micro-processor unit (MPU), graphic processor unit (GPU), or application processor (AP), but is not limited thereto.

Figure 2:
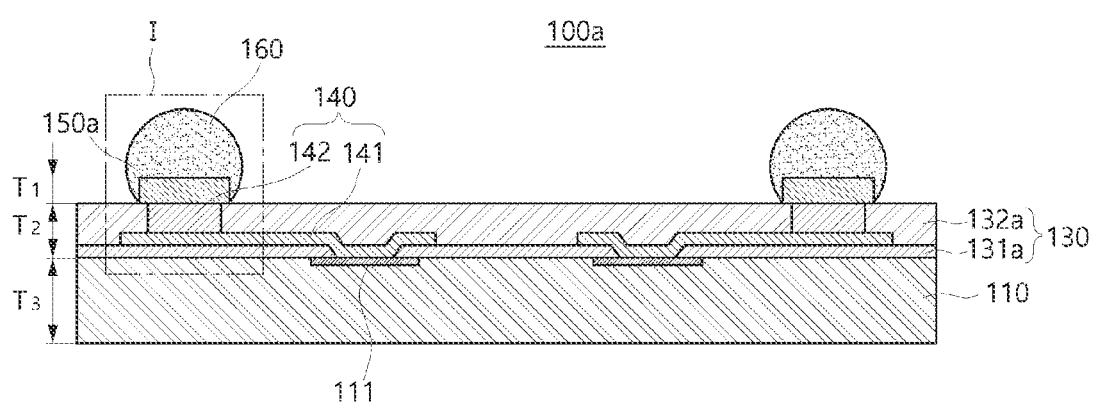
FIG. 2 is a cross-sectional diagram of a first semiconductor package 100a according to an exemplary embodiment of the present invention
Figure 3:
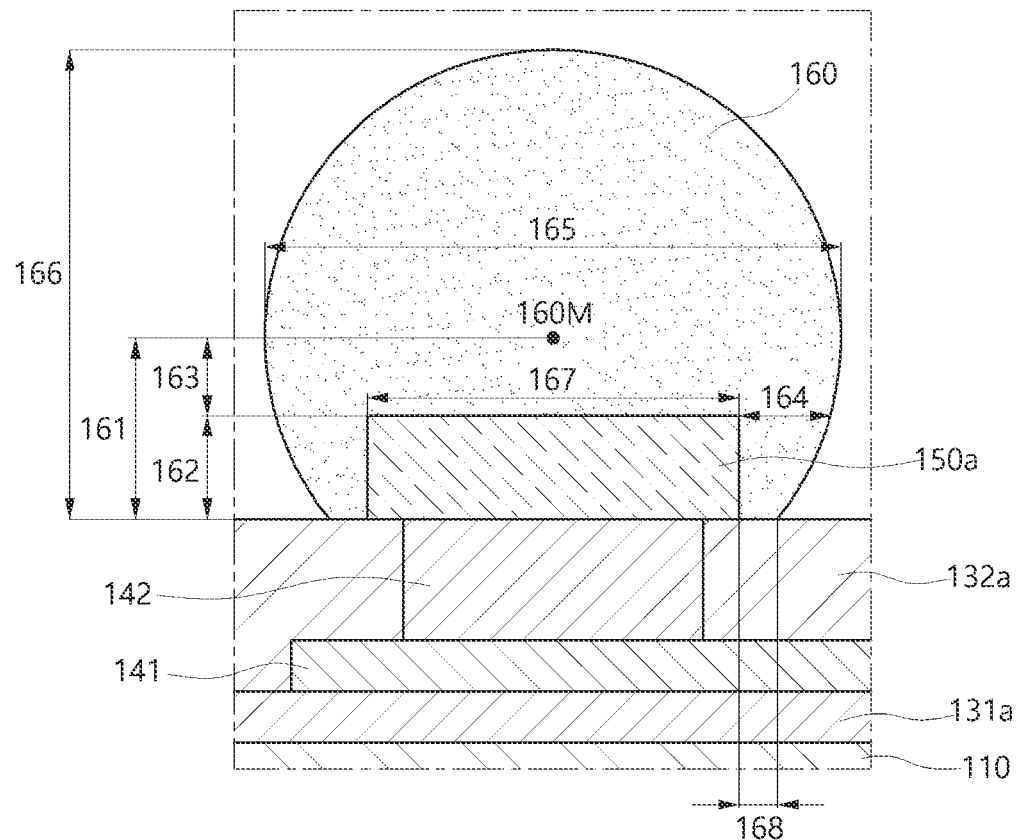
FIG. 3 is an enlarged cross-sectional diagram showing an area marked "I" when the external connection terminal 160 in FIG. 2 is a surface contact type.

In FIG. 2 and the like, the semiconductor package 100 is illustrated as including one semiconductor chip 110, but the semiconductor package 100 may also include a plurality of semiconductor chips 110. The plurality of semiconductor chips 110 included in the semiconductor package 100 may be the same type of semiconductor chips or different types of semiconductor chips. In addition, the semiconductor package 100 may be a system in package (SIP) in which different types of semiconductor chips are electrically connected to each other to operate as a single system.

The breadth and width of the semiconductor chip 110 may be about 2 mm to about 10 mm. More specifically, the breadth and width of the semiconductor chip 110 may be about 4 mm to about 7 mm. However, the breadth and width of the semiconductor chip 110 are not limited thereto, and may have more various values. In addition, the thickness of the semiconductor chip 110 may be about 100 µm to about 400 µm. More specifically, the thickness of the semiconductor chip 110 may be about 150 µm to about 350 µm. However, the thickness of the semiconductor chip 110 is not limited thereto, and may have more various values.

The semiconductor chip 110 may include a first surface and a second surface opposite to the first surface. A chip terminal (or referred to as a "chip pad") 111 may be formed on the first surface of the semiconductor chip 110. The chip terminal 111 may be electrically connected to a plurality of individual devices of various types formed on the semiconductor chip 101. The chip terminal 111 may have a thickness between about 0.5 µm and about 1.5 µm. However, the thickness of the chip terminal 111 is not limited thereto, and may have more various values.

The chip terminal 111 may input an input signal and output an output signal of the semiconductor chip 110. That is, the chip terminal 111 may be electrically connected to the integrated circuit of the semiconductor chip 110 to extend the function of the semiconductor chip 110 to the outside. For example, the chip terminal 111 may comprise a metal having a low specific resistance such as aluminum, copper, and the like, but is not limited thereto. In FIG. 2 and the like, it is illustrated that there are two chip terminals 111, but the number of chip terminals 111 is not limited thereto, and it may be a larger number.

Figure 34:
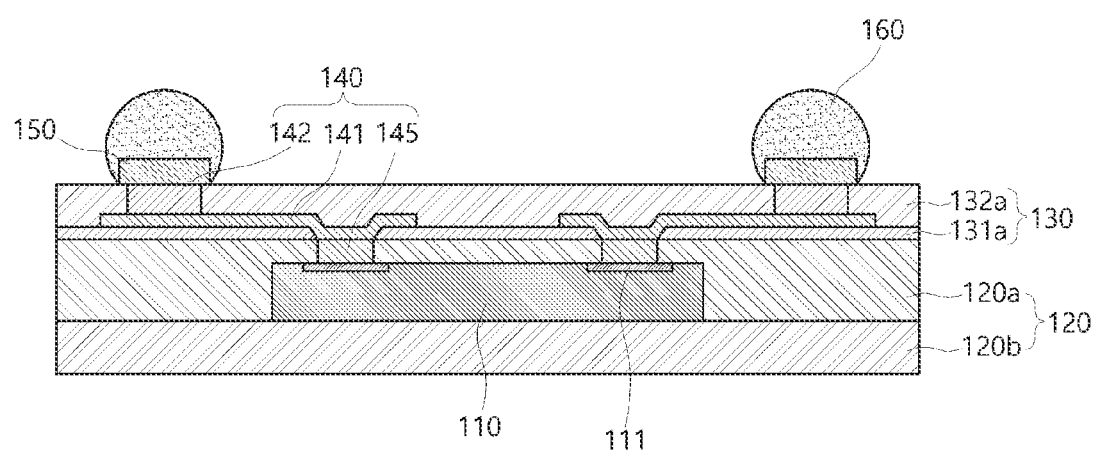

The protective layer 120 is a layer including a non-conductive material and may be provided on the second surface of the semiconductor chip 110, or may be provided to surround the side surface and the second surface of the semiconductor chip 110, or may be provided to surround the side surface, the first surface, and the second surface of the semiconductor chip 110. The protective layer 120 may be a layer formed to block the semiconductor chip 110 from a harmful environment. For example, the protective layer 120 may include various oxides or polymer materials, but is not limited thereto. The protective layer 120 may have a thickness of about 15 μm to about 30 μm on the second surface of the semiconductor chip 110. However, the thickness of the protective layer 120 is not limited thereto, and may have more various values. In addition, the protective layer 120 may comprise a plurality of layers 120a, 120b, as illustrated in FIG. 34.

Figure 31:
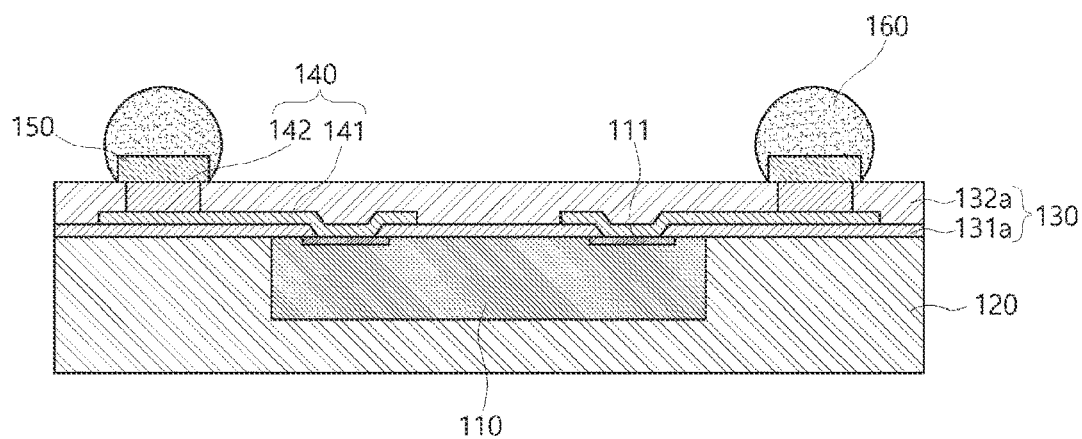
FIGS. 31 to 34 show application examples of the semiconductor package 100 according to various exemplary embodiments of the present invention.
Figure 32:
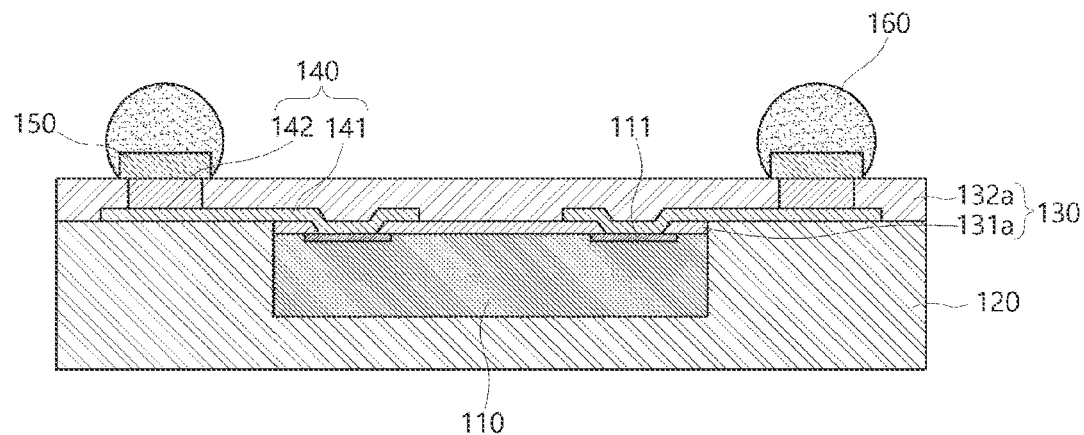
Figure 33:
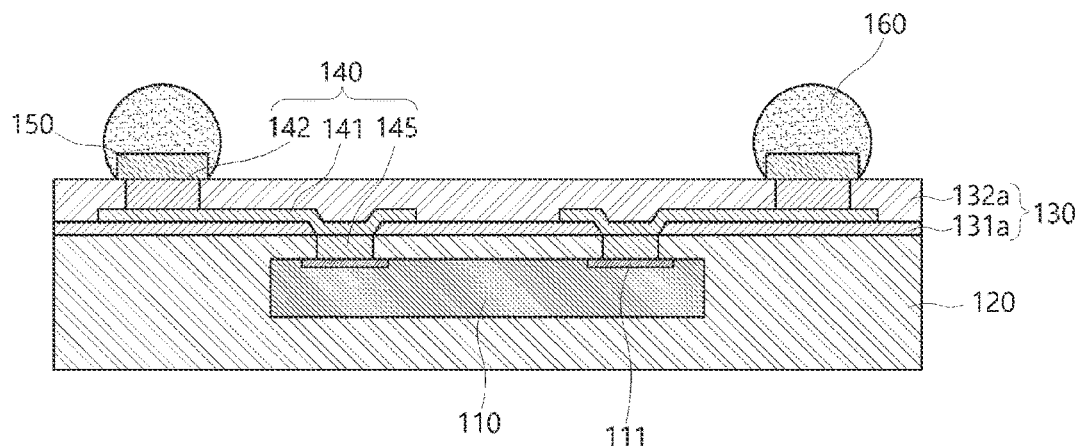

The insulating pattern 130 is a structure including a non-conductive material, and may be provided on the first surface of the semiconductor chip 110 or on the protective layer 120, and may surround the redistributed pattern 140 to prevent unnecessary electric short circuits. In particular, in FIGS. 2 to 30, an insulating layer 130 is illustrated to be formed directly on the semiconductor chip 110, but is not limited thereto. That is, the insulating layer 130 may be provided on the protective layer 120 as illustrated in FIGS. 33 and 34, and in this case, the protective layer 120 may be provided between the semiconductor chip 110 and the insulating layer 130. In addition, the insulating layer 130 may be provided on the first surface of the semiconductor chip 110 and the protective layer 120 as illustrated in FIGS. 31 and 32.

The insulating pattern 130 may have a structure in which a plurality of insulating layers are stacked. That is, in the first semiconductor package 100a, the second semiconductor package 100b, the fourth semiconductor package 100d, the fifth semiconductor package 100e, and the seventh semiconductor package 100g according to various exemplary embodiments of the present invention, the insulating pattern 130 may include a first insulating layer 131 and a second insulating layer 132 that are sequentially stacked. In addition, in the third semiconductor package 100c, the sixth semiconductor package 100f, the eighth semiconductor package 100h, and the ninth semiconductor package 100e according to various exemplary embodiments of the present invention, the insulating pattern 130 may include a first insulating layer 131, a second insulating layer 132, and a third insulating layer 133 that are sequentially stacked. In addition, in the tenth semiconductor package 100j according to various exemplary embodiments of the present invention, the insulating pattern 130 may include a first insulating layer 131, a second insulating layer 132, a third insulating layer, 133 and a fourth insulating layer 134 that are sequentially stacked.

At least one layer of each of the insulating layers 131, 132, 133, and 134, in particular, a layer that is formed to be relatively thick (e.g., about 20 μm or more or about 30 μm or more) may contribute to the improvement of the effective coefficient of thermal expansion of a first structure by the constitutional material or thickness thereof. In this case, the first structure refers to a structure formed by the semiconductor chip 110, the protective layer 120, and the insulating pattern 130, but it may further include a redistributed pattern 140, or die protective layer 120 may be excluded.

That is, since at least one layer of each of the insulating layers 131, 132, 133, and 134, in particular, a layer that is formed to be relatively thick has a first thickness in a thicker range compared to what is conventional, the corresponding insulating layer may have an increased effective coefficient of thermal expansion of the first structure compared to having a thickness which is thinner than the first thickness. In addition, by including a specific material of the corresponding insulating layer, the effective coefficient of thermal expansion of the first structure may be further increased than when the corresponding insulating layer does not include the specific material.

For example, it is preferable that at least one layer of the insulating layers 131, 132, 133, and 134, in particular, a layer that is formed to be relatively thick has an effective coefficient of thermal expansion of 7 ppm/° C. to 40 ppm/° C. such that the first structure has a value similar to the value of the effective coefficient of thermal expansion of an external device such as a board and the like. That is, when the effective coefficient of thermal expansion is less than 7 ppm/° C., the effective coefficient of thermal expansion of the first structure may be too low, and thus, it may deviate from a similar range for the value of the effective coefficient of thermal expansion of an external device such as a board and the like. In addition, when the effective coefficient of thermal expansion is more than 40 ppm/° C., the effective coefficient of thermal expansion of the first structure may become too large, and thus, it may deviate from a similar range for the value of the effective coefficient of thermal expansion of an external device such as a board and the like.

Each of the insulating layers 131, 132, 133, 134 may protect the redistributed pattern 140 by preventing physical/chemical damage from the outside to the redistributed pattern 140, and it may function as a buffer against external impacts. For example, each of the insulating layers 131, 132, 133, and 134 may comprise an insulating polymer, an epoxy, a silicon oxide film, a silicon nitride film, an insulating polymer, or a combination thereof. Alternatively, the insulating layers 131, 132, 133, and 134 may comprise a metal, a non-photosensitive material, or/and a photosensitive material, respectively. For example, the insulating polymer may include a general-purpose polymer such as polymethylmethacrylate (PMMA), polystylene (PS), polybenzoxazoles (PBO), acrylic polymer, imide polymer, aryl ether polymer, amide polymer, fluorine polymer, p-xylene polymer, vinyl alcohol polymer, polymer derivative having a phenolic group, or a combination thereof.

Each of the insulating layers 131, 132, 133, and 134 may comprise different materials from each other. For example, one insulating layer may comprise a non-photosensitive material, for example, non-photosensitive polyimide, and the other insulating layer may comprise a photosensitive material, for example, photosensitive polyimide. Alternatively, at least two of the insulating layers 131, 132, 133, and 134 may comprise the same material. For example, at least two insulating layers may comprise non-photosensitive polyimide or may comprise photosensitive polyimide.

However, the material of each of the insulating layers 131, 132, 133, and 134 is not limited to the above, and it may comprise a variety of materials.

The coefficient of thermal expansion (CTE) of each of the insulating layers 131, 132, 133, and 134 may be different from each other, or at least two may be the same. For example, the coefficient of thermal expansion of any one insulating layer may be more than, less than, or equal to the coefficient of thermal expansion of the other insulating layer.

At least one of the insulating layers 131, 132, 133, and 134, in particular, a layer that is formed to be relatively thick may include a plurality of fillers. In this case, the filler is particles having a diameter smaller than the thickness of the corresponding insulating layer, and by increasing the coefficient of thermal expansion of the corresponding insulating layer, the improvement of the effective coefficient of thermal expansion of the first structure may be implemented. That is, it may be preferable that the filler is a material having a higher coefficient of thermal expansion than the coefficient of thermal expansion of the main insulating material constituting the corresponding insulating layer. For example, the filler may have a diameter less than about ¼ times the thickness of the corresponding insulating layer, and the diameter may be 5 μm or less, but is not limited thereto. However, in the case of having a diameter greater than the corresponding limitation, the filler may have a plurality of concave structures in which the surface of the corresponding insulating layer is too uneven, thereby deteriorating properties such as surface adhesion of the corresponding insulating layer and the like. For example, the filler may include silica ($SiO_2$), but is not limited thereto.

In addition, when at least one layer of the insulating layers 131, 132, 133, and 134, in particular, a layer that is formed to be relatively thick includes a non-photosensitive material and a filler, the improvement of the effective coefficient of thermal expansion of the first structure may be implemented more effectively.

In each of the insulating layers 131, 132, 133, and 134, the surface roughness of the surfaces in contact with each other may be different from each other. For example, the surface roughness of the upper surface of the other insulating layer in contact with the lower surface of any one insulating layer may be different from the surface roughness of the lower surface of any one insulating layer.

Furthermore, the surface roughness of each of the insulating layers 131, 132, 133, and 134 may be different from each other. For example, the surface roughness of the upper surface of any one insulating layer may be more or less than the surface roughness of the upper surface or the lower surface of the other insulating layer.

However, the roughness of the upper surface or the lower surface of each of the insulating layers 131, 132, 133, and 134 is not limited to the above-described cases, and may have various roughnesses.

Specific shapes and effects of each of the insulating layers 131, 132, 133, and 134 will be described in more detail according to various exemplary embodiments to be described below.

A redistributed pattern 140 is a structure including a conductive material, and may transmit an electrical signal of a chip terminal 111, an external device (e.g., a board), or the like in a first direction and a second direction. That is, the redistributed pattern 140 is electrically connected to the chip terminal 111 of the semiconductor chip 110 and may provide an electrical connection path for electrically connecting the chip terminal 111 to an external device. In this case, the redistributed pattern 140 is provided in the insulating pattern 130 and may include various structures according to the thickness of each of the insulating layers 131, 132, 133, and 134. That is, as the redistributed pattern 140 extends in the second direction (i.e., the horizontal direction) in the insulating pattern 130 and extends in the first direction (i.e., the vertical direction) in the insulating pattern 130 with a redistributed layer 141 capable of transmitting an electric signal in the second direction, it may include a first conductive via 142, a second conductive via 143, a third conductive via 144, or a fourth conductive via 145 capable of transmitting an electric signal in the first direction. Certainly, the redistributed layer 141 may also include a portion for transmitting an electric signal in the first direction. In addition, each of the conductive vias 142, 143, 144, and 145 may electrically connect between the redistributed layer 141 and the chip terminal 111, or may electrically connect between any one redistributed layer 141 and the other redistributed layer 141, or may electrically connect between the redistributed layer 141 and the external pad 150.

For example, the redistributed pattern 140 may comprise W, Cu, Zr, Ti, Ta, Al, Ru, Pd, Pt, Co, Ni, or a combination thereof. At least two of the redistributed layer 141, the first conductive via 142, and the second conductive via 143 may comprise the same material or a combination of the same materials. Alternatively, at least two of the redistributed layer 141, the first conductive via 142, the second conductive via 143, the third conductive via 144, and the fourth conductive via 145 may comprise different materials or a combination of different materials.

In particular, in the case of a layer in which the uppermost layer of the insulating pattern 130, that is, the second insulating layer 132, the third insulating layer 133, or the fourth insulating layer 134 is formed to be relatively thick (e.g., the thickness is about 20 μm or more or about 30 μm or more), a conductive via (e.g., the first conductive via 142) formed on the uppermost layer of the corresponding insulating pattern 130 may be formed to protrude from the uppermost layer of the corresponding insulating pattern 130.

The fourth conductive via 145 may be formed when the protective layer 120 covers a first surface of the semiconductor chip 110 as illustrated in FIGS. 33 and 34. That is, in this case, the fourth conductive via 145 may be formed at a portion of the protective layer 120 on the first surface of the semiconductor chip 110 to electrically connect between the chip terminal 111 of the semiconductor chip 110 and the remaining redistributed layer 141 or the conductive vias 142, 143, and 144.

Specific shapes, effects, and the like of the redistributed layer 141 and the conductive vias 142, 143, 144, and 145 will be described in more detail according to various exemplary embodiments to be described below.

The external pad 150 is provided on the insulating pattern 130 and may function as a pad on which the external connection terminal 160 is disposed. That is, the external connection terminal 160 may be disposed on the external pad 150. The external pad 150 may be connected to the redistributed pattern 140 through an opening of the uppermost layer of the insulating pattern 130, and may be electrically connected to the chip terminal 111 of the semiconductor chip 110 through the redistributed pattern 140. That is, the external pad 150 is electrically connected to the redistributed pattern 140 and the external connection terminal 160, respectively, such that connection reliability of the external connection terminal 160 may be improved. To this end, the external pad 150 may provide a wetting layer (a cover layer, preliminary metal layer, etc.) having excellent wettability such that the external connection terminal 160 adheres well, penetration of the external connection terminal 160 may be prevented, and various types of configurations are possible.

For example, the external pad 150 may be an under-bump metal (UBM) and may include a metal having excellent conductivity such as Cu, Al, Cr, W, Ni, Ti, Au, Ag, or a combination thereof, but is not limited thereto.

The external pad 150 may have a pillar shape 150a having a flat upper portion disposed on the uppermost layer of the insulating pattern 130, and it may have concave structures 150b, 150c, and 150d in which the central portion of the upper surface is depressed (i.e., concave). However, when the uppermost layer of the insulating pattern 130 is a layer that is formed to be a relatively thick (e.g., a thickness of about 20 μm or more or about 30 μm or more), without a separate external pad 150, the first conductive via 142 that is formed to protrude from the uppermost layer of the corresponding insulating pattern 130 may replace the external pad 150 and perform the function of the external pad 150 to be described above or below.

Figure 22:
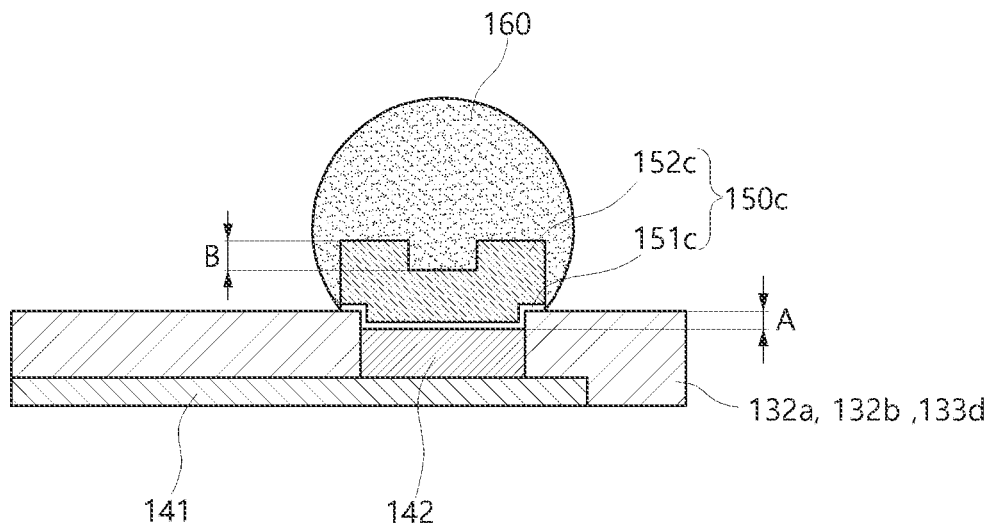
FIG. 22 and FIG. 23 is an enlarged cross-sectional diagram showing a periphery of external pads 150c and 150d having various concave structures.
Figure 23:
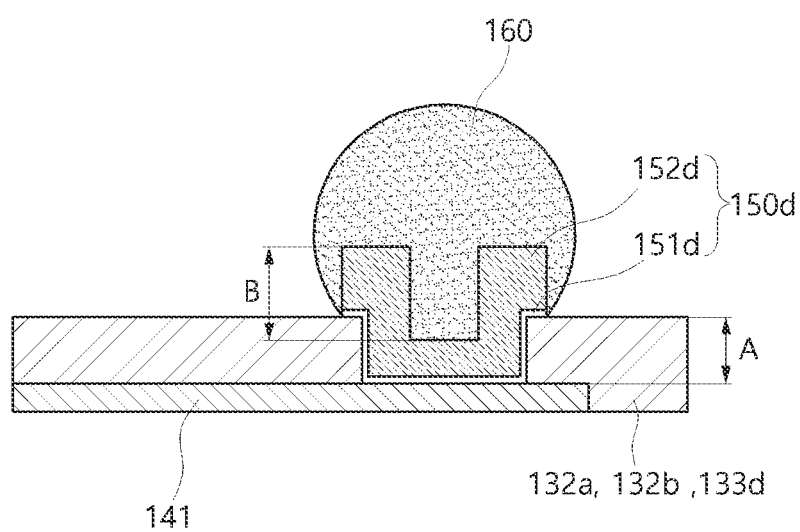

FIG. 22 and FIG. 23 is an enlarged cross-sectional diagram showing a periphery of external pads 150c and 150d having various concave structures.

In addition, as illustrated in FIG. 23, the external pad 150 may have a structure in which a plurality of layers are stacked. For example, the external pad 150 may include a lower metal layer 151 and an upper metal layer 152 on the lower metal layer 151.

The lower metal layer 151 may be formed on the redistributed pattern 140 exposed through an opening of the uppermost layer of the insulating pattern 130, and may extend along the surface of the uppermost layer of the insulating pattern 130. For example, the lower metal layer 151 may be a seed layer or an adhesive layer for forming the upper metal layer 152, and may include Ti, Cu, Cr, W, Ni, Al, Pd, Au, or a combination thereof, but is not limited thereto.

The lower metal layer 151 may be a single metal layer, but is not limited thereto, and it may have a multilayer structure including a plurality of metal layers. For example, the lower metal layer 151 may include a first sub metal layer and a second sub metal layer sequentially stacked on the uppermost layer of the insulating pattern 130 and the redistributed pattern 140. The first sub metal layer may comprise a metal material having excellent adhesion properties to the uppermost layer of the insulating pattern 130. For example, the first sub metal layer may include Ti, but is not limited thereto. The second sub metal layer may function as a seed layer for forming an upper metal layer. For example, the second sub metal layer may include Cu, but is not limited thereto.

The upper metal layer 152 may be provided on the lower metal layer 151. For example, the upper metal layer 152 may be formed by a plating method using the lower metal layer 151 as a seed. The upper metal layer 152 may have a pillar shape erected on the uppermost layer of the insulating pattern 130, and may have a concave structure in which the central portion of the upper surface is depressed. When the upper metal layer 152 has a concave structure, the lower metal layer 151 may have a step structure corresponding thereto. For example, the upper metal layer 152 may include Cu or a Cu alloy, but is not limited thereto.

The external connection terminal 160 is a terminal for transmitting an electric signal from the semiconductor package 100 to an external device, and may be provided on the external pad 150. That is, the external connection terminal 160 may be electrically connected to the external pad 150. Accordingly, the external connection terminal 160 may be electrically connected to the chip terminal 111 of the semiconductor chip 110 through the redistributed pattern 140, and may be configured to electrically connect the semiconductor package 100 and an external device (e.g., a board, etc.). That is, the external connection terminal 160 may be a connection terminal for mounting the semiconductor package 100 on a board and the like such as a printed circuit board which is an external device. However, the external pad 150 may be omitted, and in this case, the external connection terminal 160 may be directly disposed on the redistributed pattern 140 exposed through an opening of the uppermost layer of the insulating pattern 130.

For example, the external connection terminal 160 may include a solder bump, and may include Sn, Au, Ag, Ni, In, Bi, Sb, Cu, Zn, Pb, or a combination thereof, but is not limited thereto. In addition, the solder bump may have a ball shape, but is not limited thereto, and it may have various shapes such as a cylinder, a polygonal column, a polyhedron, and the like.

In addition, the external pad 150 may sequentially include an adhesion layer, a diffusion barrier layer, and a wettable layer, and these may form the structure of the lower metal layer 151 and the upper metal layer 152. That is, the external connection terminal 160 is finally formed on the external pad 150, and when the external connection terminal 160 is formed, it may react with the external pad 150 to form an intermetallic compound (hereinafter, referred to as IMC) at the interface. As a result, a wetting phenomenon may occur between the external pad 150 and the external connection terminal 160, and an actual mechanical connection may be completed.

For example, the adhesive layer/diffusion barrier layer/wetting layer may be at least one of Ti, TiW, Cr, and Ni, or an alloy thereof/at least one of Cu and Ni, or an alloy thereof/at least one of Au, Ag and Sn, or an alloy thereof, but is not limited thereto.

FIGS. 3, 5, 7, 9, 11, 13, 15, 17, 19, and 21 are enlarged cross-sectional diagrams showing each area marked as "I" "II", "III", "IV", "V", "VI", "VII", "VIII", "IX", and "X" in FIGS. 2, 4, 6, 8, 10, 12, 14, 16, 18 and 20, respectively, when the external connection terminal 160 is a surface contact type.

Referring to FIGS. 3, 5, 7, 9, 11, 13, 15, 17, 19, and 21, the external connection terminal 160 may be a form that completely covers a portion (hereinafter, referred to as "protrusion portion", and the height or thickness of the protrusion portion is referred to as the "protrusion height" or "protrusion thickness", and the width of the protrusion portion is referred to as the "protrusion width") which is protruded to the upper surface of the uppermost layer of the insulating pattern 130 among the external pad 150 or the first conductive via 142, that is, a surface contact type. In this case, the external connection terminal 160 may cover the upper surface and side wall of the protrusion portion. In this case, the side wall of the protrusion portion may refer to a side portion of the protrusion portion protruding to the upper surface of the uppermost layer of the insulating pattern 130. For example, during a reflow process for the formation of the external connection terminal 160, the reflow process may be performed in a state in which a metal layer (a cover layer, a preliminary metal layer, etc.) having excellent wettability is formed on the external pad 150 or the first conductive via 142 to enhance the flowability of the external connection terminal 160 to form a surface contact-type external connection terminal 160.

In addition, the surface contact-type external connection terminal 160 may be formed to cover a part of the upper surface of the uppermost layer of the insulating pattern 130 in the vicinity of the protrusion portion, and it may form a surface contact with the upper surface of the uppermost layer of the insulating pattern 130. For example, the external connection terminal 160 may include a bonding surface in contact with the upper surface of the uppermost layer of the insulating pattern 130, and the corresponding bonding surface of the external connection terminal 160 may have a ring shape which continuously extends along the edge of the protrusion portion. The bonding surface of the external connection terminal 160 may be formed to have a width 168 (hereinafter referred to as "a bonding width") of at least 5 μm or more in a second direction parallel to the upper surface of the uppermost layer of the insulating pattern 130. For example, the bonding width 168 may be about 5 μm to about 20 n, but is not limited thereto. In addition, on an arbitrary plane including the bonding surface between the external connection terminal 160 and the upper surface of the uppermost layer of the insulating pattern 130, when the external pad 150 protruded to the upper surface of the uppermost layer of the insulating pattern 130 or the first conductive via 142 has a width 167 of about 180 μm, the external connection terminal 160 may have a width of about 200 μm.

The horizontal width 165 of the external connection terminal 160 may be greater than the height 166 of the external connection terminal 160. In this case, the horizontal width 165 of the external connection terminal 160 may mean the maximum value of the width of the external connection terminal 160 in a second direction parallel to the first surface of the semiconductor chip 110, or with respect to an arbitrary straight line crossing the center 160M of the external connection terminal 160 in the second direction, it may mean a distance between two points where the corresponding arbitrary straight line and the outer surface of the external connection terminal 160 meet. In addition, the height 166 of the external connection terminal 160 may be the height of the external connection terminal 160 in the first direction based on the upper surface of the uppermost layer of the insulating pattern 130. The horizontal width 165 of the external connection terminal 160 may be about 1.2 to 1.4 times the height 166 of the external connection terminal 160. For example, the horizontal width 165 of the external connection terminal 160 may be about 210 μm to about 250 μm, but is not limited thereto. In addition, for example, the height 166 of the external connection terminal 160 may be about 165 μm to about 200 μm, but is not limited thereto.

The protrusion height 162 of the protrusion portion may be about 0.09 times to about 0.5 times the height 166 of the external connection terminal 160. When the protrusion height 162 is greater than 0.5 times the height 166 of the external connection terminal 160, the side wall of the protrusion portion may not be covered by the external connection terminal 160, or the thickness of the external connection terminal 160 on the side wall of the protrusion portion may be formed to be too thin. In addition, when the protrusion height 162 is less than 0.09 times the height 166 of the external connection terminal 160, since the external connection terminal 160 has a size larger than necessary compared to the size of the protrusion portion, the height 166 of the external connection terminal 160 may be excessively increased such that the reliability of bonding between the semiconductor package 100 and the board may be lowered, and a short may occur between neighboring external connection terminals 160.

The protrusion width 167 may be about 0.6 times to about 0.9 times the horizontal width 165 of the external connection terminal 160. When the protrusion width 167 is greater than 0.9 times the horizontal width 165 of the external connection terminal 160, the side wall of the protrusion portion may not be covered by the external connection terminal 160, or the thickness of the external connection terminal 160 on the side wall of the protrusion portion may be formed to be too thin. In addition, when the protrusion width 167 is less than 0.6 times the horizontal width 165 of the external connection terminal 160, since the external connection terminal 160 has a size larger than necessary compared to the size of the protrusion portion, the height 166 of the external connection terminal 160 is excessively increased such that the reliability of bonding between the semiconductor package 100 and the board may be deteriorated, and a short may occur between neighboring external connection terminals 160.

On the side wall of the protrusion portion, the length 164 of the external connection terminal 160 in the second direction may be at least about 5 μm or more. For example, between the uppermost end of the side wall of the protrusion portion and the outer surface of the external connection terminal 160, the length 164 of the external connection terminal 160 in the second direction may be about 5 μm to about 30 μm, or about 5 μm to about 20 μm, but is not limited thereto.

With respect to one cross-section of the external connection terminal 160 that is parallel to the first surface of the semiconductor chip 110 and has the largest width in the second direction, when the center of one cross-section of the external connection terminal 160 is defined as the center 160M of the external connection terminal 160, the center 160M of the external connection terminal 160 may be lower than the center of the external connection terminal of a general package. As such, as the center 160M of the external connection terminal 160 is lowered, the external connection terminal 160 may be formed to be thicker on the side wall of the external pad 150. For example, between the center 160M of the external connection terminal 160 and the upper surface of the uppermost layer of the insulating pattern 130, when the distance in the first direction is defined as the height 161 of the center 160M of the external connection terminal 160, the height 161 of the center 160M of the external connection terminal 160 may be about 0.4 times or less, or about 0.35 times or less, or 0.3 times or less of the height 166 of the external connection terminal 160. When the height 161 of the center 160M of the external connection terminal 160 is greater than 0.4 times the height 166 of the external connection terminal 160, the side wall of the protrusion portion may not be covered by the external connection terminal 160, or the thickness of the external connection terminal 160 on the side wall of the protrusion portion may be formed to be too thin. In addition, the height 161 of the center 160M of the external connection terminal 160 may be about 0.1 times or more, about 0.15 times or more, or about 0.2 times or more of the height 166 of the external connection terminal 160. When the height 161 of the center 160M of the external connection terminal 160 is less than 0.1 times the height 166 of the external connection terminal 160, the height of the external connection terminal 160 may be too low.

The height 161 of the center 160M of the external connection terminal 160 may be adjusted according to the protrusion height 162, the protrusion width 167, and/or the horizontal width 165 of the external connection terminal 160.

The center 160M of the external connection terminal 160 may be spaced apart from the external pad 150 in the first direction, but may be adjacent to the protrusion portion. As the center 160M of the external connection terminal 160 is adjacent to the protrusion portion, the thickness of the external connection terminal 160 covering the side wall of the protrusion portion may become thicker. For example, the shortest distance 163 along the first direction between the center 160M of the external connection terminal 160 and the protrusion portion may be about 0.5 times to about 6 times the protrusion height 162. For example, the shortest distance 163 along the first direction of the center 160M of the external connection terminal 160 may be about 10 μm to 60 μm, but is not limited thereto. That is, the shortest distance 163 along the first direction of the center 160M of the external connection terminal 160 may be equal to the protrusion height 162 or shorter than the protrusion height 162.

In a general semiconductor package, an intermetallic compound formed at the interface between the external pad and the external connection terminal is exposed to the outside, or the external connection terminal covering the intermetallic compound on the side wall of the external pad is formed to have a very thin thickness. Since the intermetallic compound has a property of being brittle to external impacts, cracks frequently occur near the edge of the upper surface of the external pad due to external impacts, and there was a problem in that the reliability of bonding between the semiconductor package and the board was reduced thereby.

However, according to various exemplary embodiments of the present invention, since the external connection terminal 160 may completely cover the protrusion portion, it is possible to prevent damage to the protrusion portion due to the external pad 150 being exposed to the outside. In addition, since external impacts may be alleviated by the external connection terminal 160 formed thickly on the side wall of the protrusion portion, the occurrence of cracks in the vicinity of the protrusion portion may be suppressed, and ultimately, the reliability of bonding between the semiconductor package 100 and an external device such as a board and the like may be improved.

In particular, when the uppermost layer of the insulating layer 130 includes a filler, the surface roughness may be increased depending on the uneven concave structure of the filler. Accordingly, since the adhesion force between the uppermost layer of the insulating layer 130 and the external pad 150 may be further increased, the above-described occurrence of cracks may be further suppressed. In this case, the filler of the uppermost layer of the insulating layer 130 may directly contact the external pad 150.

The semiconductor package 100 according to various exemplary embodiments of the present invention may be a semiconductor package in a fan-in structure or a semiconductor package in a fan-out structure. When the semiconductor package 100 according to various exemplary embodiments of the present invention is a semiconductor package in a fan-out structure, the redistributed pattern 140 may be further extended to the outside of the semiconductor chip 110, and at least one external pad 150 and at least one external connection terminal 160 may be disposed to be spaced apart from the semiconductor chip 110 to the outside.

In the semiconductor package 100 according to various exemplary embodiments of the present invention, an electrical signal generated from the semiconductor chip 110 may sequentially pass through the chip terminal 111, the redistributed pattern 140, the external pad 150, and the external connection terminal 160 (however, when the first conductive via 142 replaces the external pad 150, the external pad 150 is excluded), and it may be transmitted to an external device connected to the external connection terminal 160. In addition, an electrical signal generated from the external device may sequentially pass through the external connection terminal 160, the external pad 150, the redistributed pattern 140, and the chip terminal 111 (however, when the first conductive via 142 replaces the external pad 150, the external pad 150 is excluded), and it may be transmitted to the semiconductor chip 110. During the electric signal transmission process, the insulating pattern 130 may prevent unnecessary electrical short circuits to the chip terminal 11, the redistributed pattern 140, the external pad 150, and the external connection terminal 160 (however, when the first conductive via 142 replaces the external pad 150, the external pad 150 is excluded), and it may prevent physical/chemical damage to these configurations.

In the semiconductor package 100 according to various exemplary embodiments of the present invention, a structure including the semiconductor chip 110 may also be referred to as a "lower structure" In this case, the protective layer 120 may be included in the lower structure. In addition, a structure in which the semiconductor chip 110 including the redistributed pattern 140 is connected to an external device, that is, a structure which is connected to the external connection terminal 160 may be referred to as an "intermediate connection structure". In this case, the insulating pattern 130 and the external pad 150 may be included in the intermediate connection structure. This intermediate connection structure may include an upper surface and a lower surface opposite thereto, and the external connection terminal 160 may be located in the upper surface direction, and the lower structure may be located in the lower surface direction.

In the intermediate connection structure, since the redistributed pattern 140 and the external pad 150 are in an electrically connected structure between the semiconductor chip 110 and the external connection terminal 160, it may be referred to as a "redistributed structure". In the redistributed structure, the redistributed layer 141 may also be referred to as "wire" of "wiring", and the first conductive via 142, the second conductive via 143, the third conductive via 144, and the fourth conductive via 145 may also be each referred to as a "connection pad".

In the intermediate connection structure, since the insulating pattern 130 is in a structure of covering at least a portion of the redistributed structure to implement electrical insulation, it may be referred to as an "insulation structure". That is, each of the first insulating layer 131, the second insulating layer 132, the third insulating layer 133, and the fourth insulating layer 134 may be referred to as an "insulation structure".

Meanwhile, the intermediate connection structure may include a plurality of regions having various metal densities depending on the location. Such a plurality of regions may include a lower region (R1) of the horizontal maximum area region of the external connection terminal 160 (i.e., a lower region of the horizontal width 165 of the external connection terminal 160), and an upper region (R2) of the chip terminal 111, an upper region (R3) of the connection pad, a lower region (R4) of the connection pad, and the like. Each of these R1 to R4 may preferably have a higher metal density than other regions (i.e., surrounding regions) in the intermediate connecting structure located around them. In particular, R1 to R4 may each have a greater metal density for a region corresponding to the size of each region of R1 to R4 among the surrounding regions (hereinafter, referred to as "metal density difference").

However, in the conventional case, since the thickness of the chip pad or the external pad 150 is thicker than the thickness of the redistributed layer 141, the metal density difference which is described above may appear. However, in the case of the present invention, since R1 to R4 are affected by the conductive vias 142, 143, 144, 145, which are post-type connection pads, not the chip pad or the external pad 150, it has a higher metal density compared to the neighboring regions. Since the thickness of the connection pad in the horizontal direction is much thicker than the thickness of the redistributed layer 141 in the vertical direction (greater than the difference in thickness between the chip pad or the external pad 150 and the redistributed layer 141) and extends in the vertical direction, it corresponds to a configuration in which the above-described metal density difference may be further emphasized than the chip pad or the external pad 150. In this case, the connection pad may be formed on at least one layer of the insulating layers 131, 132, 133, and 134, in particular, a relatively thick layer.

That is, R1 to R4 may include a configuration (a configuration including a metal material) through which an electrical signal is transmitted, and in particular, it may be a region including a connection pad. In addition, the surrounding regions of R1 to R4 may also include a configuration through which an electrical signal is transmitted, and may include a chip pad, a redistributed layer 141, or an external pad 150 excluding a connection pad.

That is, the metal density (MD1) of R1 may be higher than the metal density in the intermediate connection structure of the surrounding region in contact with the external connection terminal 160 by an area equal to the corresponding maximum area (i.e., the area formed by the horizontal width 165). In addition, the metal density MD2 of R2 may be higher than the metal density in the intermediate connection structure of the surrounding region in contact with the chip terminal 111 by the size of the chip terminal 111. In addition, the metal density MD3 of R3 may be higher than the metal density in the intermediate connection structure of the surrounding region in contact with the corresponding connection pad by the size of the corresponding connection pad. In addition, the metal density MD4 of R4 may be higher than die metal density in the intermediate connection structure of the surrounding region in contact with the corresponding connection pad by the size of the corresponding connection pad.

For example, each of R1 to R4 may have a difference in metal density of about 1.2 times to about 100 times that of the surrounding region, but is not limited thereto.

Cracks may easily occur in R1 to R4 and the surrounding regions thereof due to external impacts or the like due to their structural location. However, when formed at the metal density between the above-described R1 to R4 and the surrounding region, the occurrence of cracks may be suppressed even when an external impact occurs, and ultimately, the reliability of bonding between the semiconductor package 100 and an external device such as a board and the like may be improved. At the same time, depending on the corresponding metal density, there may be an advantage that signal transmission efficiency may be increased. That is, the present invention may improve the electrical conductivity of a signal transmission portion due to R1 to R4, and since the semiconductor package itself may have rigidity, it is not only strong against warpage of the semiconductor package, but also there is an advantage that it may be easy for CET adjustment.

In particular, the density ratio of one of MD1 to MD4 and the surrounding region may be about 1:0.01 to about 1:0.8, and more preferably, about 1:0.05 to about 1:0.5. That is, when it is out of the corresponding range, effects such as the above-described suppression of the occurrence of cracks, signal transmission efficiency, and the like may be reduced.

In addition, in the case of at least one of the insulating layers 131, 132, 133, and 134, in particular, in the case of an insulating layer that is formed to be relatively thick, it may comprise a non-photosensitive material, or an intermediate connection structure including the corresponding thick insulating layer may comprise 5 wt. % to 30 wt. % of a metal, 1 wt. % to 20 wt. % of a photosensitive material, and the remaining amount of a non-photosensitive material (hereinafter, referred to as a "weight ratio limitation"). In this case, a conductive via may be more easily formed on the corresponding insulating layer, particularly in the thick insulating layer, without a patterning process (increased manufacturing cost) for the photosensitive material layer through exposure and development processes for the photosensitive material layer. For example, after forming a post through plating, by forming an insulating layer and performing grinding, a conductive via may be formed in the corresponding insulating layer. Accordingly, since the corresponding insulating layer may be formed to be thick, it is possible to implement a buffer function to be described below, improve an effective coefficient of thermal expansion of the first structure, and the like, and reduce a manufacturing cost. In addition, in the case of a layer that is formed to be relatively thin (e.g., a thickness of about less than 20 μm) among each of the insulating layers 131, 132, 133, and 134, it may comprise a photosensitive material or a non-photosensitive material.

However, the weight ratio limitation may be satisfied in a structure including the insulating pattern 130 and the redistributed pattern 140, and in particular, it may be satisfied in a structure including at least one of the insulating layers 131, 132, 133, and 134 of the insulating pattern 130 and the redistributed pattern 140.

<Structure of the First Semiconductor Package 100a>

Referring to FIG. 2, the first semiconductor package 100a according to an exemplary embodiment of the present invention may include a semiconductor chip 110, a protective layer 120, an insulating pattern 130, a redistributed pattern 140, an external pad 150, and an external connection terminal 160. However, since the description of the semiconductor chip 110, the protective layer 120, the insulating pattern 130, the redistributed pattern 140, the external pad 150, and the external connection terminal 160 is the same as described above, only characteristics of the first semiconductor package 100a not described above will be described below.

First, the insulating pattern 130 may include a first insulating layer 131a and a second insulating layer 132a stacked on the first insulating layer 131a. In this case, the second insulating layer 132a may have a thickness greater than that of the first insulating layer 131a. Specifically, the thickness of the first insulating layer 131a may be about 10 μm to about 20 μm, and the thickness of the second insulating layer 132 may be about 20 μm to about 60 μm, or about 30 μm to about 60 μm.

In general, in a conventional semiconductor package, compared to the one in which the insulating layer has a thickness of about 5 μm (hereinafter referred to as the "thickness of a conventional insulating layer"), the first insulating layer 131a and the second insulating layer 132a of the semiconductor package 100a according to an exemplary embodiment of the present invention may be formed to be relatively thicker than the above, and in particular, the second insulating layer 132a may be formed to be much thicker than the conventional one. Accordingly, the first insulating layer 131a and the second insulating layer 132a, in particular, the second insulating layer 132a may function as buffers against external impacts, thereby further improving the reliability of the semiconductor package 100a.

In addition, as at least one insulating layer in the insulating pattern 130, that is, the second insulating layer 132a, is formed to be thicker than the conventional insulating layer by about 15 μm to about 55 μm, or by about 25 μm to about 55 μm, the effective coefficient of thermal expansion of the first structure naturally increases, and thus, it may approach the effective coefficient of thermal expansion of an external device such as a board and the like on which the semiconductor package 100a is mounted.

In general, boards such as PCBs and the like have an effective coefficient of thermal expansion of about 15 ppm/° C. to 20 ppm/° C., whereas conventional semiconductor packages have an effective coefficient of thermal expansion of less than about 8 ppm/° C. Accordingly, as illustrated in FIG. 1, a rapid thermal expansion difference ($CTE_1 \neq CTE_2$) occurs between the conventional semiconductor package and the board, and cracks in the external connection terminal of the conventional semiconductor package (hereinafter, referred to as a "thermal expansion crack") could easily occur. On the other hand, as the effective coefficient of thermal expansion of the first structure of the semiconductor package 100a according to an exemplary embodiment of the present invention has a relatively higher value than before due to an increase in the thickness of the second insulating layer 132a by a certain amount or more, it may have a value similar to the value of the effective coefficient of thermal expansion of an external device such as a board and the like. Accordingly, as the first structure of the semiconductor package 100a may be thermally expanded in a range that is more similar to that of the board on which the semiconductor package 100a is mounted, it is possible to reduce thermal expansion cracks that may occur in the external connection terminal 160 of the semiconductor package 100a during a rapid thermal expansion difference.

That is, the thickness of the second insulating layer 132a of about 20 μm to about 60 μm, or about 30 μm to about 60 μm may be an optimal range for similar matching for the buffer function and the effective coefficient of thermal expansion of the first structure with respect to the board. When the second insulating layer 132a is less than 30 μm, particularly less than 20 μm, similar matching of the buffer function and the effective coefficient of thermal expansion may not be possible. When it is more than 60 μm, as the stress applied to the semiconductor package 100a increases, a warpage phenomenon may occur. However, it is not limited to the above description, and the second insulating layer 132a may have various thickness values.

Meanwhile, the second insulating layer 132a, which is an insulating layer that is thicker than other insulating layers, may comprise a non-photosensitive material, or an intermediate connection structure including the second insulating layer 132a may satisfy the weight ratio limitation. In this case, the first conductive via 142 may be formed in the second insulating layer 132a without a patterning process for the photosensitive material layer (increased manufacturing cost) through exposure and development processes for the photosensitive material layer. Accordingly, thicker formation of the second insulating layer 132a (about 20 μm to about 60 μm, or about 30 μm to about 60 μm, etc.) is possible such that it is possible to implement the above-described buffer function and improve the effective coefficient of thermal expansion and the like, and the manufacturing cost thereof may be reduced.

In particular, when the thickness (T3) of the semiconductor chip 110 is reduced, the effective coefficient of thermal expansion of the first structure of the semiconductor package 100a is increased such that the effect of the value approaching the value of the effective coefficient of thermal expansion of an external device such as a board and the like on which the semiconductor package 100a is mounted may be improved. That is, when the thickness (T3) of the semiconductor chip 110 is reduced, the insulating pattern 130 becomes relatively thicker such that the effective coefficient of thermal expansion of the first structure of the semiconductor package 100a may be increased more easily.

To this end, compared to a generally conventional semiconductor chip having a thickness more than 5 times that of an insulating pattern, the thickness (T3) of the semiconductor chip 110 of the semiconductor package 100a according to an exemplary embodiment of the present invention may be reduced compared to the conventional one by having about 1.5 to about 10 times, or about 1.5 to about 4 times compared to the insulating pattern 130. In addition, compared to a generally conventional semiconductor chip having a thickness of 350 μm or more, the semiconductor chip 110 of the semiconductor package 100a according to an exemplary embodiment of the present invention has a thickness (T3) of about 100 μm to about 300 μm, or 100 μm to about 250 μm, or 100 μm to about 200 μm, which is reduced compared to the conventional one. When the thickness (T3) of the semiconductor chip 110 is less than 1.5 times or more than 10 times compared to the insulating pattern 130, a warpage phenomenon may occur. In particular, when the thickness (T3) of the semiconductor chip 110 is 1.5 to 4 times compared to the insulating pattern 130, warpage may be further reduced. In addition, when the semiconductor chip 110 is less than 100 μm, its mechanical strength is too weak and the semiconductor chip 110 may be easily destroyed during the semiconductor package process, making it difficult to handle. When it is more than 250 μm, the effect of increasing the effective coefficient of thermal expansion may be insufficient. However, the thickness of the semiconductor chip 110 is not limited thereto, and may have more various values.

In addition, the redistributed pattern 140 may include a redistributed layer 141 and a first conductive via 142, but the first conductive via 142 may be omitted. In this case, the redistributed layer 141 is a trace extending in the second direction on the first insulating layer 131a and may be electrically connected to the chip terminal 1/1 of the semiconductor chip 110. The redistributed layer 141 may be a single layer or multiple layers, and may have a structure in which multiple layers that are spaced apart are connected. For example, the thickness of the redistributed layer 141 may be about 5 μm to about 20 μm. The redistributed layer 140 may have a tapered shape or a stepped shape (a portion that transmits an electric signal in the first direction), and in this case, the diameter of the region with a small cross-sectional area (length in the second direction) may be about 5 μm, and also the diameter of the region having a large cross-sectional area may be about 15 μm. However, it is not limited to the above description, and the redistributed layer 141 may have various values of thickness according to various shapes.

The first conductive via 142 may be provided on the redistributed layer 141, but may extend from the second insulating layer 132a in the first direction and may be electrically connected to the redistributed layer 141. That is, the first conductive via 142 may extend in the first direction from the second insulating layer 132a formed to be thicker than the first insulating layer 131a to extend to an opening on the upper surface of the second insulating layer 132a, and may electrically connect between the redistributed layer 141 and the external pad 150. For example, the diameter (length in the second direction) of the first conductive via 142 may be about 5 μm to about 20 μm. The first conductive via 142 may have a tapered shape or a stepped shape, and in this case, the diameter of a region with a small cross-sectional area may be about 5 μm, and the diameter of a region with a large cross-sectional area may be about 15 μm. However, the present invention is not limited to the above description, and the first conductive via 142 may have various values of thickness and diameters according to various shapes.

The first conductive via 142 may protrude from the upper surface of the second insulating layer 132a For example, the height of the first conductive via 142 protruding from the upper surface of the second insulating layer 132a may be about 0.1 μm or more, or about 1 μm or more, or 5 μm or more, and it may be about 20 μm or less, or about 15 μm or less, or about 10 μm or less, but is not limited thereto.

When the first conductive via 142 protrudes from the second insulating layer 132a, the external pad 150 may contact the upper surface and side wall of the first conductive via 142. The side wall of the first conductive via 142 may refer to a side portion of the first conductive via 142 that protrudes to the upper surface of the second insulating layer 132a. In this way, when the external pad 150 also contacts the side wall of the first conductive via 142, the contact area between the external pad 150 and the first conductive via 142 may increase, and accordingly, the contact resistance between the external pad 150 and the first conductive via 142 may be decreased.

Meanwhile, the first conductive via 142 may penetrate through the redistributed layer 141 and contact the upper surface of the first insulating layer 131a. In this case, the redistributed layer 141 may have an opening thereon, and a lower portion of the first conductive via 142 may be formed to fill the opening of the redistributed layer 141, but the central portion thereof may have a shape of protruding downward. The height of the lower central portion of the first conductive via 142 protruding downward may correspond to the thickness of the redistributed layer 141.

However, when the first conductive via 142 is omitted, the external pad 150 may be directly connected electrically to the redistributed layer 141.

In FIG. 2, the external pad 150 is illustrated as having a pillar structure 150a having a flat upper portion, but is not limited thereto, and it may have a first step structure in which the lower part protrudes towards the uppermost layer of the insulating pattern 130, as illustrated in FIGS. 22 and 23, concave structures 150b, 150c, and 150d having a concave upper portion thereof, or a second step structure in which the first conductive via 142 corresponds to the height protruding from the second insulating layer 132a, and the like. In this case, the external pad 150 may have a structure in which two or more of a pillar structure, a first step structure, a concave structure, and a second step structure are combined. In addition, the external pad 150 may include a lower metal layer 151 and an upper metal layer 152 on the lower metal layer 151.

Meanwhile, each of the concave structures 150b, 150c, and 150d of the external pad 150 may be divided according to the height at which the lower surface of the external pad 150 is located. That is, the first concave structure 150b is a structure provided when the position of the lower surface of the external pad 150 coincides with the position of the upper surface of the uppermost layer of the insulating pattern 130. In addition, the second concave structure 150c and the third concave structure 150d, as illustrated in FIGS. 22 and 23, may be structures provided when the position of the lower surface of the external pad 150 is lower than the position of the upper surface of the uppermost layer of the insulating pattern 130, that is, when the position of the lower surface of the external pad 150 is located in the uppermost layer of the insulating pattern 130. However, in the case of the second concave structure 150c, it may be provided on the first conductive via 142, whereas in the case of the third concave structure 150d, it may be provided on the redistributed layer 141 while the first conductive via 142 is omitted.

When the external pad 150 has a first step structure, the lower portion of the external pad 150 may have a height (A) (hereinafter, referred to as a "first step height") of protruding towards the uppermost layer of the insulating pattern 130. This first step structure may be applied to the second concave structure 150c and the third concave structure 150d. By the first step height (A), the contact area of the external pad 150 with the uppermost layer of the insulating pattern 130 increases such that the adhesion force with the uppermost layer of the insulating pattern 130 may be increased, and thus, there is an advantage of being stronger to external impacts. In particular, when the first step height (A) is greater than the thickness of the uppermost layer of the insulating pattern 130 in the second concave structure 150c, the third concave structure 150, and the like, the contact area of the external pad 150 with the uppermost layer of the insulating pattern 130 may be further increased.

For example, the first step height (A) may be about 1 μm or more to about 50 μm or less. When the first step height (A) exceeds 50 μm, the margin in the uppermost layer of the insulating pattern 130 (the thickness of the region excluding the first step height in the uppermost layer of the insulating pattern 130) may become insufficient.

In addition, the second concave structure 150c and the third concave structure 150d have a depth (B) (hereinafter, referred to as a "concave depth") whose upper portion is concave in the downward direction. By the concave depth (13), the contact area of the external pad 150 with the external connection terminal 160 increases such that the contact resistance may be further decreased, and there may be an advantage of being strong against external impacts. In particular, when the concave depth (B) is greater than the first step height (A), the contact area of the external pad 150 with the external connection terminal 160 may further be increased.

In the case of the concave structures 150b, 150c, and 150d, the concave depth may be about 0.1 μm to about 20 μm, or about 1 μm to about 10 μm, or about 3 μm to about 7 μm, but is not limited thereto. However, in the case of the second concave structure 150c and the third concave structure 150d, the concave depth (B) may be about 1 μm or more to about 50 μm or less.

In addition, when the external pad 150 has a second step structure, the external pad 150 may have a height (hereinafter, referred to as a "second step height") at which the lower portion of the external pad 150 is recessed in the upward direction. In this case, the second step height may correspond to a height of the first conductive via 142 protruding from the upper surface of the second insulating layer 132a. For example, on the first conductive via 142, the external pad 150 may have a second step structure inclined downward in a direction away from the first conductive via 142, but is not limited thereto. When the external pad 150 has a second step structure, the contact resistance may be further decreased due to an increase in the contact area between the external pad 150 and the external connection terminal 160, and also there may be an advantage of being strong against external impacts.

Meanwhile, the protrusion height 162 of the external pad 150 may be about 20 μm or more to about 50 μm or less, or about 30 μm or more to about 40 μm, but is not limited thereto.

In general, in a conventional semiconductor package, compared with the fact that the height of an external pad protruding from the upper surface of the uppermost layer of an insulating pad is 10 μm (hereinafter, referred to as a "conventional protrusion height"), the protrusion height 162 of the external pad 150 of the semiconductor package 100*a* according to an exemplary embodiment of the present invention may be formed to be relatively higher. Accordingly, the contact resistance of the external pad 150 may be further decreased due to an increase in the contact area with the external connection terminal 160.

In addition, the thickness (T1) of the external pad 150 may be about 50 μm, the thickness (T2) of the insulating pattern 130 may be about 40 μm, and the thickness (T3) of the semiconductor chip 110 may be about 100 μm. That is, the thickness (T1) of the external pad with respect to the thickness (T2) of the insulating pattern 130 may be about 1 to 1.2 times, and the thickness ratio between the lower structure and the intermediate connection structure may be about 1:0.25 to about 1:0.6. The thickness of the structure formed by the insulating pattern 130 and the external pad 150 (or a structure formed by the protrusion portion of the insulating pattern 130 and the external pad 150) (hereinafter referred to as "second structure") corresponds to a thickness for distributing stress (hereinafter, referred to as a "stress distribution thickness") applied to the external connection terminal 160 provided between the board, which is an external device on which the semiconductor package 100*a* is mounted, and the second insulating layer 132*a*. That is, when the sum of T1 and T2 is less than 80 μm or the thickness ratio between the substructure and the intermediate connection structure is less than 1:0.25, the stress distribution effect may be insufficient, and when the sum of T1 and T2 is more than 100 μm or the thickness ratio between the lower structure and the intermediate connection structure is greater than 1:0.6, the stress applied to the semiconductor package 100*a* increases, thereby causing a warpage phenomenon. However, it is not limited to the above description, and T1, T2, T3, and the like may have various thickness values.

In general, in a conventional semiconductor package, compared with the fact that the stress distribution thickness of the second structure is less than 50 μm, the stress distribution thickness (D1) of the second structure of the semiconductor package 100*a* according to an exemplary embodiment of the present invention may be formed to be relatively thicker. Accordingly, stress applied to the external connection terminal 160 provided between the board on which the semiconductor package 100*a* is mounted and the second insulating layer 132*a* may be greatly reduced.

In particular, when the thickness (T3) of the semiconductor chip 110 is formed to be about 1.4 times to about 2.5 times the thickness (T2) of the insulating pattern 130, an effect of increasing an effective coefficient of thermal expansion and an effect of stress distribution may be simultaneously implemented.

<Structure of the Second Semiconductor Package 100*b*>

Figure 4:
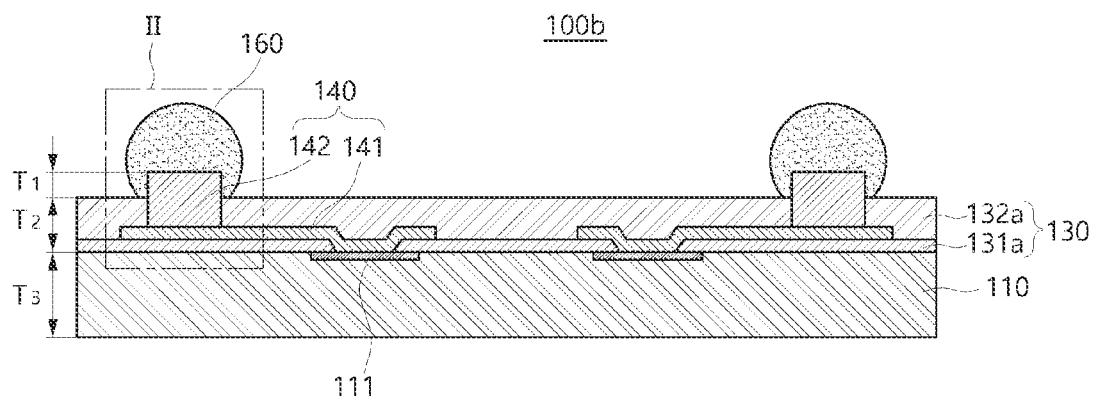
FIG. 4 is a cross-sectional diagram of a second semiconductor package 100b according to an exemplary embodiment of the present invention.
Figure 5:
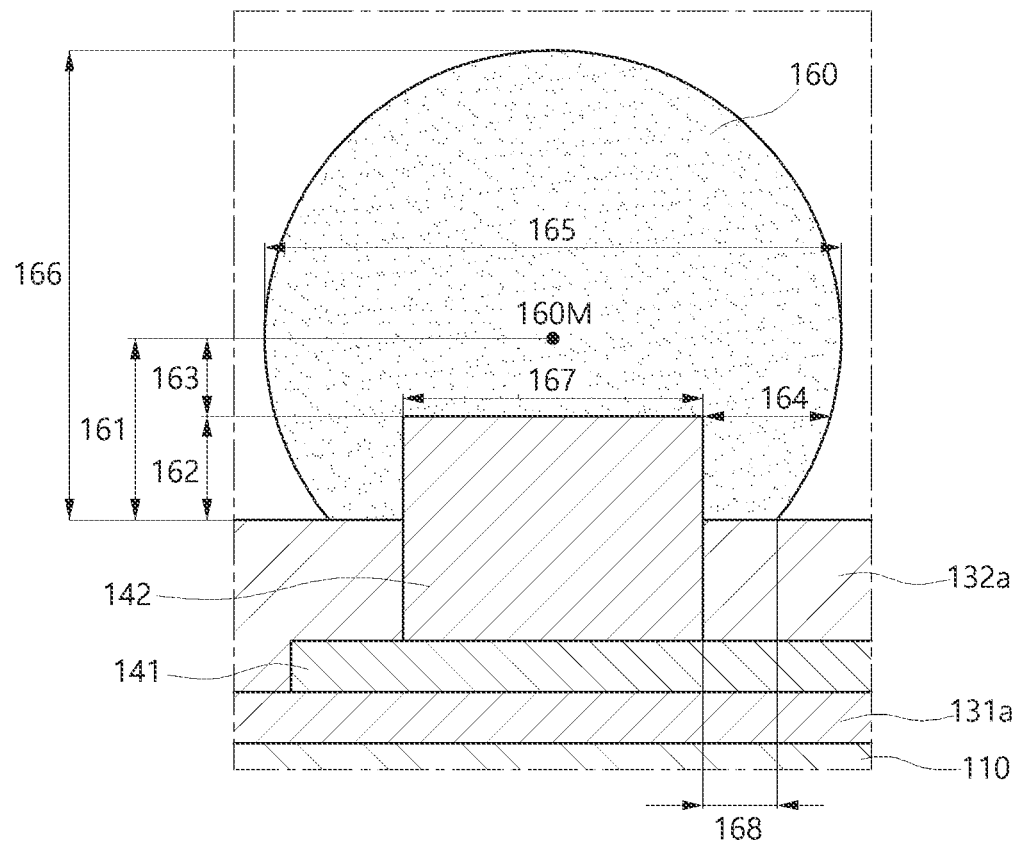
FIG. 5 is an enlarged cross-sectional diagram showing an area marked "II" when the external connection terminal 160 in FIG. 3 is a surface contact type.

Referring to FIG. 4, the second semiconductor package 100*b* according to an exemplary embodiment of the present invention may include a semiconductor chip 110, a protective layer 120, an insulating pattern 130, a redistributed pattern 140, and an external connection terminal 160, and the first conductive via 142 of the redistributed pattern 140 replaces the external pad 150. However, since the description of the semiconductor chip 110, the protective layer 120, the insulating pattern 130, the redistributed pattern 140, and the external connection terminal 160 is the same as described above, the characteristics of the second semiconductor 100*b*, which are not described above, that is, only characteristics that differ in the structure of the first semiconductor package 100*a* will be described below.

First, the first conductive via 142 may be formed to protrude from the second insulating layer 132*a* towards the external connection terminal 160 in the first direction, and may be electrically connected to the redistributed layer 141. That is, the first conductive via 142 is a configuration capable of replacing the external pad 150 and may be formed to protrude above the opening of the upper surface of the second insulating layer 132*a*, and may electrically connect between the redistributed layer 141 and the external connection terminal 160.

In FIG. 4, the first conductive via 142 is illustrated to have a pillar structure having a fat upper portion, but is not limited thereto, and may have a concave structure in which the upper portion is concave.

Meanwhile, the protrusion height 162 of the first conductive via 142 may be about 20 μm or more to about 50 μm or less, or about 30 μm or more to about 40 μm or less, but is not limited thereto.

In the semiconductor package 100*b* according to an exemplary embodiment of the present invention, the protrusion height 162 of the first conductive via 142 replacing the external pad 150 may be formed to be relatively higher than the conventional protrusion height. Accordingly, the contact resistance of the first conductive via 142 may be further decreased due to an increase in the contact area with the external connection terminal 160.

In addition, the thickness (T1) of the protrusion portion of the first conductive via 142 may be about 50 μm, the thickness (T2) of the insulating pattern 130 may be about 40 μm, and the thickness (T3) of the semiconductor chip 110 may be about 100 μm. That is, the thickness (T1) of the external pad with respect to the thickness (T2) of the insulating pattern 130 may be about 1 to 1.2 times, and the thickness ratio between the lower structure and the intermediate connection structure may be about 1:0.25 to about 1:0.6. When the sum of T1 and T2 is less than 80 μm or the thickness ratio between the substructure and the intermediate connection structure is less than 1:0.25, the stress distribution effect may be insufficient. When the sum of T1 and T2 is greater than 100 μm or when the thickness ratio between the substructure and the intermediate connection structure is greater than 1.0.6, the stress applied to the semiconductor package 100*a* may increase, thereby causing a warpage phenomenon. However, it is not limited to the above description, and T1, T2, T3, and the like may have various thickness values.

Meanwhile, the description for the configuration and effect of the insulating pattern 130, the redistributed layer 141, the effective coefficient of thermal expansion of the first structure, the prevention of thermal expansion cracking, the thickness (T3) of the semiconductor chip 110, the stress distribution thickness, the ratio of T3 and T2, and the like may be the same as described above, except for changes in reference numerals in the description of the structure of the first semiconductor package 100*a*.

<Structure of the Third Semiconductor Package 100*c*>

Figure 6:
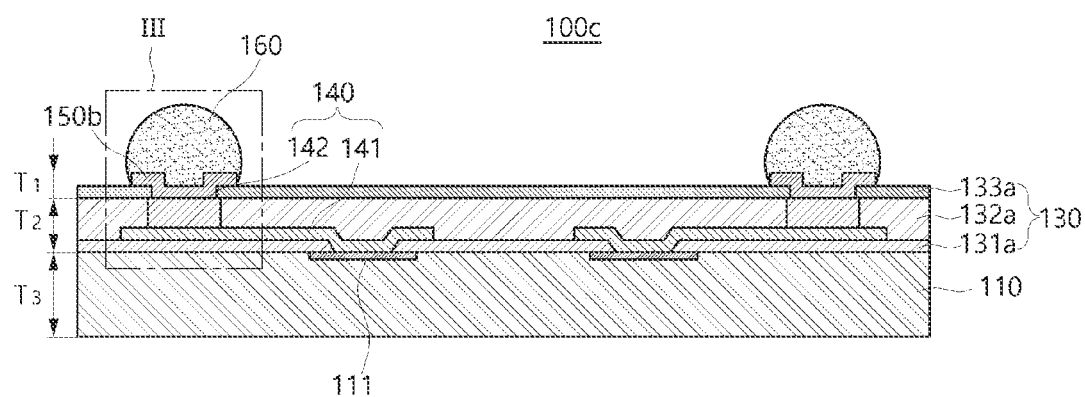
FIG. 6 is a cross-sectional diagram of a third semiconductor package 100c according to an exemplary embodiment of the present invention
Figure 7:
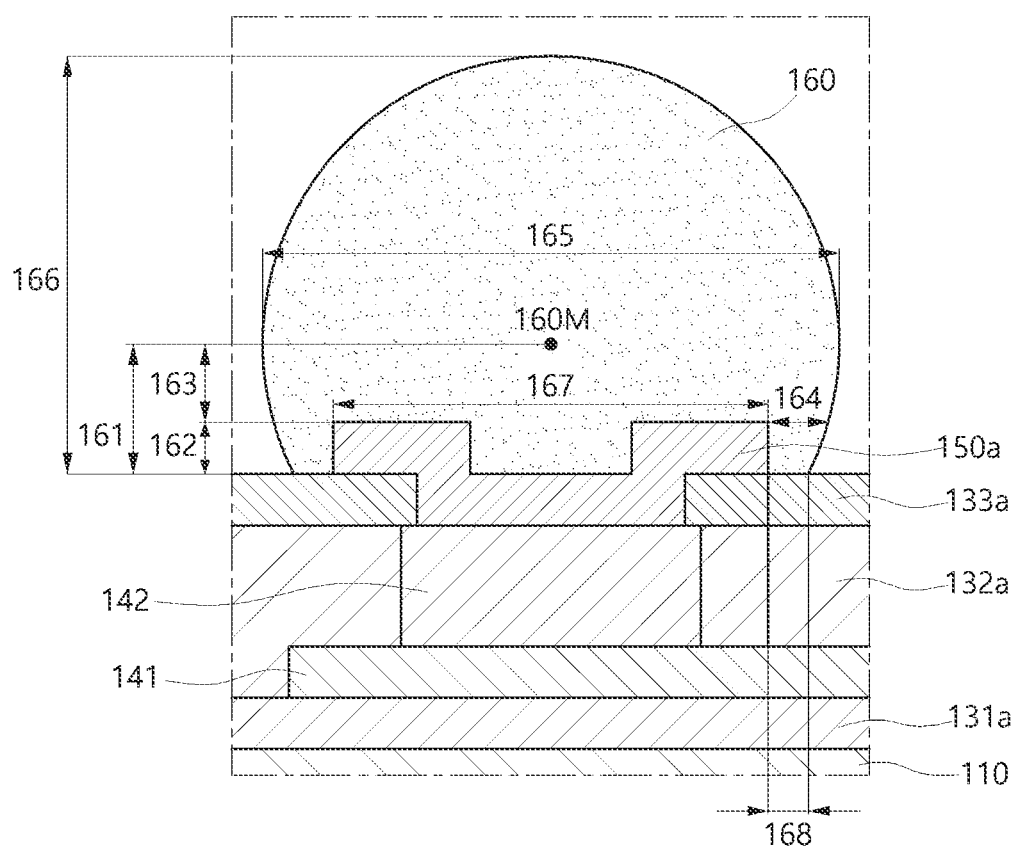
FIG. 7 is an enlarged cross-sectional diagram showing an area marked "III" when the external connection terminal 160 in FIG. 6 is a surface contact type.

Referring to FIG. 6, the third semiconductor package 100*c* according to an exemplary embodiment of the present invention may include a semiconductor chip 110, a protective layer 120, an insulating pattern 130, a redistributed pattern 140, an external pad 150, and an external connection terminal 160. However, since the description of the semiconductor chip 110, the protective layer 120, the insulating pattern 130, the redistributed pattern 140, the external pad 150, and the external connection terminal 160 is the same as described above, the characteristics of the third semiconductor package 100c, which are not described above, that is, characteristics that differ in the structure of the first semiconductor package 100a will be described below.

First, the insulating pattern 130 may include a first insulating layer 131a, a second insulating layer 132a stacked on the first insulating layer 131a, and a third insulating layer 133a stacked on the second insulating layer 132a. In this case, the second insulating layer 132a may have a thicker thickness than the first insulating layer 131a and the third insulating layer 133a. Specifically, the thickness of the third insulating layer 133a may be about 10 µm to about 20 µm, and may be the same as or different from the thickness of the first insulating layer 131a In addition, the thickness, material, weight ratio limitation, and the like of the first insulating layer 131a and the second insulating layer 132a may be the same as described above in the structure of the first semiconductor package 100a.

The effective coefficient of thermal expansion of the first structure of the semiconductor package 100c according to an exemplary embodiment of the present invention may have a value similar to the value of the effective coefficient of thermal expansion of an external device such as a board and the like by having a relatively higher value compared to the conventional one due to an increase in the thickness of the second insulating layer 132a above a certain level and the additional formation of the third insulating layer 133a. Accordingly, since the first structure of the semiconductor package 100c may thermally expand in a range more similar to that of the board on which the semiconductor package 100c is mounted, thermal expansion cracks may be reduced.

In FIG. 6, the external pad 150 is illustrated to have a concave structure 150b, but is not limited thereto. The description of the structure and effect may be the same as described above in the structure of the first semiconductor package 100a. However, the external pad 150 may be formed above the opening of the third insulating layer 133a, and may be formed to the inside of the opening of the third insulating layer 133a, but it may be formed to protrude to the upper side of the opening of the third insulating layer 133, and may contact the upper surface of the third insulating layer 133a.

Meanwhile, the description for the configuration and effect of the protrusion height (T1) of the external pad 150, the thickness (T2) of the insulating pattern 130, the thickness (T'3) of the semiconductor chip 110, the stress distribution thickness, the ratio of T2 and T3, and the like may be the same as described above, except for changes in reference numerals in the structure of the first semiconductor package 100a and the like.

<Structure of the Fourth Semiconductor Package 100d>

Figure 8:
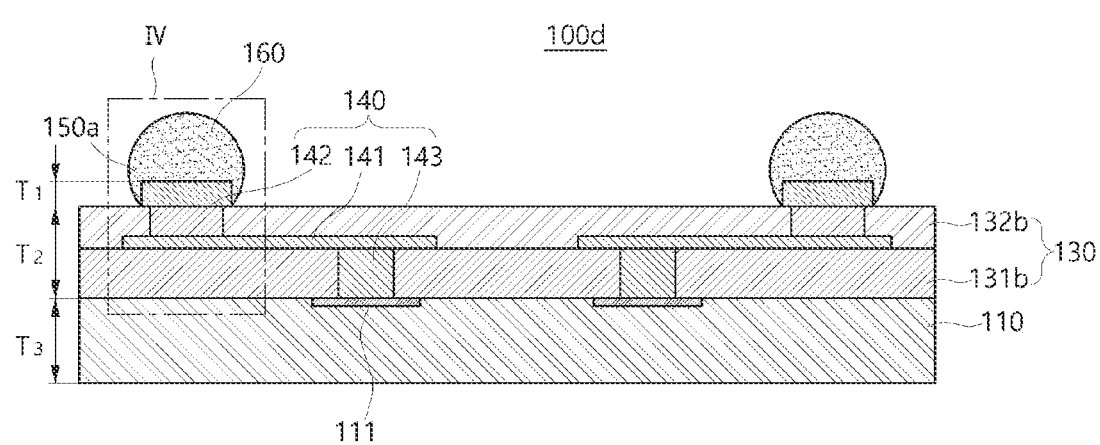
FIG. 8 is a cross-sectional diagram of a fourth semiconductor package 100d according to an exemplary embodiment of the present invention.
Figure 9:
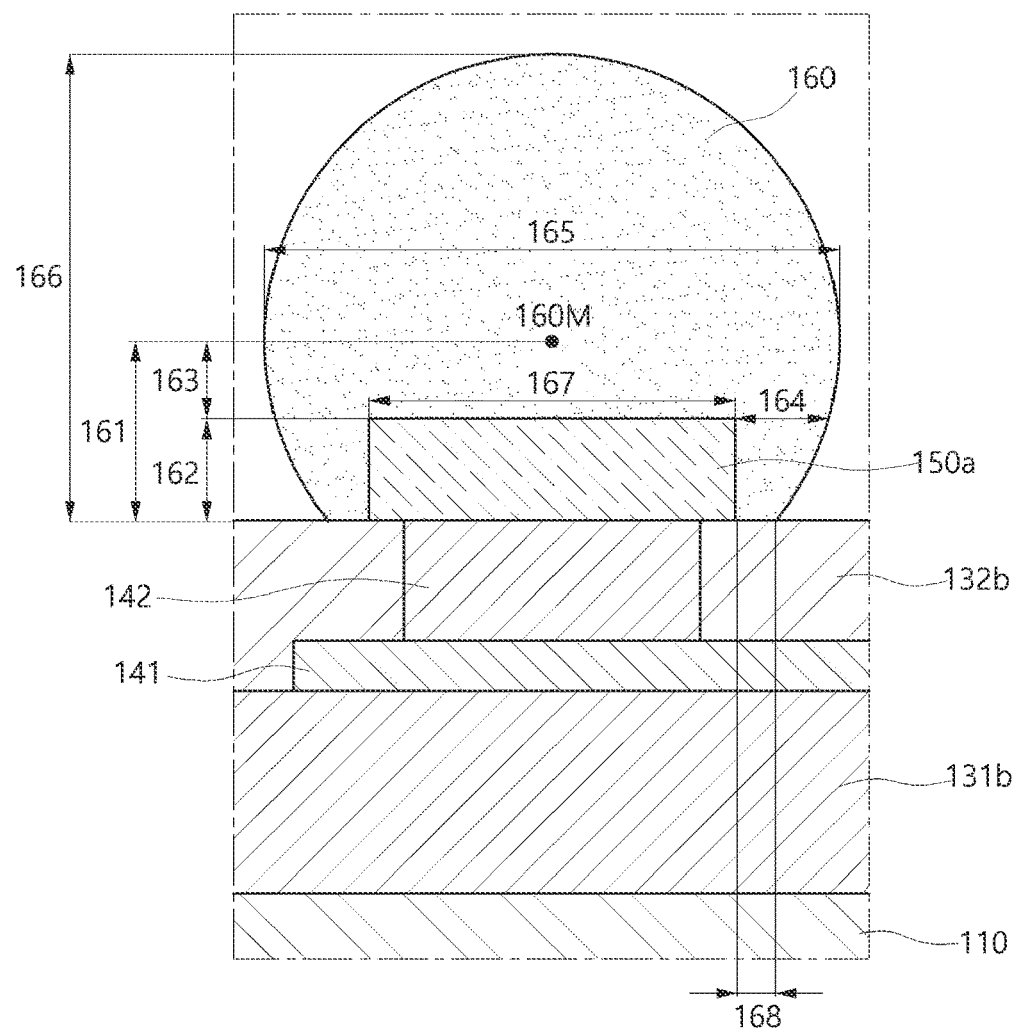
FIG. 9 is an enlarged cross-sectional diagram showing an area marked "IV" when the external connection terminal 160 in FIG. 8 is a surface contact type.

Referring to FIG. 8, the fourth semiconductor package 100d according to an exemplary embodiment of the present invention may include a semiconductor chip 110, a protective layer 120, an insulating pattern 130, a redistributed pattern 140, an external pad 150, and an external connection terminal 160. However, since the description of the semiconductor chip 110, the protective layer 120, the insulating pattern 130, the redistributed pattern 140, the external pad 150, and the external connection terminal 160 is the same as described above, only the characteristics of the fourth semiconductor package 100d, which are not described above, that is, characteristics that differ in the structure of the first semiconductor package 100a will be described below.

First, the insulating pattern 130 may include a first insulating layer 131b and a second insulating layer 132b stacked on the first insulating layer 131b. In this case, the first insulating layer 131b and the second insulating layer 132b have the same or different thicknesses above a certain level. Specifically, the first insulating layer 131b and the second insulating layer 132b may be about 20 µm to about 60 µm, or about 30 µm to about 60 µm. In particular, at least one of the first insulating layer 131b and the second insulating layer 132b may be about 30 µm or more, and a total thickness thereof may be about 50 µm to about 110 µm.

That is, the range of about 20 µm to about 60 µm, or about 30 µm to about 60 µm, which is the thickness of the first insulating layer 131b and the second insulating layer 132b, may be an optimal range for similarity matching of the effective coefficient of thermal expansion of the first structure with respect to the board.

Meanwhile, at least one of the first insulating layer 131b and the second insulating layer 132b comprises a non-photosensitive material, or an intermediate connection structure including the first insulating layer 131b and the second insulating layer 132b may satisfy the weight ratio limitation.

In addition, the redistributed pattern 140 may include a redistributed layer 141, a first conductive via 142, and a second conductive via 143, but the first conductive via 142 may be omitted.

The description of the configuration and effect of the first conductive via 142 may be the same as described above, except for changes in the reference numerals in the description of the structure of the first semiconductor package 100a.

The second conductive via 143 may be provided on the chip terminal 111 of the semiconductor chip 110 and extend in the first direction from the first insulating layer 131b, and may be electrically connected to the chip terminal 11l of the semiconductor chip 110. That is, the second conductive via 143 may extend in the first direction from the first insulating layer 131b formed to be thicker than the conventional one to extend to the opening of the upper surface of the first insulating layer 131b, and may electrically connect between the chip terminal 111 of the semiconductor chip 110 and the redistributed layer 141. In this case, the second conductive via 143 may protrude from the upper surface of the first insulating layer 131b. For example, the height of the second conductive via 143 protruding from the upper surface of the first insulating layer 131b may be about 0.1 µm or more, or about 1 µm or more, or 5 µm, or it may be about 20 µm or less, about 15 µm or less, or about 10 µm or less, but is not limited thereto. The second conductive via 143 may have a tapered shape, a stepped shape, or the like, and in this case, a diameter of a region having a small cross-sectional area may be about 5 µm, and a diameter of a region having a large cross-sectional area may be about 15 µm. However, it is not limited to the above description, and the second conductive via 143 may have various thickness and diameter values according to various shapes.

The second conductive via 143 may protrude from the first insulating layer 131b. In this case, the redistributed layer 141 may contact the upper surface and side wall of the second conductive via 143. The side wall of the second conductive via 143 may refer to a side portion of the second conductive via 143 that protrudes to the upper surface of the first insulating layer 131b In this way, when the redistributed layer 141 also contacts the side wall of the second conductive via 143, a contact area between the redistributed layer 141 and the second conductive via 143 may be increased, and accordingly, the contact resistance between the redistributed layer 141 and the second conductive via 143 may be decreased. For example, the height of the second conductive via 143 protruding from the upper surface of the first insulating layer 131b may be about 0.1 µm or more, or about 1 µm or more, or 5 µm, and it may be about 20 µm or less, about 15 µm or less, or about 10 µm or less, but is not limited thereto.

However, when the first conductive via 142 is omitted, the external pad 150 may be directly connected electrically to the redistributed layer 141.

In FIG. 8, the external pad 150 is illustrated as having a structure 150a having a flat upper portion, but the present invention is not limited thereto.

<Structure of the Fifth Semiconductor Package 100e>

Figure 10:
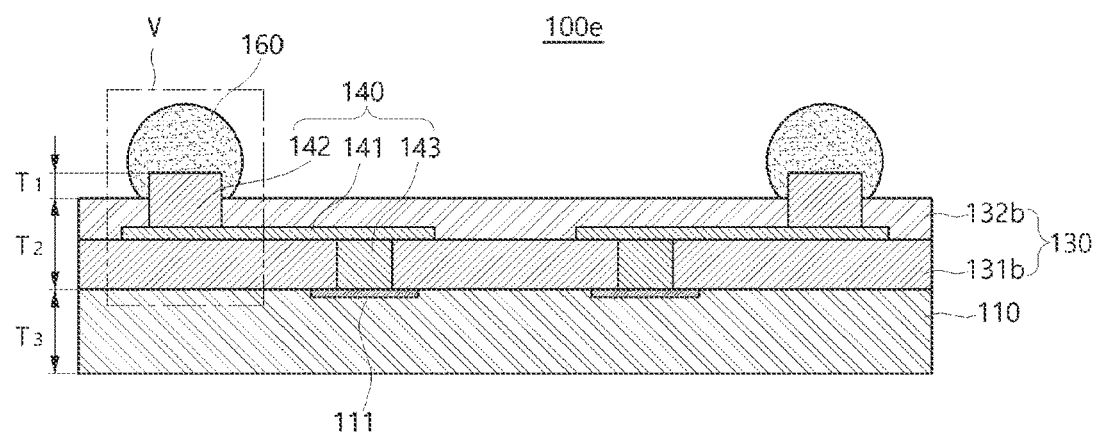
FIG. 10 is a cross-sectional diagram of a fifth semiconductor package 100e according to an exemplary embodiment of the present invention.
Figure 11:
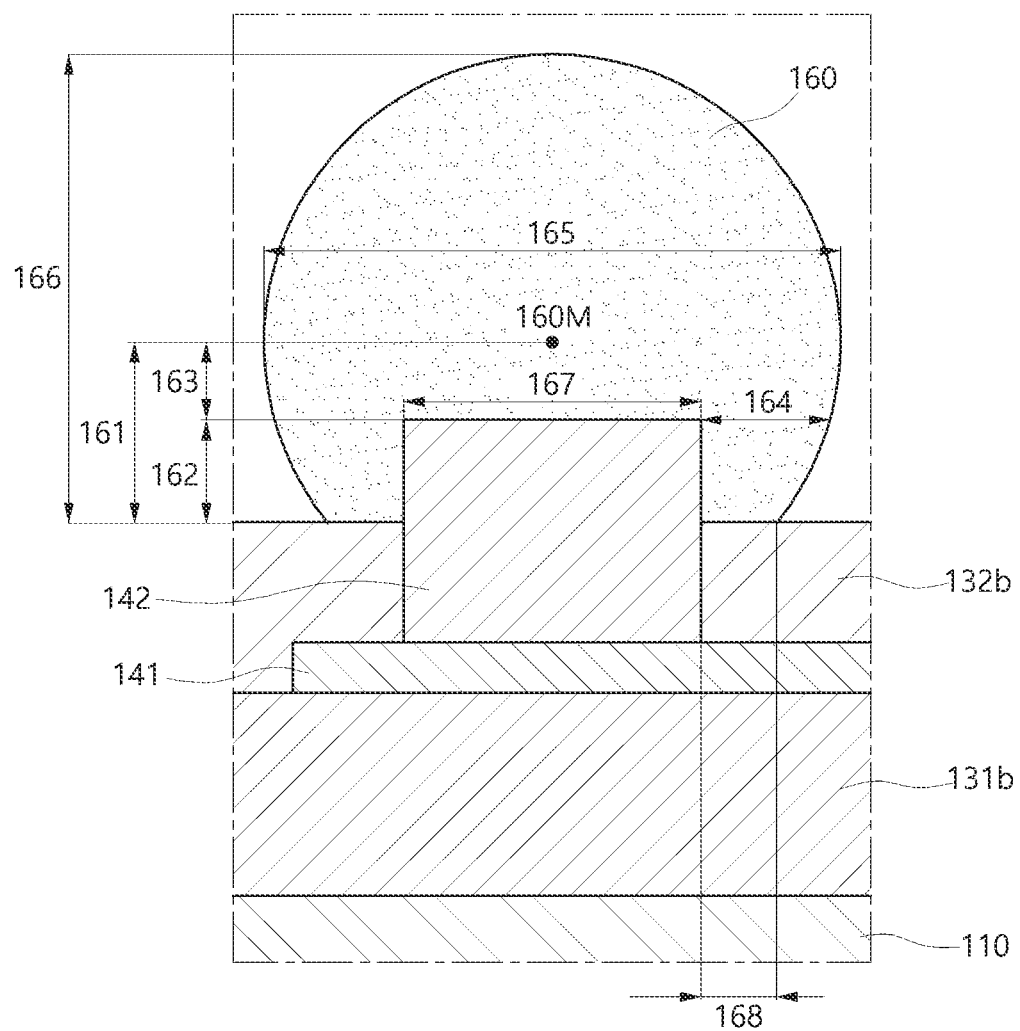
FIG. 11 is an enlarged cross-sectional diagram showing an area marked "V" when the external connection terminal 160 in FIG. 10 is a surface contact type.

Referring to FIG. 10, the fifth semiconductor package 100e according to an exemplary embodiment of the present invention may include a semiconductor chip 110, a protective layer 120, an insulating pattern 130, a redistributed pattern 140, and an external connection terminal (160), and the first conductive via 142 of the redistributed pattern 140 replaces the external pad 150. However, since the description of the semiconductor chip 110, the protective layer 120, the insulating pattern 130, the redistributed pattern 140, and the external connection terminal 160 is the same as described above, the characteristics of the fifth semiconductor, which are not described below, that is, only characteristics that differ in the structure of the fourth semiconductor package 100d will be described below.

First, the first conductive via 142 may be formed to protrude from the second insulating layer 132b in the first direction, and may be electrically connected to the redistributed layer 141. That is, the first conductive via 142 may be formed to protrude above the opening on the upper surface of the second insulating layer 132b, and may electrically connect between the redistributed layer 141 and the external connection terminal 160.

Meanwhile, the protrusion height 162 of the first conductive via 142 may be about 20 µm or more to about 50 µm or less, or about 30 µm or more to about 40 µm or less, but is not limited thereto.

In the semiconductor package 100e, the stress distribution thickness ($D_1$) of the second structure may be about 60 µm or more or about 70 µm or more, and may be about 100 µm or less or about 110 µm or less. When $D_1$ is less than 60 µm, the stress distribution effect may be insufficient, and when $D_1$ is greater than 110 µm, a warpage phenomenon may occur as stress applied to the semiconductor package 100e increases. However, it is not limited to the above, and $D_1$ may have various thickness values.

<Structure of the Sixth Semiconductor Package 100f>

Figure 12:
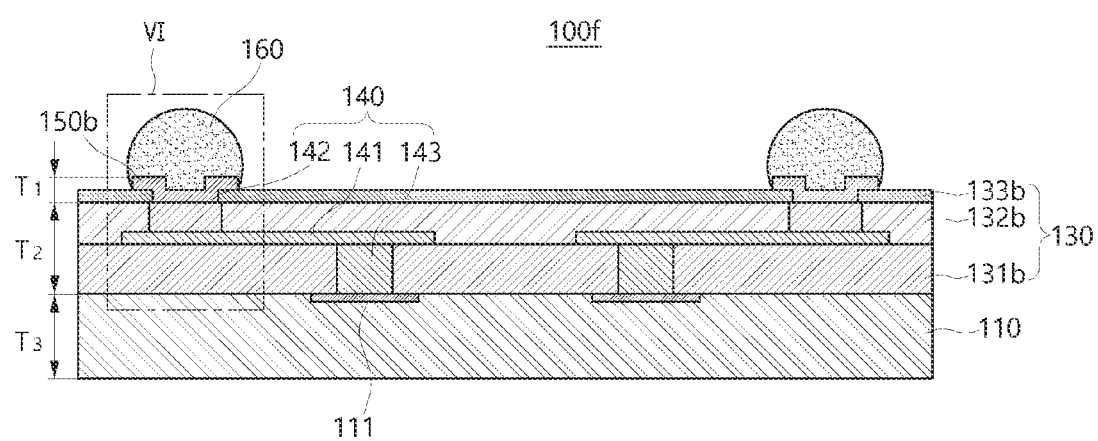
FIG. 12 is a cross-sectional diagram of a sixth semiconductor package 100f according to an exemplary embodiment of the present invention.
Figure 13:
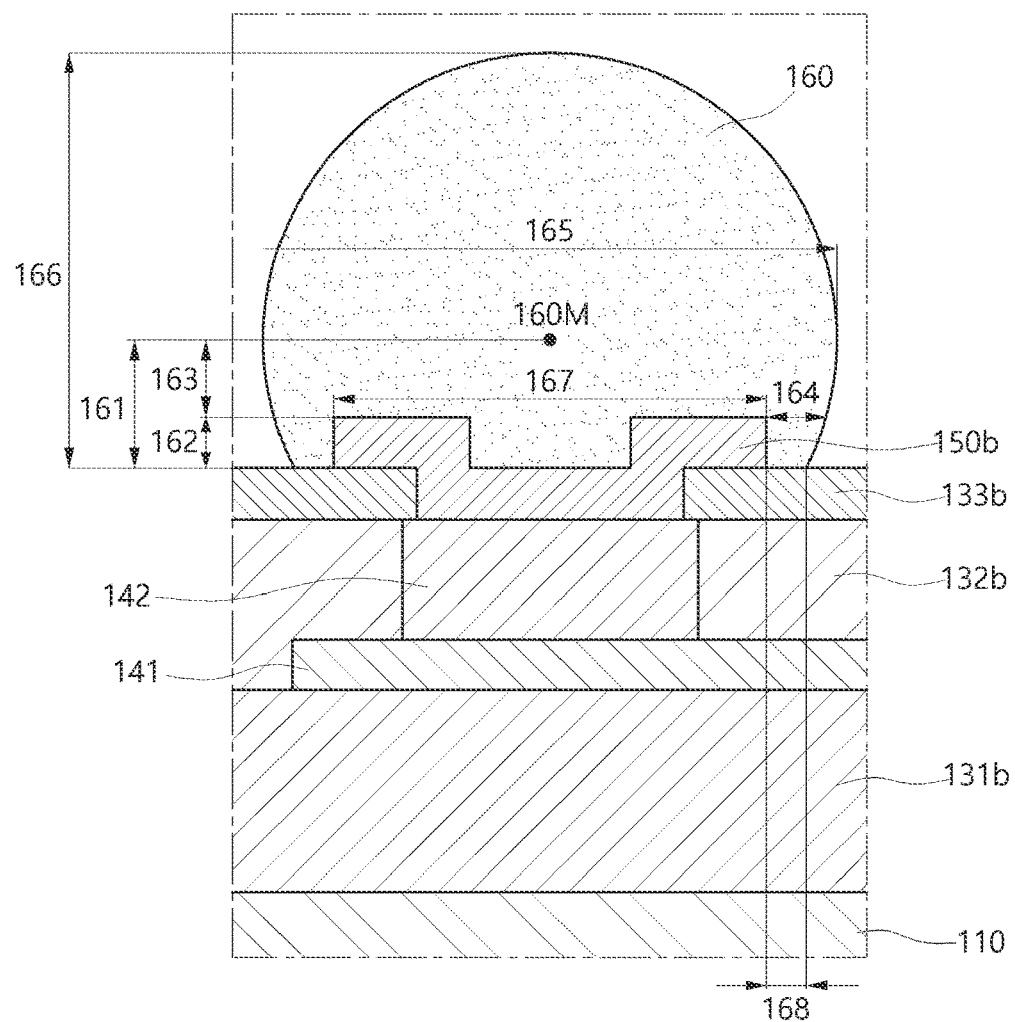
FIG. 13 is an enlarged cross-sectional diagram showing an area marked "V" when the external connection terminal 160 in FIG. 12 is a surface contact type.

Referring to FIG. 12, the sixth semiconductor package 100f according to an exemplary embodiment of the present invention may include a semiconductor chip 110, a protective layer 120, an insulating pattern 130, a redistributed pattern 140, an external pad 150, and an external connection terminal 160. However, since the description of the semiconductor chip 110, the protective layer 120, the insulating pattern 130, the redistributed pattern 140, the external pad 150, and the external connection terminal 160 is the same as described above, only the characteristics of the sixth semiconductor package 100f, which are not described above, that is, characteristics that differ in the structure of the fourth semiconductor package 100d will be described below.

First, the insulating pattern 130 may include a first insulating layer 131b, a second insulating layer 132b stacked on the first insulating layer 131b, and a third insulating layer 133b stacked on the second insulating layer 132b.

The first insulating layer 131b, the second insulating layer 132b, and the third insulating layer 133b of the semiconductor package 100f according to an exemplary embodiment of the present invention may be formed to be relatively thicker than the thickness of the conventional insulating layer thickness.

In addition, in the insulating pattern 130, as the first insulating layer 131b and the second insulating layer 132b are formed to be about 15 µm to about 55 µm, or about 25 µm to about 55 µm thicker than that of the conventional insulating layer and the third insulating layer 133b is additionally formed in addition to the first insulating layer 131b and the second insulating layer 132b, the effective coefficient of thermal expansion of the first structure in the semiconductor package 100f is naturally increased, and it may approach the effective coefficient of thermal expansion of an external device such as a board and the like on which the semiconductor package 100f is mounted.

That is, the range of about 20 µm to about 60 µm, or about 30 µm to about 60 µm, which is the thickness of the first insulating layer 131b and the second insulating layer 132b, may be an optimal range for similarity matching of a buffer function and the effective coefficient of thermal expansion of the first structure with respect to the board.

In addition, the first conductive via 142 may be formed under the opening of the third insulating layer 133b, protrude to the upper side of the opening of the third insulating layer 133b, or may not protrude above the opening of the third insulating layer 133b and may be formed to the inside of the opening of the third insulating layer 133b.

In FIG. 12, the external pad 150 is illustrated to have a concave structure 150b, but is not limited thereto, and the upper portion thereof may have a pillar structure 150a having a flat upper portion, a first step structure in which the lower portion thereof protrudes towards the third insulating layer 133b, and a second step structure corresponding to the height 162 of the first conductive via 142 protruding from the third insulating layer 133b.

<Structure of the Seventh Semiconductor Package (100g)>

Figure 14:
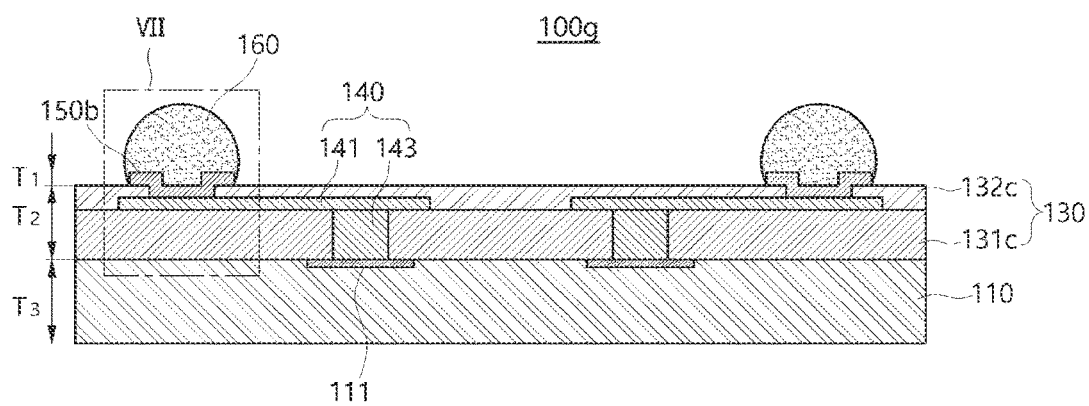
FIG. 14 is a cross-sectional diagram of a seventh semiconductor package 100g according to an exemplary embodiment of the present invention
Figure 15:
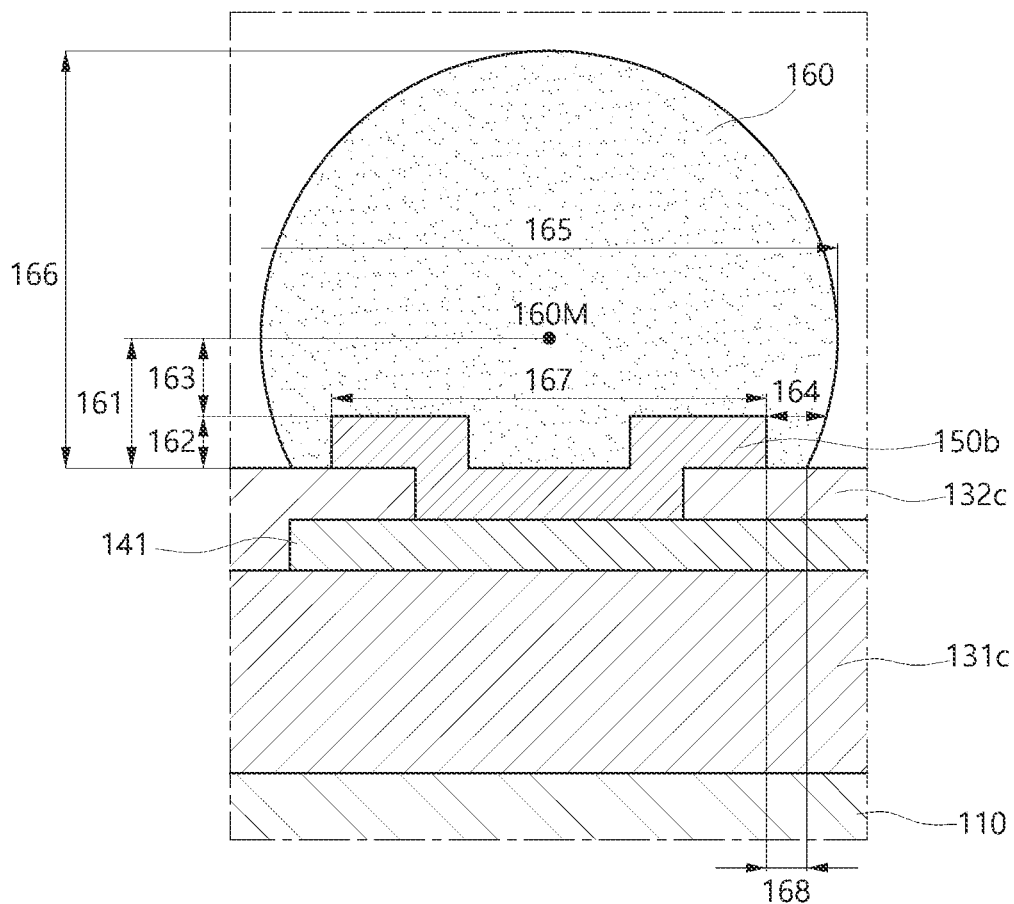
FIG. 15 is an enlarged cross-sectional diagram showing an area marked "VII" when the external connection terminal 160 in FIG. 14 is a surface contact type.

Referring to FIG. 14, the seventh semiconductor package 100g according to an exemplary embodiment of the present invention may include a semiconductor chip 110, a protective layer 120, an insulating pattern 130, a redistributed pattern 140, an external pad 150, and an external connection terminal 160. However, since the description of the semiconductor chip 110, the protective layer 120, the insulating pattern 130, the redistributed pattern 140, the external pad 150, and the external connection terminal 160 is the same as described above, the characteristics of the seventh semiconductor package 100g, which are not described above, that is, characteristics that differ in the structure of the first semiconductor package 100a will be described below.

First, the insulating pattern 130 may include a first insulating layer 131c and a second insulating layer 132c stacked on the first insulating layer 131c. In this case, the first insulating layer 131c may have a thicker thickness than the second insulating layer 132c. Specifically, the first insulating layer 131c may be about 20 µm to about 60 µm, or about 30 µm to about 60 µm, and the thickness of the second insulating layer 132c may be about 10 µm to about 20 µm.

Meanwhile, the first insulating layer 131c may comprise a non-photosensitive material, or the intermediate connection structure including the first insulating layer 131c may satisfy the weight ratio limitation.

In FIG. 14, the external pad 150 is illustrated to have a concave structure 150b, but is not limited thereto.

Meanwhile, the description of the configuration and effect of the protrusion height (T1) of the external pad 150, the thickness (T2) of the insulating pattern 130, the thickness (T3) of the semiconductor chip 110, the stress distribution thickness, the ratio of T2 and T3, and the like may be the same as described above, except for changes in the reference numerals in the structure of the first semiconductor package 100a and the like.

<Structure of the Eighth Semiconductor Package 100h>

Figure 16:
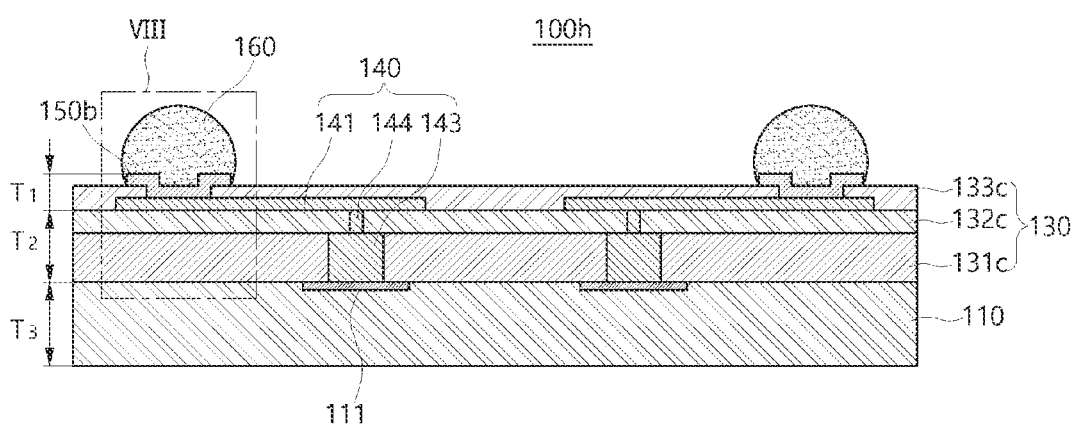
FIG. 16 is a cross-sectional diagram of an eighth semiconductor package 100h according to an exemplary embodiment of the present invention.
Figure 17:
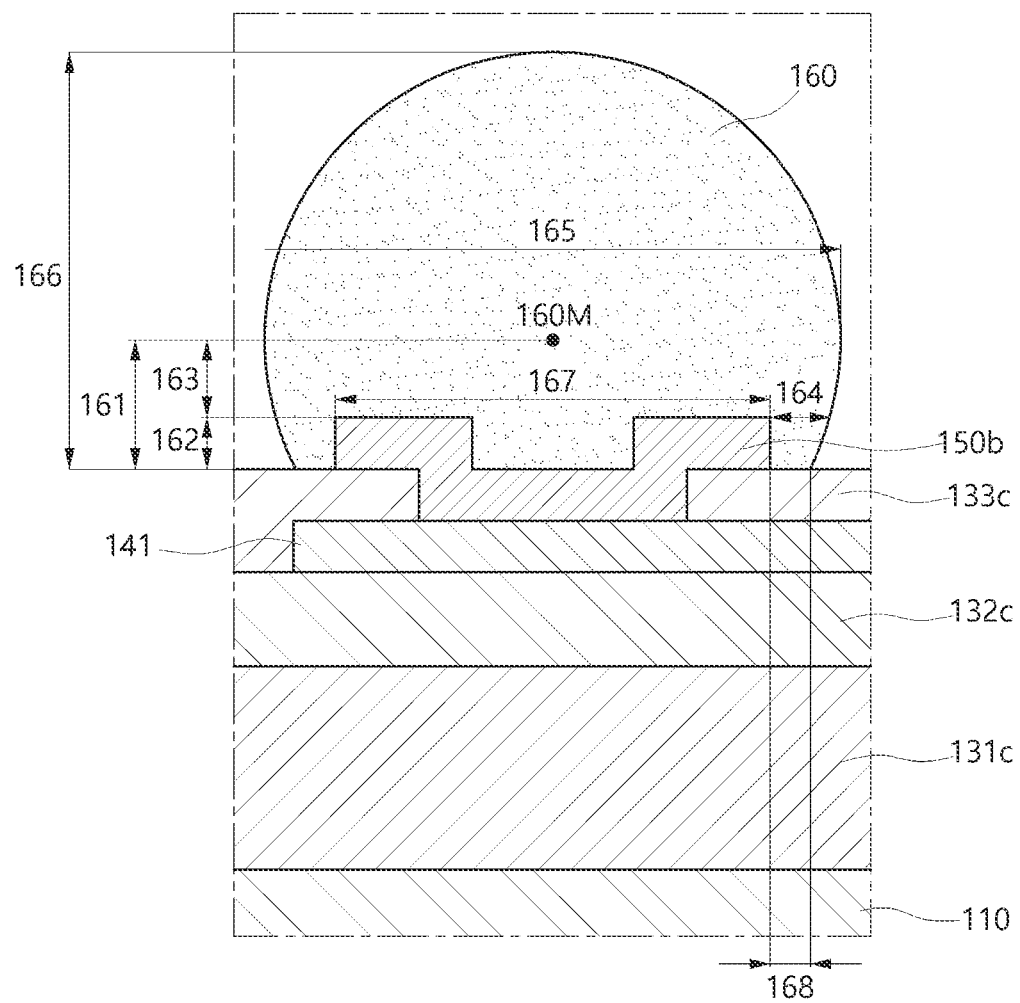
FIG. 17 is an enlarged cross-sectional diagram showing an area marked "VIII" when the external connection terminal 160 in FIG. 16 is a surface contact type.

Referring to FIG. 16, the eighth semiconductor package 100h according to an exemplary embodiment of the present invention may include a semiconductor chip 110, a protective layer 120, an insulating pattern 130, a redistributed pattern 140, an external pad 150, and an external connection terminal 160. However, since the description of the semiconductor chip 110, the protective layer 120, the insulating pattern 130, the redistributed pattern 140, the external pad 150, and the external connection terminal 160 is the same as described above, the characteristics of the eighth semiconductor package 100h, which are not described above, that is, only characteristics that differ in the structure of the seventh semiconductor package 100g will be described below.

In addition, the redistributed pattern 140 may include a redistributed layer 141, a second conductive via 143, and a third conductive via 144. In this case, the redistributed layer 141 is a trace extending in the second direction on the second insulating layer 132c and may be electrically connected to the second conductive via 143 and the third conductive via 144.

The third conductive via 144 may be provided on the first insulating layer 131c, may extend in the first direction from the second insulating layer 132c, and may be electrically connected to the redistributed layer 141 and the second conductive via 143. The third conductive via 144 may have a tapered shape or a stepped shape, and in this case, the diameter (length in the second direction) of a region with a small cross-sectional area may be about 5 µm, and the diameter of a region with a large cross-sectional area may be about 15 µm. However, the present invention is not limited to the above, and the third conductive via 144 may have various thickness values according to various shapes.

The third conductive via 144 may protrude from the second insulating layer 132c. In this case, the redistributed layer 141 may contact the upper surface and side wall of the third conductive via 144. The side wall of the third conductive via 144 may refer to a side portion of the third conductive via 144 that protrudes to the upper surface of the second insulating layer 132c. In this way, when the redistributed layer 141 also contacts the side wall of the third conductive via 144, the contact area between the redistributed layer 141 and the third conductive via 144 may be increased, and accordingly, the contact resistance between the redistributed layer 141 and the third conductive via 144 may be decreased. For example, the height of the third conductive via 144 protruding from the upper surface of the second insulating layer 132c may be about 0.1 µm or more, or about 1 µm or more, or 5 µm, and it may be about 20 µm or less, or about 15 µm or less, or about 10 µm or less, but is not limited thereto.

In FIG. 16, the external pad 150 is illustrated to have a concave structure 150b, but is not limited thereto.

<Structure of the Ninth Semiconductor Package 100i>

Figure 18:
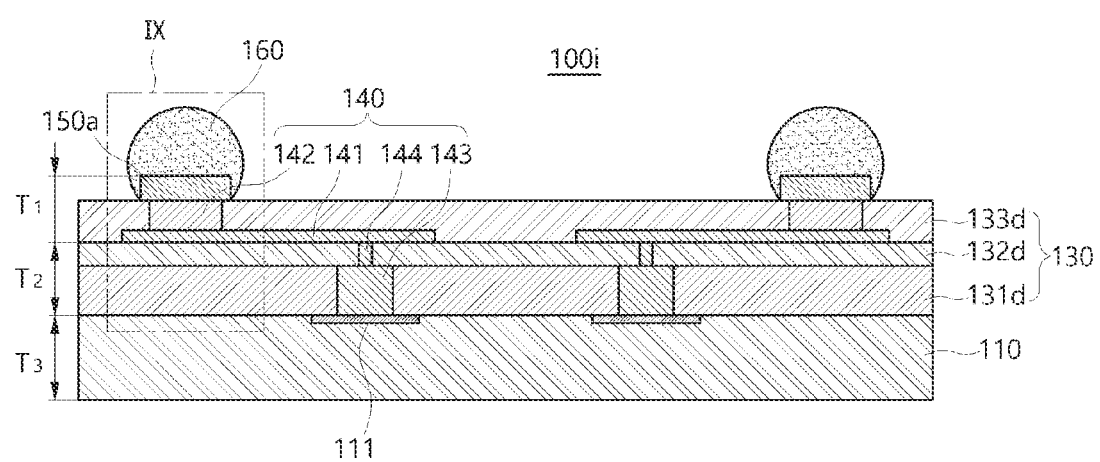
FIG. 18 is a cross-sectional diagram of a ninth semiconductor package 100i according to an exemplary embodiment of the present invention.
Figure 19:
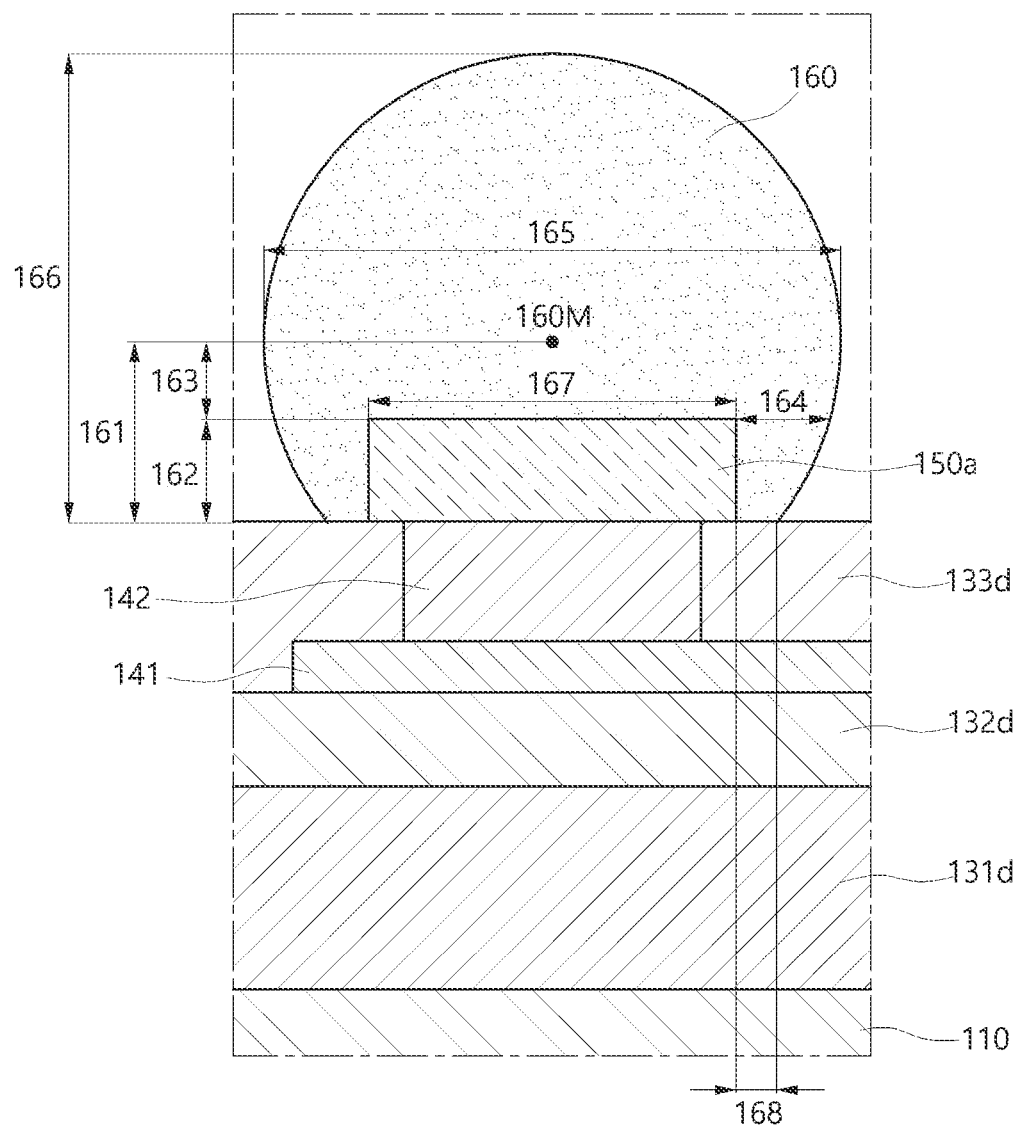
FIG. 19 is an enlarged cross-sectional diagram showing an area marked "IX" when the external connection terminal 160 in FIG. 18 is a surface contact type.

Referring to FIG. 18, the ninth semiconductor package 100i according to an exemplary embodiment of the present invention may include a semiconductor chip 110, a protective layer 120, an insulating pattern 130, a redistributed pattern 140, an external pad 150, and an external connection terminal 160. However, since the description of the semiconductor chip 110, the protective layer 120, the insulating pattern 130, the redistributed pattern 140, the external pad 150, and the external connection terminal 160 is the same as described above, the characteristics of the ninth semiconductor package 100i, which are not described above, that is, only characteristics that differ in the structure of the first semiconductor package 100a will be described below.

First, the insulating pattern 130 may include a first insulating layer 131d, a second insulating layer 132d stacked on the first insulating layer 131d, and a third insulating layer 133d stacked on the second insulating layer 132d.

Meanwhile, at least one of the first insulating layer 131d and the third insulating layer 133d may comprise a non-photosensitive material, or an intermediate connection structure including the first insulating layer 131d and the third insulating layer 133d may satisfy the weight ratio limitation.

In addition, the redistributed pattern 140 may include a redistributed layer 141, a first conductive via 142, a second conductive via 143, and a third conductive via 144, but the first conductive via 142 may be omitted. In this case, the description for the configuration and effect of the redistributed layer 141, the second conductive via 143, and the third conductive via 144 is the same as described above, except for changes in the reference numerals in the structure of the fourth semiconductor package 100d and the structure of the eighth semiconductor package 100h.

The first conductive via 142 may be provided on the redistributed layer 141, but may extend in the first direction from the third insulating layer 133d, and may be electrically connected to the redistributed layer 141.

The first conductive via 142 may protrude from the upper surface of the third insulating layer 133d. For example, the height of the first conductive via 142 protruding from the upper surface of the third insulating layer 133d may be about 0.1 µm or more, or about 1 µm or more, or 5 µm, and it may be about 20 µm or less, or about 15 µm or less, or about 10 µm or less, but is not limited thereto.

When the first conductive via 142 protrudes from the third insulating layer 133d, the external pad 150 may contact the upper surface and side wall of the first conductive via 142.

Meanwhile, the first conductive via 142 may penetrate through the redistributed layer 141 and contact the upper surface of the second insulating layer 132d.

However, when the first conductive via 142 is omitted, the external pad 150 may be directly connected electrically to the redistributed layer 141.

In FIG. 18, the external pad 150 is illustrated as having a structure 150a with a flat upper portion, but the present invention is not limited thereto.

<Structure of the Tenth Semiconductor Package 100j>

Figure 20:
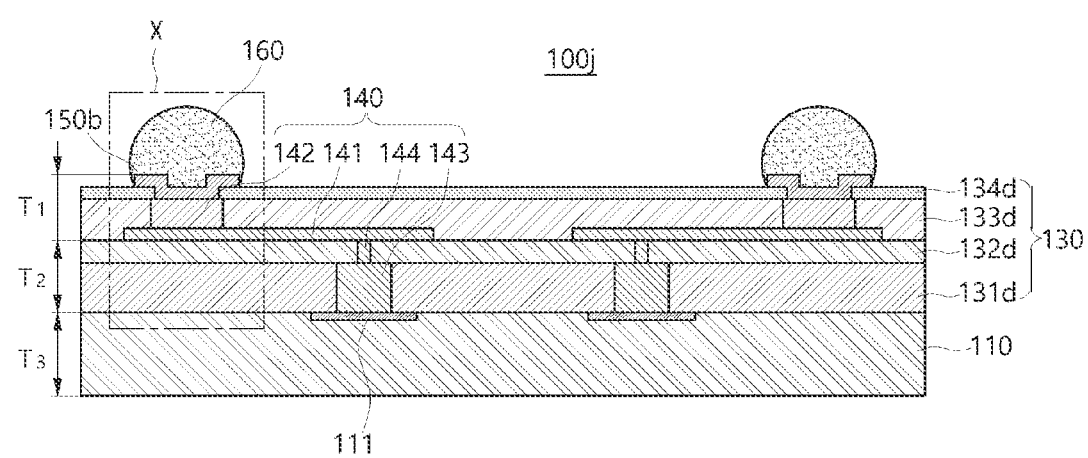
FIG. 20 is a cross-sectional diagram of a tenth semiconductor package 100j according to an exemplary embodiment of the present invention.
Figure 21:
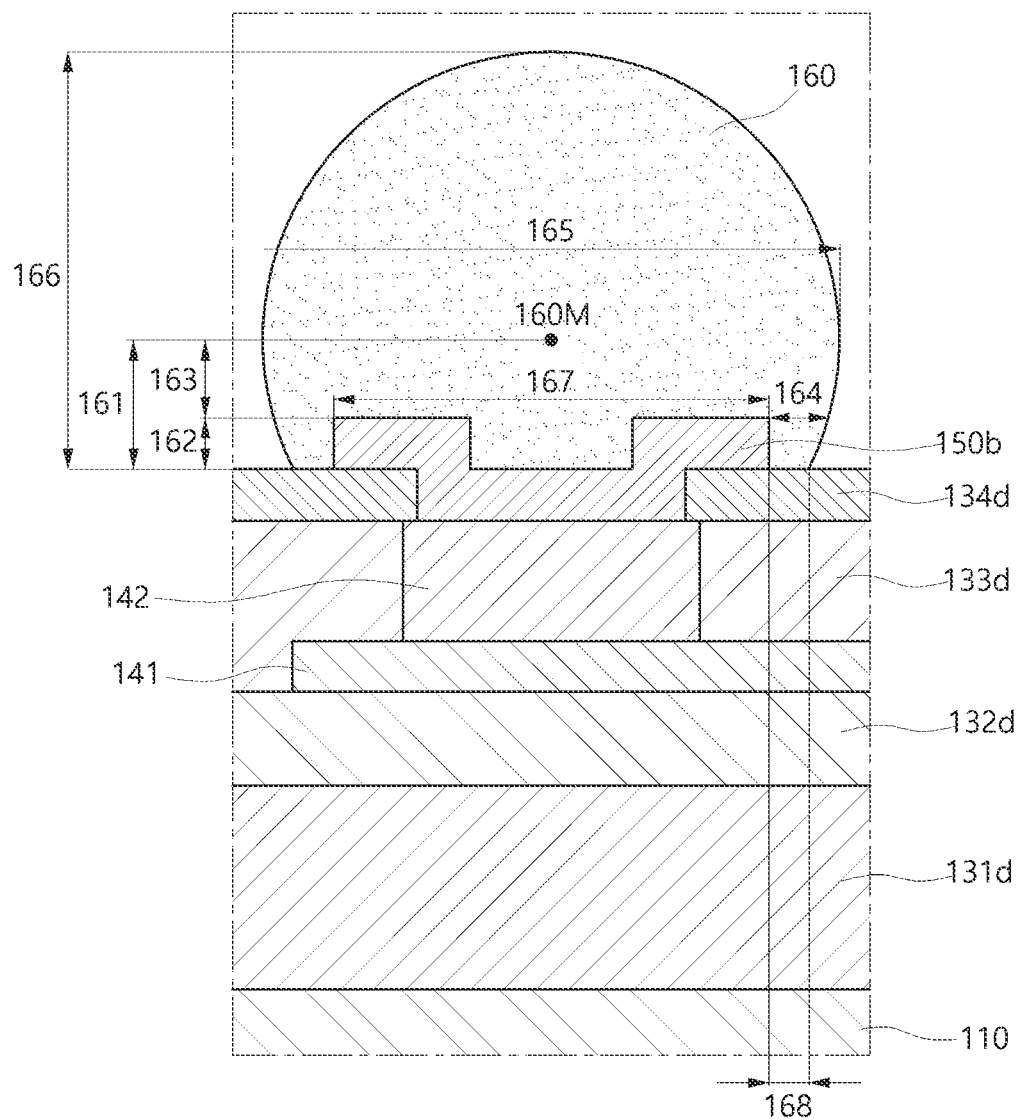
FIG. 21 is an enlarged cross-sectional diagram showing an area marked "X" when the external connection terminal 160 in FIG. 20 is a surface contact type.

Referring to FIG. 20, the tenth semiconductor package 100j according to an exemplary embodiment of the present invention may include a semiconductor chip 110, a protective layer 120, an insulating pattern 130, a redistributed pattern 140, an external pad 150, and an external connection terminal 160. However, since the description of the semiconductor chip 110, the protective layer 120, the insulating pattern 130, the redistributed pattern 140, the external pad 150, and the external connection terminal 160 is the same as described above, the characteristics of the tenth semiconductor package 100j, which are not described above, that is, only characteristics that differ in the structure of the ninth semiconductor package 100i will be described below.

First, the insulating pattern 130 may include a first insulating layer 131d, a second insulating layer 132d stacked on the first insulating layer 131d, a third insulating layer 133d stacked on the second insulating layer 132d, and a fourth insulating layer 134d stacked on the third insulating layer 133d.

In addition, in the insulating pattern 130, as the first insulating layer 131d and the third insulating layer 133d are formed to be about 15 μm to about 55 μm, or about 25 μm to about 55 μm, which is thicker than the conventional insulating layer and as the second insulating layer 132d and the fourth insulating layer 134d are additionally formed in addition to the first insulating layer 131d and the third insulating layer 133d, the effective coefficient of thermal expansion of the first structure in the semiconductor package 100j is increased naturally, and it may approach the effective coefficient of thermal expansion of an external device such as a board and the like, on which the semiconductor package 100j is mounted.

In addition, the redistributed pattern 140 may include a redistributed layer 141, a second conductive via 143, and a third conductive via 144.

In FIG. 20, the external pad 150 is illustrated to have a concave structure 150b, but is not limited thereto.

Hereinafter, the manufacturing method of a semiconductor package 100 according to various exemplary embodiments of the present invention will be described.

The manufacturing method of the semiconductor package 100 according to various exemplary embodiments of the present invention may include a first structure forming process for forming a first structure and other forming processes each for forming an external pad 150 and an external connection terminal 160 in the first structure. However, in the manufacturing method for the second semiconductor package 100b, the fifth semiconductor package 100e, and the like, other forming processes include forming the external connection terminal 160 by omitting the external pad 150.

In this case, the first structure may include a semiconductor chip 110, a protective layer 120, and an insulating pattern 130 as described above, and for convenience of explanation, it is assumed that the redistributed pattern 140 is also included. However, for the configuration of the first structure, that is, the semiconductor chip 110, the protective layer 120, the insulating pattern 130, the redistributed pattern 140, the external pad 150, and the external connection terminal 160, it is described with reference to FIGS. 1 to 23, and hereinafter, the manufacturing method of each semiconductor package 100 according to various exemplary embodiments will be described in more detail below.

<Manufacturing method of the first semiconductor package 100a>

FIGS. 24A, 24B, 24C, 24), 24E and 24F are the cross-sectional diagrams sequentially illustrating the manufacturing method of a first semiconductor package 100a according to an exemplary embodiment of the present invention.

First, as illustrated in FIGS. 24A to 24D, a first structure of the first semiconductor package 100a including a semiconductor chip 110, a protective layer 120, a first insulating layer 131a, a second insulating layer 132a, a redistributed layer 141, and a first conductive via 142 may be formed.

To this end, the protective layer 120 may be formed on the second surface of the semiconductor chip 110 to cover the semiconductor chip 110.

That is, after preparing a substrate, the semiconductor chip 110 may be disposed such that a first surface of the semiconductor chip 110 faces the substrate. In this case, the semiconductor chip 110 may be in a wafer state before being cut. In addition, the substrate is a configuration for temporarily supporting the semiconductor chip 110, and may have an adhesive portion thereon such that the disposed semiconductor chip 110 is fixed. Next, the protective layer 120 may be formed to cover a second surface of the semiconductor chip 110. In this case, thermal curing may be performed for the protective layer 120. Accordingly, it is possible to correct warpage of the first semiconductor package 100a and improve its durability. Next, the substrate may be removed. In this case, the semiconductor package 100a may be supported by the cured protective layer 120. Meanwhile, after the substrate is removed, the upper and lower portions of the semiconductor package 100a may be turned over. Accordingly, the remaining components of the semiconductor package 100a may be formed on the first surface 112 of the semiconductor chip 110 through a process to be described below.

Figure 24A:
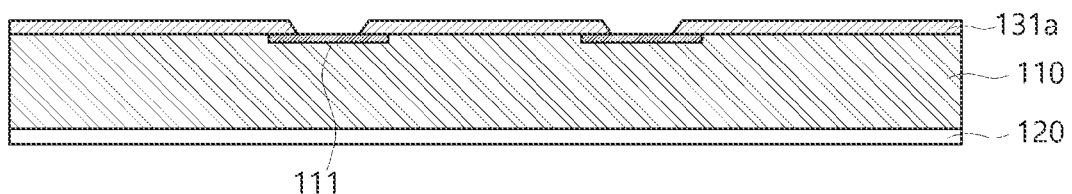
FIGS. 24A, 24B, 24C, 24D, 24E and 24F are cross-sectional diagrams sequentially illustrating a manufacturing method of a first semiconductor package 100a according to an exemplary embodiment of the present invention.

Afterwards, the first insulating layer 131a may be formed on the first surface of the semiconductor chip 110 provided with the chip terminal 111 (refer to FIG. 24A). In this case, by removing a portion of the upper surface of the first insulating layer 131a through an etch back process, a polishing process, or the like, the height of the first insulating layer 131a may be lowered and the surface roughness of the upper surface may be increased. In this case, the increased surface roughness of the first insulating layer 131a may be greater than the surface roughness of the upper and lower surfaces of the second insulating layer 132a formed through a subsequent process. As the surface roughness of the upper surface of the first insulating layer 131a is increased as described above, the adhesion force between the redistributed layer 141 and the first insulating layer 131a formed through a subsequent process may be strengthened.

Figure 24B:
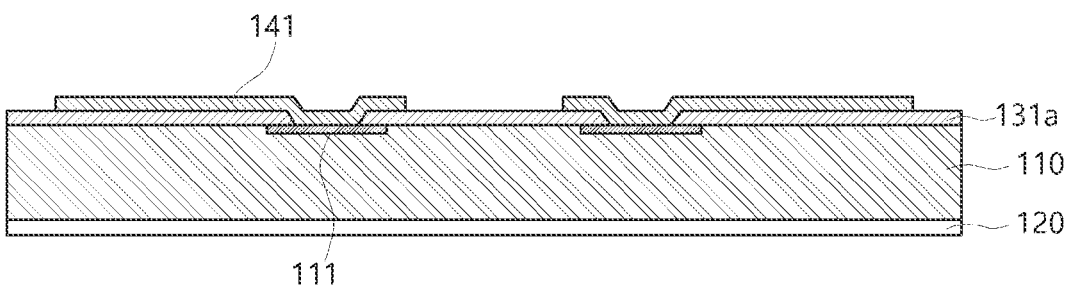

Afterwards, after forming an opening exposing a portion of the chip terminal 111 through an etching process or the like on the upper surface of the first insulating layer 131a, the redistributed layer 141 may be formed on the first insulating layer 131a (refer to FIG. 24B). That is, the redistributed layer 141 may extend along the upper surface of the first insulating layer 131a and may be electrically connected to the chip terminal 111 of the semiconductor chip 110. In this case, the opening of the first insulating layer 131a may have a tapered shape, a stepped shape, or the like and a portion of the redistributed layer 141 formed above the opening of the first insulating layer 131a may also have a tapered shape or a stepped shape, but is not limited thereto. For example, the opening of the first insulating layer 131a may be formed through etching, polishing, chemical mechanical polishing (CMP), grinding, or a combination of these processes, but is not limited thereto.

In addition, in order to form the redistributed layer 141, a seed metal layer may be formed to cover at least a portion of the upper surface of the first insulating layer 131a, and a plating process using the seed metal layer as a seed may be performed. For example, the redistributed layer 141 may be formed through immersion plating, electroless plating, electroplating, or a combination thereof, but is not limited thereto.

Afterwards, after forming the first conductive via 142 on the redistributed layer 141, the second insulating layer 132a may be formed to cover at least one side surface of the first conductive via 142. That is, after forming the first conductive via 142 in a post form on the redistributed layer 141, the second insulating layer 132a may be formed to cover the corresponding post, and then the upper portion of the second insulating layer 132a where the corresponding post is located may be ground to open the first conductive via 142. In this case, a seed metal layer covering at least a portion of the upper surface of the redistributed layer 141 may be formed, and a plating process using the seed metal layer as a seed may be performed. For example, the first conductive via 142 may be formed through immersion plating, electroless plating, electroplating, or a combination thereof, but is not limited thereto. These processes may all be used when the second insulating layer 132a is photosensitive and non-photosensitive.

Figure 24C:
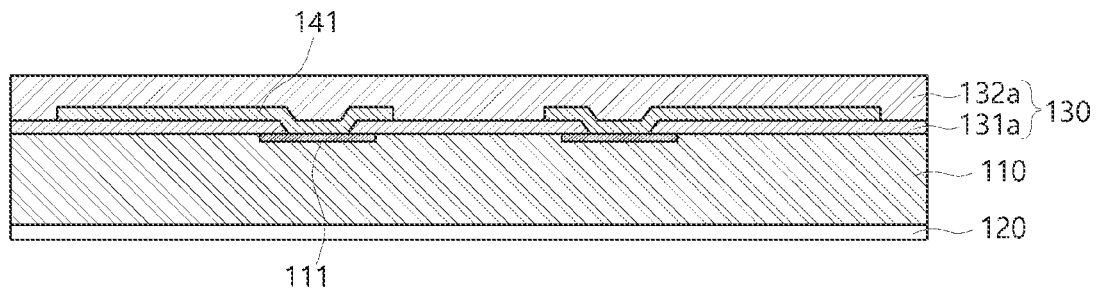
Figure 24D:
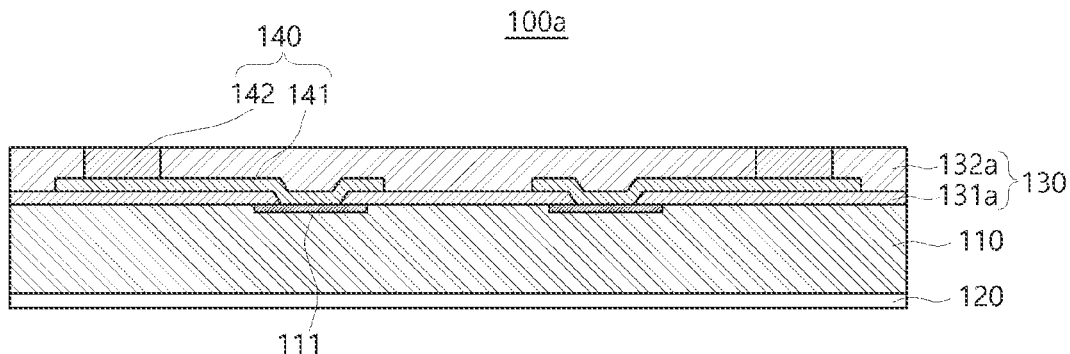

However, unlike the above description, the second insulating layer 132a may be formed before the first conductive via 142 as in the order of FIGS. 24C and 24). That is, the second insulating layer 132a is formed on the redistributed layer 141 so as to cover the redistributed layer 141 (refer to FIG. 24C). Afterwards, after forming an opening in which a portion of the redistributed layer 141 is exposed through an etching process or the like on the upper surface of the second insulating layer 132a, the first conductive via 142 electrically connected to the redistributed layer 141 may be formed (refer to FIG. 24D) through a plating process of filling the corresponding opening of the second insulating layer 132a with a conductive material. In this case, the opening of the second insulating layer 132a may have a tapered shape or a stepped shape, and a portion of the first conductive via 142 formed in the opening of the second insulating layer 132a may also a tapered shape or a stepped shape, but is not limited thereto. For example, the opening of the second insulating layer 132a may be formed through etching, polishing, chemical mechanical polishing (CMP), grinding, laser irradiation, or a combination of these processes, but is not limited thereto. However, these processes may be used when the second insulating layer 132a is photosensitive.

In addition, the opening may be formed in the first insulating layer 131a or the second insulating layer 132a, in particular, in the second insulating layer 132a formed to be relatively thick. The opening of the insulating layers 131a and 132a may include a tapered structure in which a cross-sectional area becomes smaller as it goes from the inlet to the inner side, or a step structure (a structure having a plurality of regions with different cross-sectional areas, but with a smaller cross-sectional area in a region close to the inner side). For example, the diameter of the cross-sectional area of the opening of the insulating layers 131a and 132a may be about 5 μm to about 20 μm, but is not limited thereto, and values of the cross-sectional diameter may vary according to various shapes.

Meanwhile, the first insulating layer 131a or the second insulating layer 132a may be formed through a film lamination process using an insulating film in a solid state. For example, by applying an insulating film in a semi-cured state (i.e., B-stage), and performing a pre-cure process, the corresponding insulating layers 131a and 132a may be formed. However, it is not limited to the above description, and the first insulating layer 131a or the second insulating layer 132a may be formed using a liquid material. In this case, residual stress may be generated in the insulating layers 131a and 132a during a heat shrinkage process of a liquid material. That is, when the insulating layers 131a and 132a are formed using a solid insulating film, it is possible to minimize the occurrence of residual stress due to heat shrinkage, and the insulating layers 131a and 132a having a relatively thick thickness may be easily formed.

Figure 24E:
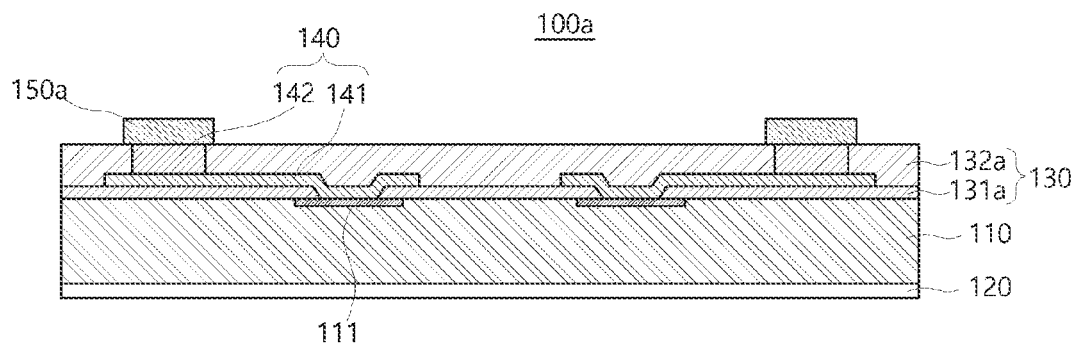
Figure 24F:
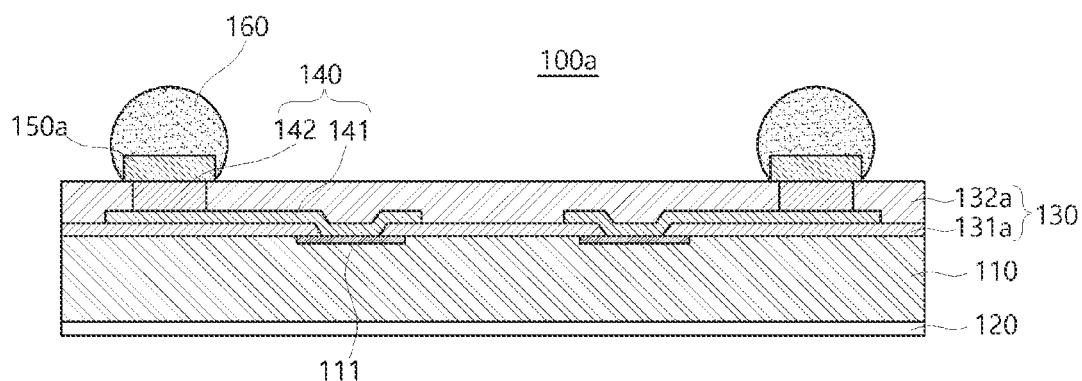

After forming a first structure of the first semiconductor package 100a according to the above-described process, as illustrated in FIGS. 24E and 24F, the external pad 150 and the external connection terminal 160 may be formed on the first structure of the first semiconductor package 100a. That is, after forming the external pad 150 electrically connected to the first conductive via 142 on the uppermost layer of the insulating pattern 130 (refer to FIG. 24E), the external connection terminal 160 electrically connected to the external pad 150 may be formed on the external pad 150 (refer to FIG. 24E).

In this case, the external pad 150 may include a lower metal layer and an upper metal layer on the lower metal layer. The lower metal layer is a layer formed through a sputtering process or the like, and covers the first conductive via 142. Afterwards, by forming a first mask pattern exposing a portion of the lower metal layer, the upper metal layer may be formed in the opening of the first mask pattern. For example, in order to form the first mask pattern, a photosensitive material layer may be formed on the lower metal layer, and the corresponding photosensitive material layer may be patterned through exposure and development processes for the corresponding photosensitive material layer. Afterwards, after forming the upper metal layer through a plating process and the like using the lower metal layer as a seed in the opening of the first mask pattern, the first mask pattern and a portion of the lower metal layer under the first mask pattern may be removed. For example, the mask pattern may be removed through a strip process or the like, and a portion of the lower metal layer may be removed through an etching process or the like.

In addition, a cover layer covering at least a portion of the external pad 150 may be formed on the upper metal layer through an electroless plating process, a sputtering process, or the like. In this case, the cover layer may cover the upper surface or side wall of the external pad 150. When the cover layer is formed, the cover layer may contact the external connection terminal 160. The cover layer may include a metallic material having excellent wettability. For example, the cover layer may include a material having a contact angle of 0° to 90°, a material having a contact angle of 10° to 80°, or a material having a contact angle of 20° to 70°, as a measure of wettability with the external connection terminal 160. For example, the cover layer may include Au, Pd, Ni Cu, solder, a combination thereof, or the like. During the reflow process for forming the external connection terminal 160, the cover layer may serve to improve the flowability of materials constituting the external connection terminal 160. For example, during the reflow process for forming the external connection terminal 160, the molten solder may spread along the surface of the cover layer comprising a metal material having excellent wettability such that the external connection terminal 160 may be formed to cover the side wall of the external pad 150 thickly.

The cover layer may be a thin metal film formed on the surface of the external pad. For example, the thickness of the cover layer may be 0.001 μm or more, or 0.005 μm or more, or 0.01 μm or more, or 0.05 μm or more, or 0.1 μm or more, and it may be 1 μm or less, or 0.95 μm or less, or 0.9 μm or less, or 0.85 μm or less, or 0.8 μm or less.

When the thickness of the cover layer is less than 0.001 μm, the wettability of the cover layer is lowered, and when the external connection terminal 160 is reflowed using the cover layer, the flowability of the materials constituting the external connection terminal 160 is not sufficiently strengthened. As a result, the side wall of the external pad 150 may not be covered by the external connection terminal 160 or the thickness of the external connection terminal 160 on the side wall of the external pad 150 may be formed to be too thin. When the thickness of the cover layer is greater than 1 μm, when the external connection terminal 160 is reflowed using the cover layer, the flowability of the materials constituting the external connection terminal 160 is excessively strengthened, and the height of the external connection terminal 160 may be too low, and an intermetallic compound may be formed to be too thick between the external connection terminal 160 and the external pad 150.

Meanwhile, after applying a flux on the cover layer and arranging a solder bump of a spherical shape, a ball shape, or the like on the cover layer on which the flux is applied, a reflow process may be performed to form the external connection terminal 160. For example, the reflow process may be performed at a temperature of 200° C. to 280° C. for several tens of seconds to several minutes. During the reflow process, the cover layer may diffuse, and an intermetallic compound layer may be formed as a result of reacting a third metal material included in the cover layer with a first metal material included in the external pad 150 and a second metal included in the external connection terminal 160 at a high temperature. The intermetallic compound layer may be formed along the surface of the external pad 150. For example, when the external pad 150 includes Cu and/or Ni, the external connection terminal 160 includes Sn and/or Cu, and when the cover layer includes Au, the intermetallic compound layer may include Cu—Ni—Sn—Au. However, the materials or compositions of the intermetallic compound layer are not limited thereto, and may vary depending on the material of the external pad 150, the material of the external connection terminal 160, the material of the cover layer, the temperature and time of the reflow process, and the like.

Since the reflow process is performed in a state in which the cover layer having excellent wettability is formed, the external connection terminal 160 may be formed to be relatively thick on the side wall of the external pad 150 drawn to the upper surface of the uppermost layer of the insulating pattern 130. For example, with respect to the second direction parallel to the first surface of the semiconductor chip 110, between the uppermost end of the side wall of the external pad 150 drawn to the upper surface of the uppermost layer of the insulating pattern 130 and the outer surface of the external connection terminal 160, the length 164 along the second direction of the external connection terminal 160 may be at least about 10 μm or more, and may be, for example, about 10 μm to about 30 μm. However, the length 164 along the second direction of the external connection terminal 160 may refer to a value excluding the thickness along the second direction of the intermetallic compound layer on the side wall of the external pad 150, in the distance along the second direction between the side wall of the external pad 150 drawn to the upper surface of the uppermost layer of the insulating pattern 130 and the outer surface of the external connection terminal 160.

In this case, the length 164 along the second direction of the external connection terminal 160 may be appropriately adjusted according to conditions such as the thickness of the cover layer, the material constituting the cover layer, the material constituting the external connection terminal 160, the temperature and time of the reflow process, and the like.

In addition, during the reflow process for forming the external connection terminal 160, as the third metal material included in the cover layer is diffused, the external connection terminal 160 may include a third metal material. In this case, the content of the third metal material included in the external connection terminal 160 may be 0.00001 wt. % or more, or 0.0005 wt. % or more, or 0.0001 wt. % or more, or 0.0003 wt. % or more, or 0.0005 wt. % or more of the total weight of the external connection terminal 160, or it may be 1 wt. % or less, or 0.95 wt. % or less, or 0.85 wt. % or less, or 0.8 wt. % or less.

When the content of the third metal material included in the external connection terminal 160 is less than 0.00001 wt. % of the total weight of the external connection terminal 160, the wettability of the cover layer is lowered, and during the reflow process of the external connection terminal 160 using a cover layer, the flowability of the materials constituting the external connection terminal 160 may not be sufficiently strengthened, and as a result, the side wall of the external pad 150 may not be covered by the external connection terminal 160 or the thickness of the external connection terminal 160 on the side wall of the external pad 150 may be formed to be too thin. When the content of the third metal material included in the external connection terminal 160 is greater than 1 wt. % of the total weight of the external connection terminal 160, during the reflow process of the external connection terminal 160 using a cover layer, the flowability of the materials constituting the external connection terminal 160 is excessively strengthened such that the height of the external connection terminal 160 may be too low, and the intermetallic compound between the external connection terminal 160 and the external pad 150 may be formed to be too thick.

In a general semiconductor package, when an external pad is formed to have a thickness of 10 μm or more, the side wall of the external pad is exposed to the outside or an external connection terminal covering the side wall of the external pad is not formed to be sufficiently thick even after a reflow process. On the other hand, in the present invention, since the reflow process is performed in a state in which the cover layer is formed on the external pad 150, the molten material constituting the external connection terminal 160 is spread along the surface of a cover layer comprising a metal material having excellent wettability, and the external connection terminal 160 formed as a result of the reflow process may be formed to cover the side wall of the external pad 150 thickly. Accordingly, external impacts may be alleviated by the external connection terminal 160 covering the side wall of the external pad 150 such that the occurrence of cracks in the vicinity of the external pad 150 may be suppressed, and ultimately, the reliability of bonding between the first semiconductor package 100$a$ and the board may be improved.

Meanwhile, after removing the first mask pattern, a second mask pattern may be formed on the lower metal layer. The second mask pattern may include an opening exposing the upper metal layer. For example, in order to form the second mask pattern, a photosensitive material layer may be formed on the upper metal layer, and the corresponding photosensitive material layer may be patterned through exposure and development processes for the corresponding photosensitive material layer. The opening of the second mask pattern may be formed to have a larger width than that of the upper metal layer. Through the opening of the second mask pattern, the upper surface and side wall of the upper metal layer may be exposed, and a portion of the lower metal layer may be exposed between the side wall of the upper metal layer and the inner wall of the second mask pattern.

The inner wall of the second mask pattern formed by the opening of the second mask pattern may be spaced by a predetermined distance from the side wall of the upper metal layer. For example, the separation distance between the side wall of the upper metal layer and the inner wall of the second mask pattern in the second direction may be about 5 μm to about 50 μm, or about 10 μm to about 30 μm.

After the second mask pattern is formed, a preliminary metal layer may be formed to cover the external pad 150 in the opening of the second mask pattern. For example, the preliminary metal layer may cover the upper surface of the upper metal layer, the side wall of the upper metal layer, and the lower metal layer exposed between the side wall of the upper metal layer and the inner wall of the second mask pattern. For example, it may be formed through a preliminary metal layer plating process and the like, and may include Sn, Ag, In, Bi, Sb, Cu, Zn, Pb, and/or alloys thereof. The preliminary metal layer may comprise the same material as the solder bump disposed on the preliminary metal layer through a subsequent process.

The preliminary metal layer may be formed to fill a space between the side wall of the upper metal layer and the inner wall of the second mask pattern. Accordingly, the length of the preliminary metal layer covering the side wall of the upper metal layer along the second direction may correspond to a separation distance between the side wall of the upper metal layer and the inner wall of the second mask pattern. For example, the length of the preliminary metal layer covering the side wall of the upper metal layer along the second direction may be about 5 μm to about 50 μm, or about 10 μm to about 30 μm.

After the upper metal layer is formed, the first mask pattern and a portion of the lower metal layer under the first mask pattern may be removed. For example, the mask pattern may be removed through a strip process or the like, and a portion of the lower metal layer may be removed through an etching process or the like.

After the preliminary metal layer is formed, the second mask pattern may be removed through a strip process or the like. Afterwards, the second mask pattern may be removed to remove a portion of the exposed lower metal layer. That is, the first portion of the lower metal layer covered by the preliminary metal layer and the upper metal layer 153 may remain, and the second portion of the lower metal layer exposed by removing the second mask pattern may be removed through an etching process or the like.

After applying a flux on the preliminary metal layer and disposing a solder bump of a spherical shape, a ball shape, or the like on the preliminary metal layer on which the flux is applied, a reflow process may be performed to form the external connection terminal 160. During the reflow process, as the solder bump and the preliminary metal layer are melted at a high temperature and then cured, the external connection terminal 160 in which the solder bump and the preliminary metal layer are integrated may be formed.

Since the reflow process is performed in a state in which the preliminary metal layer is already formed, the external connection terminal 160 generated from the preliminary metal layer may cover the side wall of the upper metal layer. In this case, on the side wall of the upper metal layer, the length 164 of the external connection terminal 160 along the second direction may be equal to or greater than the length of the preliminary metal layer along the second direction. For example, on the side wall of the upper metal layer, the length 164 of the external connection terminal 160 along the second direction may be equal to or greater than the length of the preliminary metal layer along the second direction. For example, on the side wall of the upper metal layer, the length 164 of the external connection terminal 160 along the second direction may be about 5 μm or more. For example, between the uppermost end of the side wall of the upper metal layer and the outer surface of the external connection terminal 160, the length 164 of the external connection terminal 160 along the second direction may be about 10 μm to about 30 μm.

When performing a reflow process after pre-forming a preliminary metal layer covering the external pad 150, the external connection terminal 160 may be formed to completely cover the external pad 150. In this case, since the external pad 150 may be protected by the external connection terminal 160, damage to the external pad 150 may be prevented.

However, the contents for specific values, process methods, and the like for the lower metal layer, the upper metal layer, the cover layer, the preliminary metal layer, the external pad 150, and the external connection terminal 160 described above are not limited thereto and may be more diverse.

Meanwhile, as illustrated in FIGS. 22 and 23, the first conductive via 142 may be omitted. In this case, in the description of the process of forming the external pad 150 described above, the external pad 150 may be replaced by being formed on the redistributed layer 141 instead of the first conductive via 142.

Afterwards, the first semiconductor package 100a may be subjected to final processing. That is, when a plurality of first semiconductor packages 100a connected to each other such as wafer-level packages are manufactured, they may be individualized into individual first semiconductor packages 100a by cutting along a scribe line or the like.

<Manufacturing Method of the Second Semiconductor Package 100b>

Figure 25A:
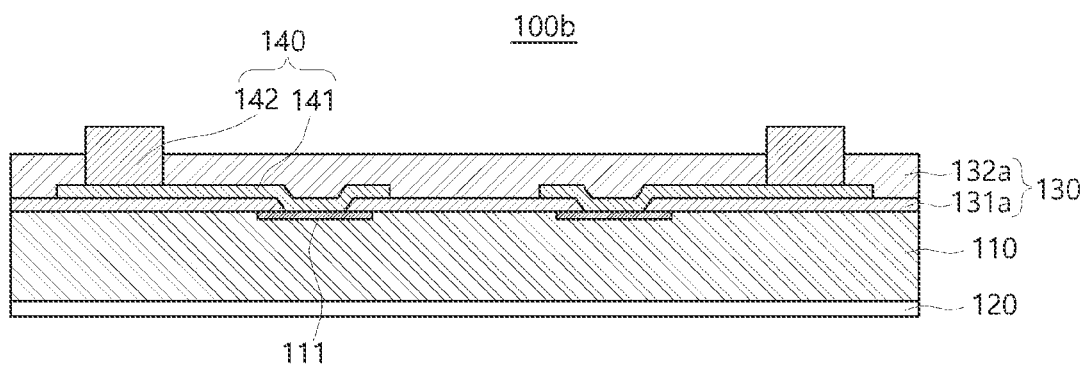
FIGS. 25A and 25B are cross-sectional diagrams sequentially illustrating a manufacturing method of a second semiconductor package 100b according to an exemplary embodiment of the present invention
Figure 25B:
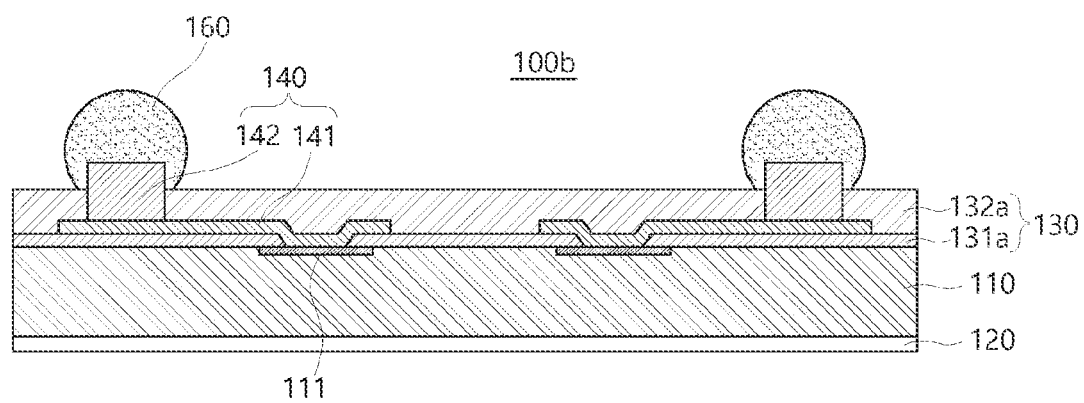

FIGS. 25A and 25B are cross-sectional diagrams sequentially illustrating the manufacturing method of the second semiconductor package 100b according to an exemplary embodiment of the present invention.

First, as illustrated in FIG. 25A, a first structure of the second semiconductor package 100b including a semiconductor chip 110, a protective layer 120, a first insulating layer 131a, a second insulating layer 132a, a redistributed layer 141, and a first conductive via 142 may be formed. In this case, in the first structure of the second semiconductor package 100b, the semiconductor chip 110, the protective layer 120, the first insulating layer 131a, the second insulating layer 132a, the redistributed layer 141, and the first conductivity via 142 may be formed in the same manner as the description of the first structure forming process in the above-described manufacturing method of the first semiconductor package 100a.

However, the first conductive via 142 may be formed to have a protrusion portion protruding towards the upper surface of the second insulating layer 132a which is the uppermost layer of the insulating pattern 130, and thus may replace the external pad 150. In this case, the first conductive via 142 may be formed in the same manner as the description of the process of forming the external pad 150 in the above-described manufacturing method of the first semiconductor package 100a. However, in the corresponding description, the external pad 150 may be replaced with the first conductive via 142.

Afterwards, as illustrated in FIG. 25B, the external connection terminal 160 may be formed on the first structure of the second semiconductor package 100b. That is, the external connection terminal 160 electrically connected to the first conductive via 142 may be formed on the first conductive via 142. In this case, the external connection terminal 160 may be formed in the same manner as the description of the process of forming the external connection terminal 160 in the above-described manufacturing method of the first semiconductor package 100a. However, in the description, the external pad 150 may be replaced with the first conductive via 142.

<Manufacturing Method of the Third Semiconductor Package 100c>

FIGS. 26A, 26B, 26C and 26D are cross-sectional diagrams sequentially illustrating the manufacturing method of the third semiconductor package 100c according to an exemplary embodiment of the present invention.

Figure 26A:
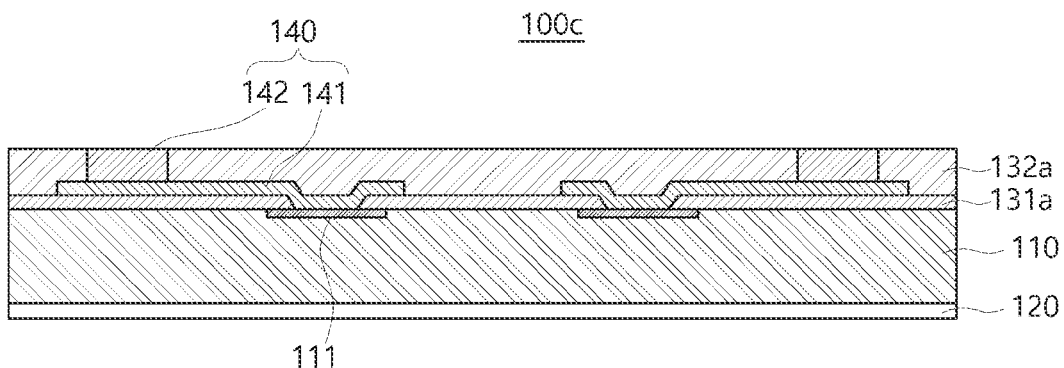
FIGS. 26A, 26B, 26C and 26D are cross-sectional diagrams sequentially illustrating a manufacturing method of a third semiconductor package 100c according to an exemplary embodiment of the present invention.
Figure 26B:
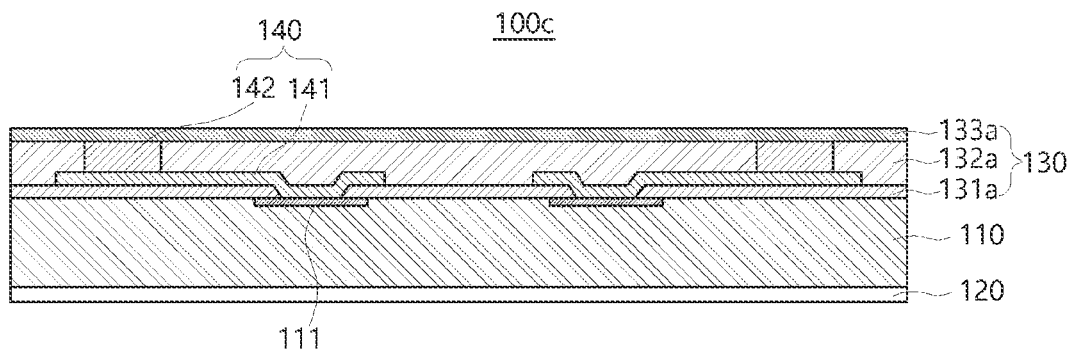

First, as illustrated in FIGS. 26A and 26B, a first structure of the third semiconductor package 100c including a semiconductor chip 110, a protective layer 120, a first insulating layer 131a, a second insulating layer 132a, a third insulating layer 133a, a redistributed layer 141, and a first conductive via 142 may be formed. In this case, in the first structure of the third semiconductor package 100c, the semiconductor chip 110, the protective layer 120, the first insulating layer 131a, the second insulating layer 132a, the redistributed layer 141, and the first conductivity via 142 may be formed in the same manner as the description of the first structure forming process in the above-described manufacturing method of the first semiconductor package 100a.

However, when forming the second insulating layer 132a, the height of the second insulating layer 132a may be lowered by removing a portion of the upper surface of the second insulating layer 132a, through an etch back process, a polishing process, or the like, and the surface roughness of its upper surface may be increased. In this case, the increased surface roughness of the second insulating layer 132a may be greater than the surface roughness of the upper and lower surfaces of the third insulating layer 133a formed through a subsequent process. As the surface roughness of the upper surface of the second insulating layer 132a is increased as described above, the adhesion force of the second insulating layer 132a to the third insulating layer 133a formed through a subsequent process may be strengthened.

After forming a portion of the first structure of the third semiconductor package 100c (refer to FIG. 26A) as described above, the third insulating layer 133a may be formed on the second insulating layer 132a and the first conductive via 142 so as to cover the second insulating layer 132a and the first conductive via 142 (refer to FIG. 26B), thereby forming the remainder of the first structure of the third semiconductor package 100c.

Meanwhile, the third insulating layer 133a may be formed through a film lamination process using a solid-state insulating film. For example, the third insulating layer 133a may be formed by applying an insulating film in a semi-cured state (i.e., B-stage) and performing a pre-cure process. However, it is not limited to the above, and the third insulating layer 133a may be formed by using a liquid material. In this case, residual stress may be generated in the third insulating layer 133a during a heat shrinkage process of the liquid material. That is, when the third insulating layer 133a is formed using a solid-state insulating film, it is possible to minimize the occurrence of residual stress due to heat shrinkage, and the third insulating layer 133a having a relatively thick thickness may be easily formed.

Figure 26C:
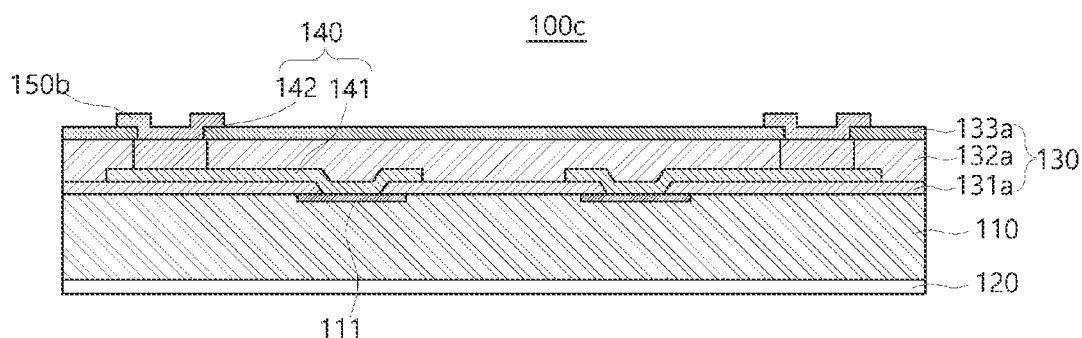
Figure 26D:
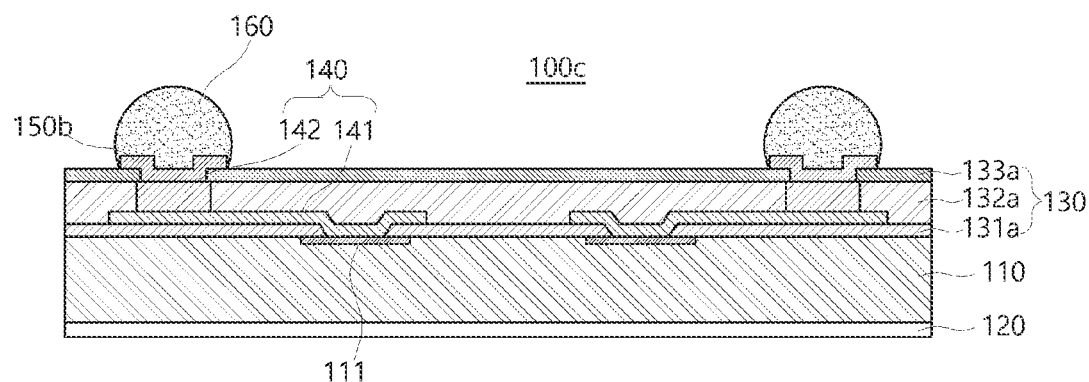

Afterwards, as illustrated in FIGS. 26C and 26), the external pad 150 and the external connection terminal 160 may be formed on the first structure of the third semiconductor package 100c. That is, an opening exposing a portion of the first conductive via 142 is formed on the top of the third insulating layer 133a, and through a plating process of filling the corresponding opening of the third insulating layer 133a with a conductive material, it may be provided on the insulating layer 133a, and the external pad 150 may be formed which is electrically connected to the first conductive via 142 (refer to FIG. 26C), and the external connection terminal 160 electrically connected to the external pad 150 on the external pad 150 may be formed (refer to FIG. 26D).

In this case, the external pad 150 and the external connection terminal 160 may be formed in the same manner as the description of the process of forming the external pad 150 and the external connection terminal 160 in the above-described manufacturing method of the first semiconductor package 100a.

<Manufacturing Method of the Fourth Semiconductor Package 100d>

FIGS. 27A, 27B, 27C, 27D, 27E, 27F and 27G are cross-sectional diagrams sequentially illustrating the manufacturing method of the fourth semiconductor package 100d according to an exemplary embodiment of the present invention.

First, as illustrated in FIGS. 27A to 27E, a first structure of the fourth semiconductor package 100d including a semiconductor chip 110, a protective layer 120, a first insulating layer 131b, a second insulating layer 132b, a redistributed layer 141, a first conductive via 142, and a second conductive via 143 may be formed.

To this end, the protective layer 120 may be formed on a second surface of the semiconductor chip 110 to cover the semiconductor chip 110.

That is, after preparing a substrate, the semiconductor chip 110 may be disposed on the substrate so as to face a first surface of the semiconductor chip 110.

Afterwards, after forming the second conductive via 143 on the first surface of the semiconductor chip 110, a first insulating layer 131b may be formed to cover at least one side surface of the second conductive via 143. The process may be the same as described above for the first conductive via 142 and the second insulating layer 132a in the manufacturing method of the first semiconductor package 100a.

Figure 27A:
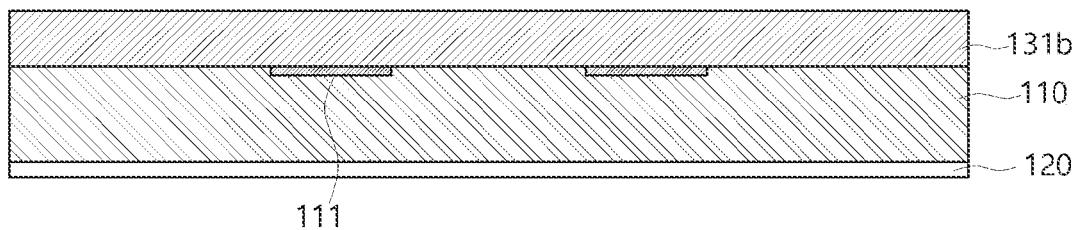
FIGS. 27A, 27B, 27C, 27D, 27E, 27F and 27G are cross-sectional diagrams sequentially illustrating a manufacturing method of a fourth semiconductor package 100d according to an exemplary embodiment of the present invention.
Figure 27B:
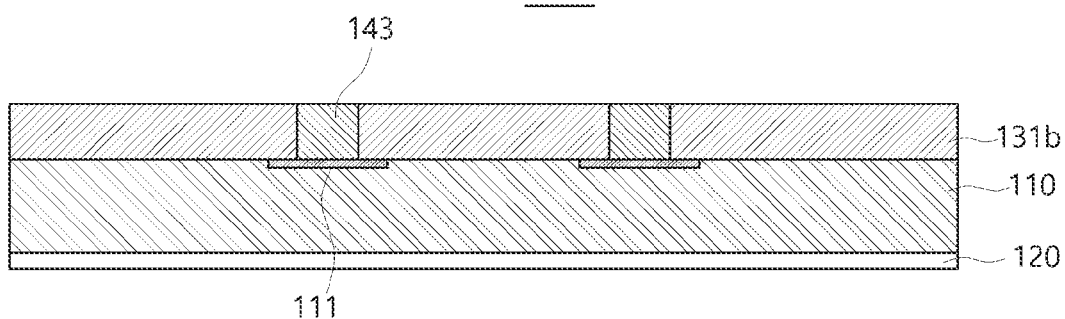

Unlike the above, as in the order of FIGS. 27A and 27B, the first insulating layer 131b may be formed before the first conductive via 142. Afterwards, an opening may be formed which exposes a portion of the chip terminal 111 through an etching process or the like on the top of the first insulating layer 131b, and through a plating process of filling the corresponding opening of the first insulating layer 131b with a conductive material, a second conductive via 143 eclectically connected to the chip terminal 111 of the semiconductor chip 110 may be formed (refer to FIG. 27B). In this case, the opening of the first insulating layer 131b may have a tapered shape, a stepped shape, or the like, and a portion of the second conductive via 143 formed in the opening of the first insulating layer 131b may also have a tapered or a stepped shape, but is not limited thereto. For example, the opening of the first insulating layer 131b may be formed through stamping, etching, polishing, chemical mechanical polishing (CMP), grinding, laser irradiation, or a combination of these process, but is not limited thereto. However, these processes may be used when the first insulating layer 131b is photosensitive.

Figure 27C:
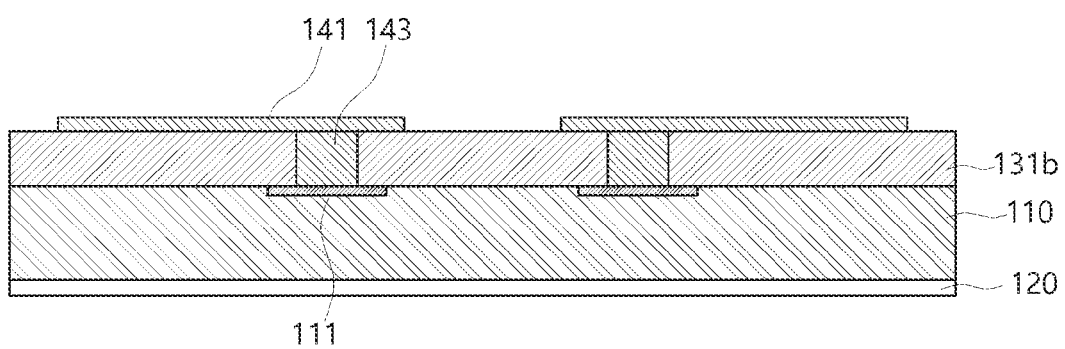

Afterwards, a redistributed layer 141 may be formed on the first insulating layer 131b, but the redistributed layer 141 may be formed to be electrically connected to the second conductive via 143 (refer FIG. 27C).

Afterwards, after forming the first conductive via 142 on the redistributed layer 141, a second insulating layer 132b may be formed to cover at least one side surface of the first conductive via 142.

Figure 27D:
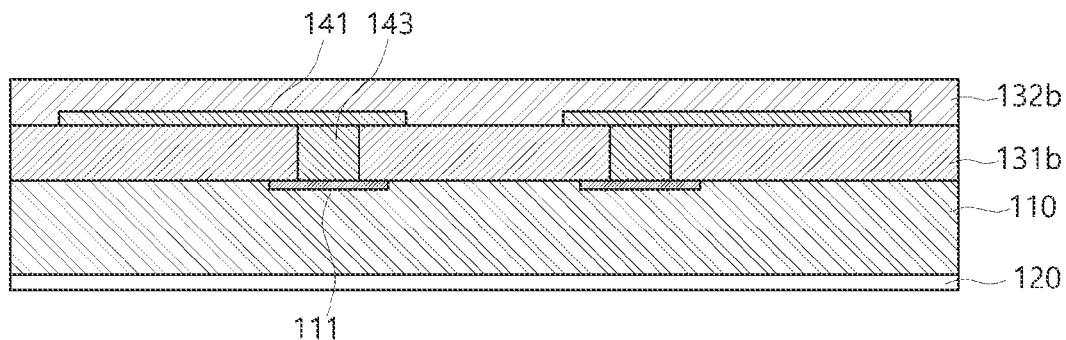
Figure 27E:
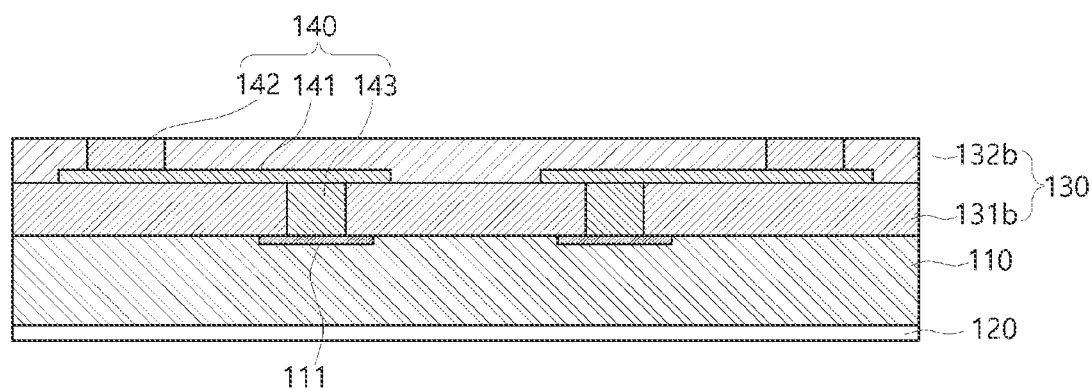

Unlike the above, after forming the second insulating layer 132b on the redistributed layer 141 to cover the redistributed layer 141 (refer to FIG. 27D), an opening may be formed which exposes a portion of the redistributed layer 141 through an etching process or the like on the top of the second insulating layer 132b, and through a plating process of filling the corresponding opening of the second insulating layer 132b with a conductive material, a first conductive via 142 electrically connected to the redistributed layer 141 may be formed (refer to FIG. 27E).

Meanwhile, the first insulating layer 131b or the second insulating layer 132b may be formed through a film lamination process using a solid-state insulating film.

In addition, an opening may be formed in the first insulating layer 131b or the second insulating layer 132b.

However, unlike the order of FIGS. 27D and 27E, after first forming the first conductive via 142 on the redistributed layer 141, the second insulating layer 132b may be formed so as to cover at least one side surface of the first conductive via 142.

Figure 27F:
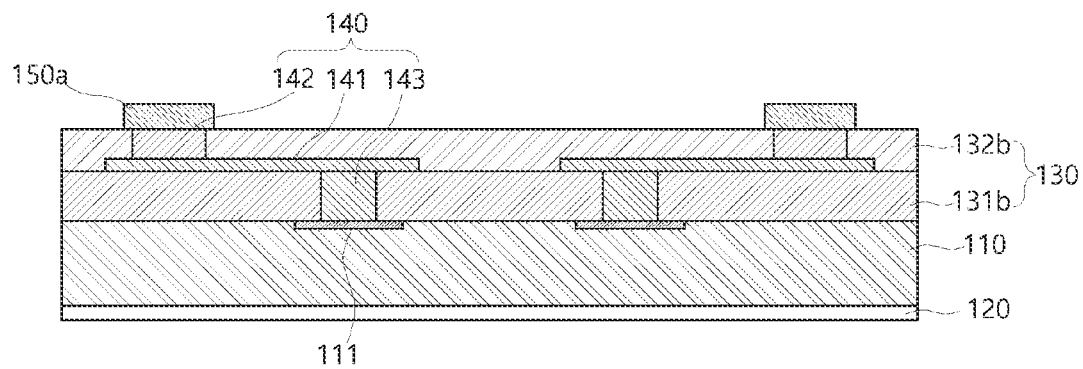
Figure 27G:
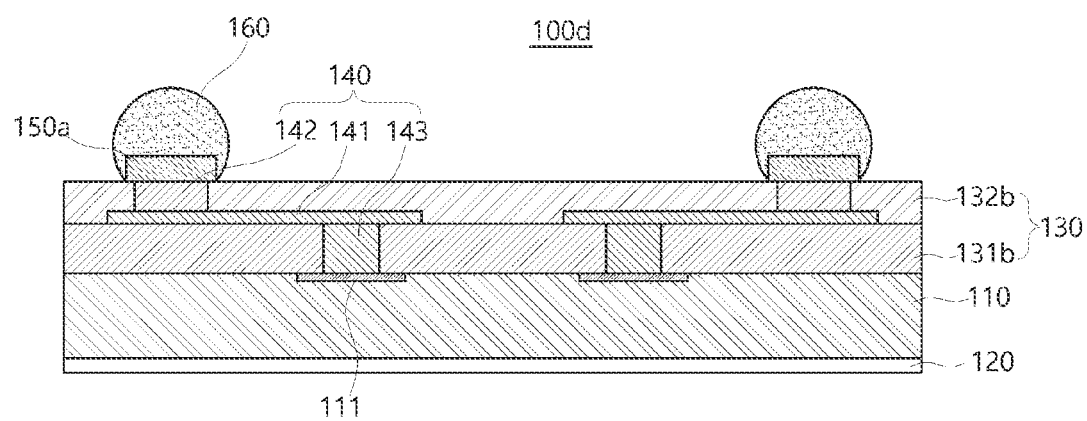

After forming the first structure of the fourth semiconductor package 100d according to the above-described process, as illustrated in FIGS. 27F and 28G, the external pad 150 and the external connection terminal 160 may be formed on the first structure of the fourth semiconductor package 100d.

<Manufacturing Method of the Fifth Semiconductor Package 100e>

Figure 28A:
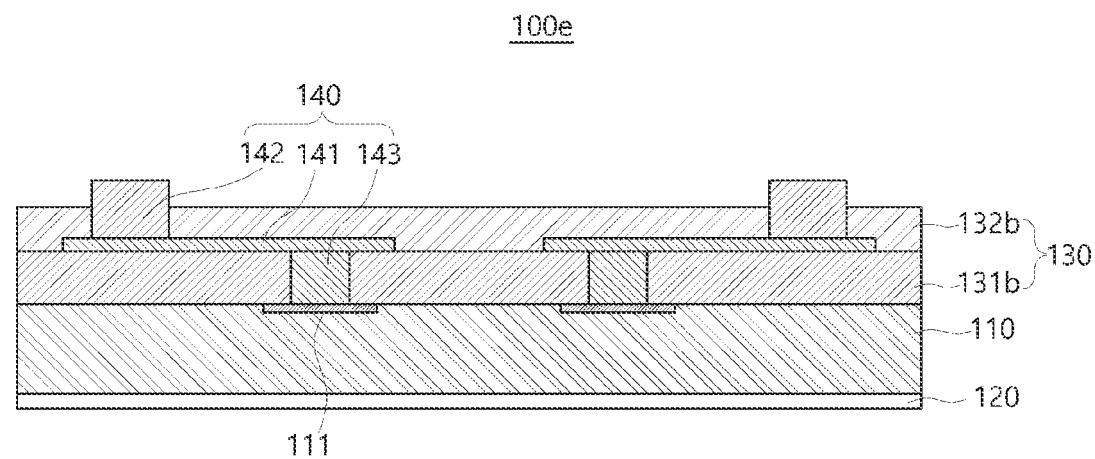
FIGS. 28A and 28B are cross-sectional diagrams sequentially illustrating a manufacturing method of a fifth semiconductor package 100e according to an exemplary embodiment of the present invention.
Figure 28B:
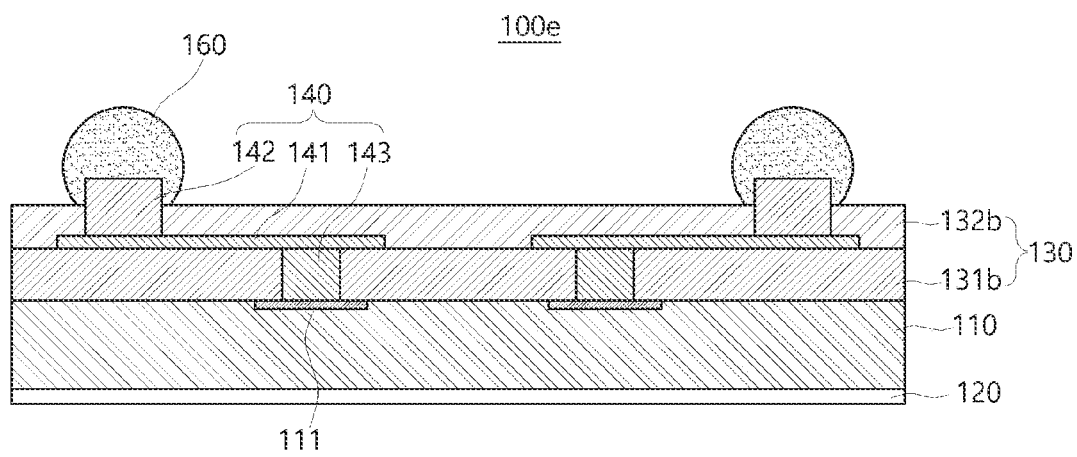

FIGS. 28A and 28B are cross-sectional diagrams sequentially illustrating the manufacturing method of the fifth semiconductor package 100e according to an exemplary embodiment of the present invention.

First, as illustrated in FIG. 28A, a first structure of the fifth semiconductor package 100e including a semiconductor chip 110, a protective layer 120, a first insulating layer 131b, a second insulating layer 132b, a redistributed layer 141, a the first conductive via 142, and the second conductive via 143 may be formed. In this case, in the first structure of the fifth semiconductor package 100e, the semiconductor chip 110, the protective layer 120, the first insulating layer 131b, the second insulating layer 132b, the redistributed layer 141, the first conductive via 142, and the second conductive via 143 may be formed in the same manner as the description of the first structure forming process in the above-described manufacturing method of the fourth semiconductor package 100d.

However, the first conductive via 142 may be formed to have a protrusion portion protruding towards the upper surface of the second insulating layer 132a which is the uppermost layer of the insulating pattern 130, and thus may replace the external pad 150.

Afterwards, as illustrated in FIG. 28B, the external connection terminal 160 may be formed on the first structure of the fifth semiconductor package 100e.

<Manufacturing Method of the Sixth Semiconductor Package 100f>

FIGS. 29A, 29B, 29C and 29D are cross-sectional diagrams sequentially illustrating the manufacturing method of the sixth semiconductor package 100f according to an exemplary embodiment of the present invention.

Figure 29A:
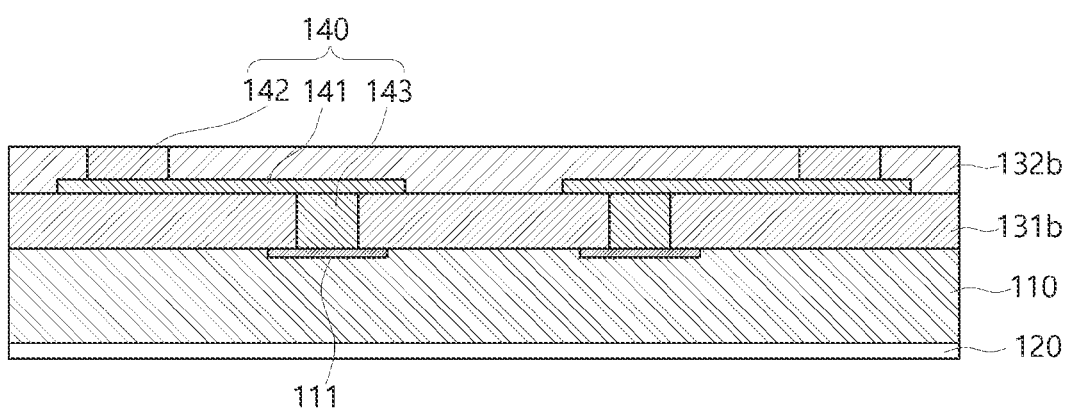
FIGS. 29A, 29B, 29C and 29D are cross-sectional diagrams sequentially illustrating a manufacturing method of a sixth semiconductor package 100f according to an exemplary embodiment of the present invention.
Figure 29B:
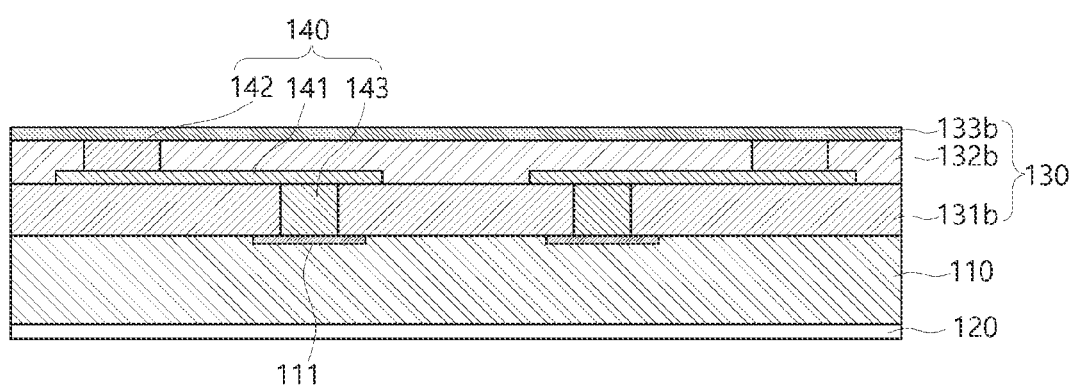

First, as illustrated in FIGS. 29A and 29B, a first structure of the sixth semiconductor package 100f including a semiconductor chip 110, a protective layer 120, a first insulating layer 131b, a second insulating layer 132b, a third insulating layer 133b, a redistributed layer 141, a first conductive via 142, and a second conductive via 143 may be formed. In this case, in the first structure of the sixth semiconductor package 100f, the semiconductor chip 110, the protective layer 120, the first insulating layer 131b, the second insulating layer 132b, the redistributed layer 141, the first conductive via 142, and the second conductive via 143 may be formed in the same manner as the description of the first structure forming process in the above-described manufacturing method of the fourth semiconductor package 100d.

However, when the second insulating layer 132b is formed, the height of the second insulating layer 132b may be lowered by removing a portion of the upper surface of the second insulating layer 132b through an etch back process, a polishing process, or the like, and the surface roughness of its upper surface may be increased.

After forming a portion of the first structure of the sixth semiconductor package 100f (refer to FIG. 29A) as described above, a third insulating layer 133b may be formed on the second insulating layer 132b and the first conductive via 142 so as to cover the second insulating layer 132b and the first conductive via 142 (refer to FIG. 29B), thereby forming the remainder of the first structure of the sixth semiconductor package 100f.

Meanwhile, the third insulating layer 133b may be formed through a film lamination process using a solid-state insulating film.

Figure 29C:
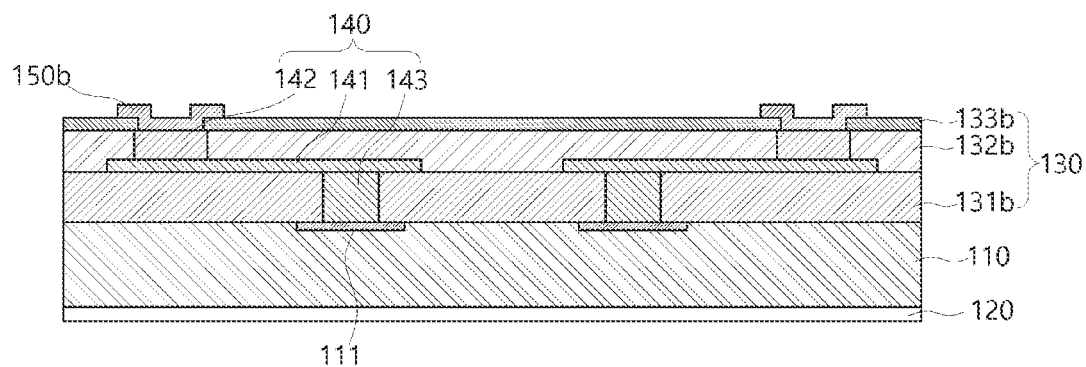
Figure 29D:
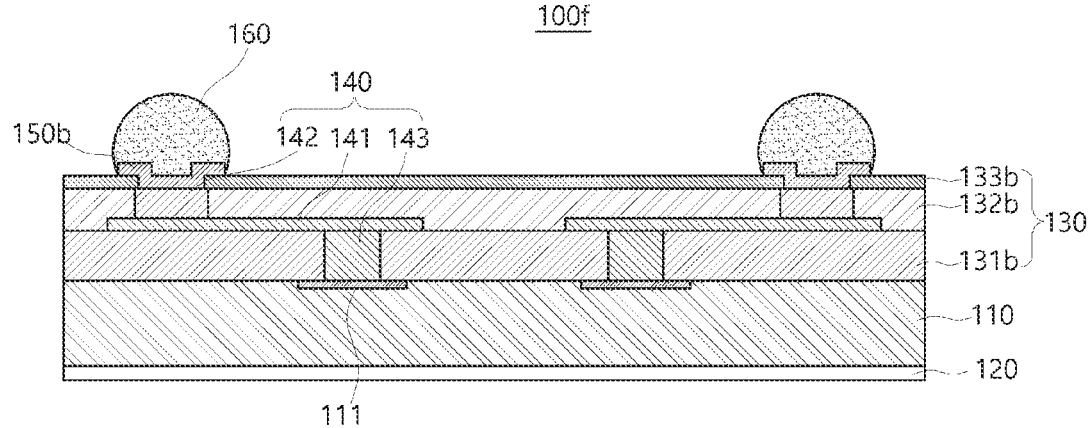

Afterwards, as illustrated in FIGS. 29C and 29D, the external pad 150 and the external connection terminal 160 may be formed on the first structure of the sixth semiconductor package 100f.

<Manufacturing Method of the Seventh Semiconductor Package (100g)>

FIGS. 30A, 30B, 30C, 30), 30E and 30F are cross-sectional diagrams sequentially illustrating the manufacturing method of the seventh semiconductor package 100g according to an exemplary embodiment of the present invention.

First, as illustrated in FIGS. 30A to 30E, a first structure of the seventh semiconductor package 100g including a semiconductor chip 110, a protective layer 120, a first insulating layer 131c, a second insulating layer 132c, a redistributed layer 141, and a second conductive via 143 may be formed.

To this end, the protective layer 120 may be formed on a second surface of the semiconductor chip 110 to cover the semiconductor chip 110.

Afterwards, after forming the second conductive via 143 on the semiconductor chip 110, a first insulating layer 131c may be formed to cover at least side surface of the second conductive via 143.

Figure 30A:
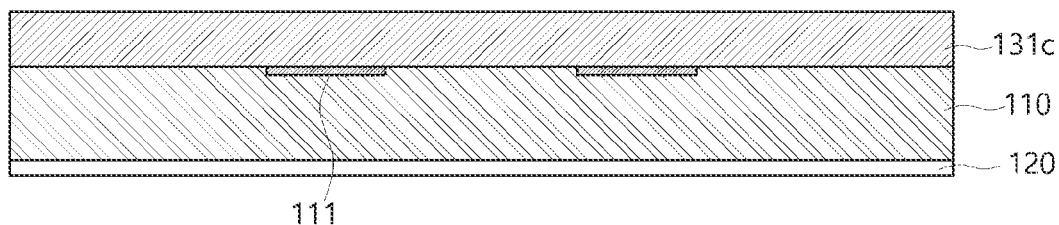
FIGS. 30A, 30B, 30C, 30D, 30E and 30F are cross-sectional diagrams sequentially illustrating a manufacturing method of a seventh semiconductor package 100g according to an exemplary embodiment of the present invention.
Figure 30B:
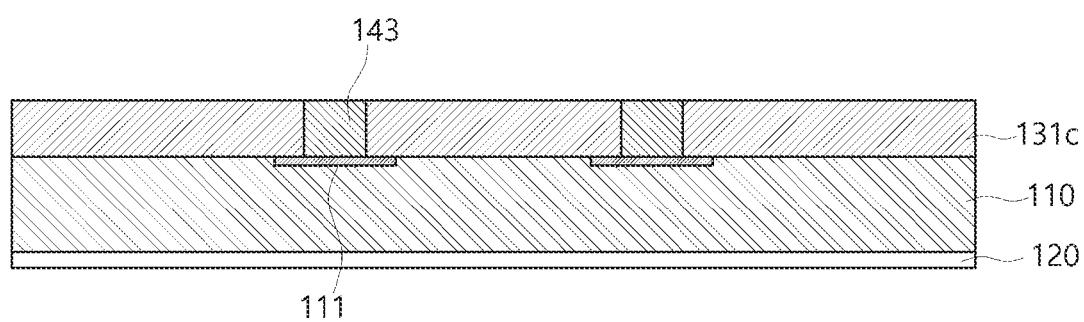

Unlike the above, as in the order of FIGS. 30A and 30B, after first forming the first insulating layer 131c on a first surface of the semiconductor chip 110 provided with the chip terminal 111 (refer to FIG. 30A), an opening exposing a portion of the chip terminal 111 through an etching process or the like may be formed on the top of the first insulating layer 131c, and through a plating process of filling the corresponding opening of the first insulating layer 131c with a conductive material, the second conductive via 143 electrically connected to the chip terminal 111 of the semiconductor chip 110 may be formed (refer to FIG. 30B).

Figure 30C:
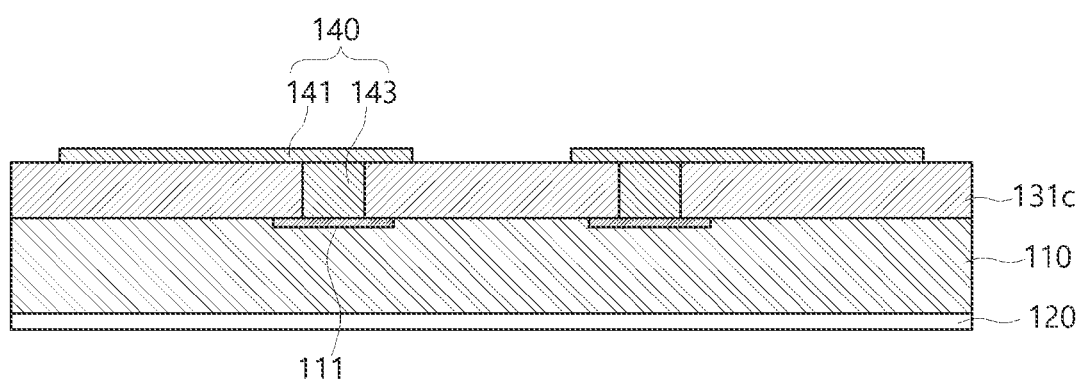
Figure 30D:
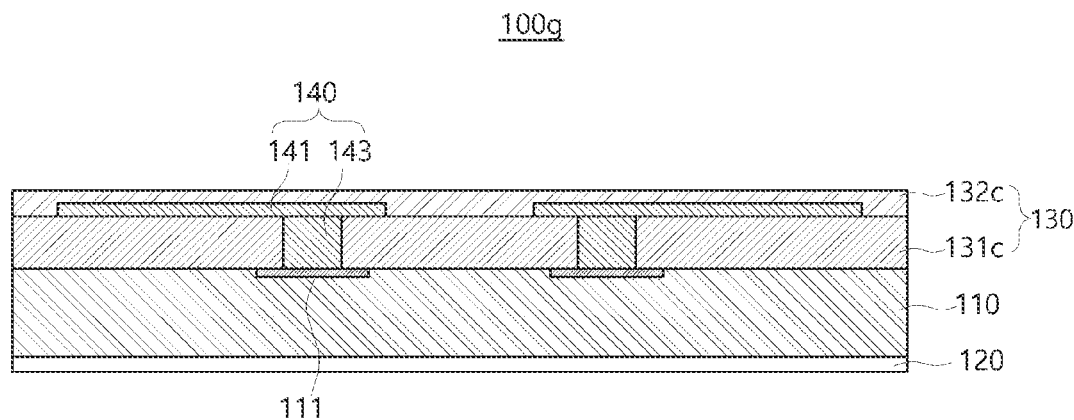

Afterwards, the redistributed layer 141 may be formed on the first insulating layer 131c, but the redistributed layer 141 may be formed to be electrically connected to the second conductive via 143 (refer to FIG. 30C).

Afterwards, the second insulating layer 132c may be formed on the redistributed layer 141 to cover the redistributed layer 141 (refer to FIG. 30I)).

Meanwhile, the first insulating layer 131c or the second insulating layer 132c may be formed through a film lamination process using a solid-state insulating film.

In addition, the opening may be formed in the first insulating layer 131c or the second insulating layer 132c, and in particular, on the first insulating layer 131c that is formed to be relatively thick.

Figure 30E:
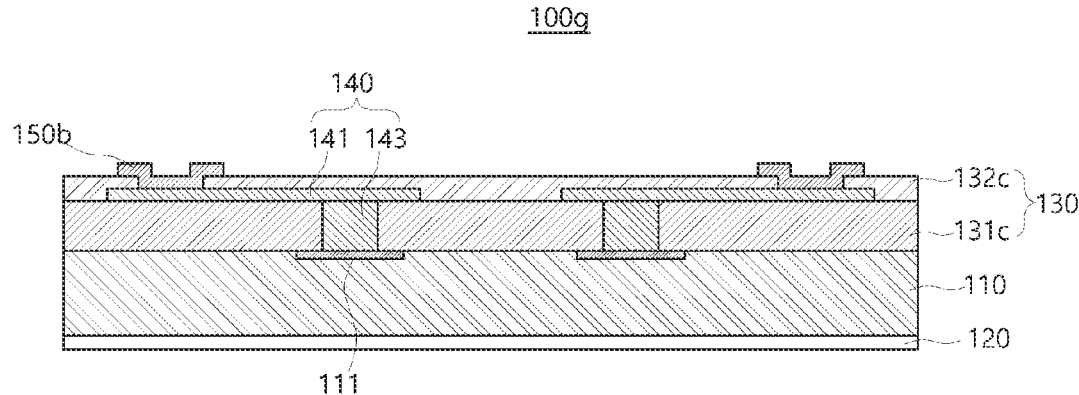
Figure 30F:
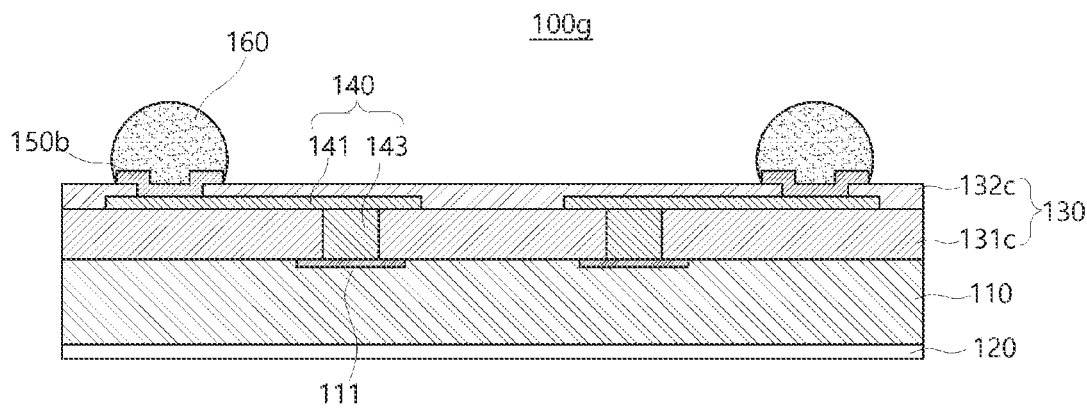

After forming the first structure of the seventh semiconductor package 100g according to the above-described process, as illustrated in FIGS. 30E and 28F, the external pad 150 and the external connection terminal 160 may be formed on the first structure of the seventh semiconductor package 100g.

<Manufacturing Method of the Eighth Semiconductor Package 100h>

First, a first structure of the eighth semiconductor package 100h including a semiconductor chip 110, a protective layer 120, a first insulating layer 131c, a second insulating layer 132c, a third insulating layer 133c, a redistributed layer 141, a second conductive via 143, a third conductive via 144 may be formed. In this case, in the first structure of the eighth semiconductor package 100h, the semiconductor chip 110, the protective layer 120, the first insulating layer 131c, and the second insulating layer 132c may be formed in the same manner as the description of the first structure forming process in the description of the manufacturing method of the seventh semiconductor package 100g described above.

However, unlike the manufacturing method of the seventh semiconductor package 100g, the redistributed layer 141 is not formed on the first insulating layer 131c. That is, the second insulating layer 132c may be formed on the first insulating layer 131c to cover the first insulating layer 131c.

After forming a portion of the first structure of the eighth semiconductor package 100h as described above, the third conductive via 144 electrically connected to the second conductive via 143 may be formed on the second insulating layer 132c, the redistributed layer 141 electrically connected to the third conductive via 144 may be formed on the second insulating layer 132c and the third conductive via 144, and the third conductive via 144 may be formed to cover the second insulating layer 132c and the redistributed layer 141 such that the remainder of the first structure of the eighth semiconductor package 100h may be formed.

The third conductive via 144 may be first formed and then the second insulating layer 132c may be formed, or the second insulating layer 132c may be first formed and then formed on the third conductive via 144.

In addition, the opening may be formed in the third insulating layer 133c.

In order to form the redistributed layer 141, a seed metal layer covering at least a portion of the upper surface of the second insulating layer 132c may be formed, and a plating process may be performed using the seed metal layer as a seed.

Meanwhile, the third insulating layer 133c may be formed through a film lamination process using a solid-state insulating film.

<Manufacturing Method of the Ninth Semiconductor Package 100i>

First, a first structure of the ninth semiconductor package 100i including a semiconductor chip 110, a protective layer 120, a first insulating layer 131d, a second insulating layer 132d, a third insulating layer 133d, a redistributed layer 141, a first conductive via 142, a second conductive via 143, and a third conductive via 144 may be formed.

To this end, the protective layer 120 may be formed on a second surface of the semiconductor chip 110 to cover the semiconductor chip 110.

Afterwards, after forming the second conductive via 143 on the semiconductor chip 110, the first insulating layer 131d may be formed to cover at least one side surface of the second conductive via 143.

Unlike the above, the first insulating layer 131d may be formed before the second conductive via 143. That is, the first insulating layer 131d may be formed on a first surface of the semiconductor chip 110 provided with the chip terminal 111.

Afterwards, the second insulating layer 132d may be formed on the first insulating layer 131d to cover the first insulating layer 131d.

Afterwards, the third conductive via 144 electrically connected to the second conductive via 143 may be first formed and then the second insulating layer 132d may be formed, or the second insulating layer 132d may be first formed and then formed in the third conductive via 144.

Afterwards, the redistributed layer 141 electrically connected to the third conductive via 144 may be formed on the second insulating layer 132d and the third conductive via 144.

Afterwards, the first conductive via 142 electrically connected to the redistributed layer 141 may be first formed, and then the third insulating layer 133d may be formed, or the third insulating layer 133d may be first formed and then formed in the first conductive via 142.

Meanwhile, the first insulating layer 131d, the second insulating layer 132d, or the third insulating layer 133d may be formed through a film lamination process using a solid-state insulating film.

In addition, the first insulating layer 131d, the second insulating layer 132d, or the third insulating layer 133d, in particular, the first insulating layer 131d or the third insulating layer 133d which is formed to be relatively thick may form the opening.

After forming the first structure of the ninth semiconductor package 100i according to the above-described process, the external pad 150 and the external connection terminal 160 may be formed on the first structure of the ninth semiconductor package 100i.

<Manufacturing Method of the Tenth Semiconductor Package 100j>

First, a first structure of the tenth semiconductor package 100j including a semiconductor chip 110, a protective layer 120, a first insulating layer 131d, a second insulating layer 132d, a third insulating layer 133d, a fourth insulating layer 134d, a redistributed layer 141, a first conductive via 142, a second conductive via 143, and a third conductive via 144 may be formed. In this case, in the first structure of the tenth semiconductor package 100j, the semiconductor chip 110, the protective layer 120, the first insulating layer 131d, the second insulating layer 132d, the third insulating layer 133d, the redistributed layer (141), the first conductive via 142, the second conductive via 143, and the third conductive via 144 may be formed in the same manner as the description for the first structure formation process in the description of the manufacturing method of the ninth semiconductor package 100i.

However, when the third insulating layer 133d is formed, the height of the third insulating layer 133d may be lowered by removing a portion of the upper surface of the third insulating layer 133d through an etch back process, a polishing process, or the like, and the surface roughness of the upper surface may be increased. In this case, the increased surface roughness of the third insulating layer 133d may be greater than the surface roughness of the upper and lower surfaces of the fourth insulating layer 134d formed through a subsequent process. As the surface roughness of the upper surface of the third insulating layer 133d is increased as described above, the adhesive force of the third insulating layer 133d to the fourth insulating layer 134d formed through a subsequent process may be strengthened.

After forming a portion of the first structure of the tenth semiconductor package 100j as described above, by forming the fourth insulating layer 134d to cover the third insulating layer 133d and the first conductive via 142, the remainder of the first structure of the tenth of the semiconductor package 100j may be formed.

The fourth insulating layer 134d may be formed through a film lamination process using a solid-state insulating film.

In the detailed description of the present invention, specific exemplary embodiments have been described, but various modifications may be made without departing from the scope of the present invention. Therefore, the scope of the present invention is not limited to the described exemplary embodiments and should be determined by the claims to be described below and equivalents to the claims.

What is claimed is:

1. A semiconducting package, comprising:
   a lower structure comprising a semiconductor chip, wherein the semiconductor chip comprises a chip terminal;
   an external connection terminal connecting the semiconductor chip to an external device; and
   an intermediate connection structure comprising an upper surface and a lower surface, wherein the lower surface is opposite to the upper surface, and the intermediate connection structure is positioned between the lower structure and the external connection terminal;
   wherein a thickness ratio between the lower structure and the intermediate connection structure is 1:0.25 to 1:0.6, and
   wherein a first metal density in the intermediate connection structure below a maximum area region in a horizontal direction of the external connection terminal is higher than a second metal density in the intermediate connection structure of a surrounding region in contact with the external connection terminal by a same area as a maximum area.

2. The semiconductor package of claim 1, wherein the intermediate connection structure comprises a redistributed structure and an insulating structure,
   wherein the redistributed structure comprises an external pad protruding to the upper surface of the intermediate connection structure,
   wherein the external connection terminal is electrically connected to the external pad, and a part of the external connection terminal is physically in contact with an upper surface of the insulating structure.

3. The semiconductor package of claim 1, wherein a metal density in the intermediate connection structure corresponding to an upper region of the chip terminal is higher than a metal density in the intermediate connection structure of a surrounding region in contact with the chip terminal by a size of the chip terminal.

4. The semiconductor package of claim 1, wherein the intermediate connection structure comprises a redistributed structure and an insulating structure,
   wherein the redistributed structure comprises an external pad protruding to the upper surface of the intermediate connection structure,
   wherein the external connection terminal is electrically connected to the external pad, and a part of the external connection terminal is physically in contact with an upper surface of the insulating structure, and
   wherein a metal density in the intermediate connection structure corresponding to an upper region of the chip terminal is higher than a metal density in the intermediate connection structure of a surrounding region in contact with the chip terminal by a size of the chip terminal.

5. The semiconductor package of claim 1,
   wherein a metal density in the intermediate connection structure corresponding to an upper region of the chip terminal is higher than a metal density in the intermediate connection structure of a surrounding region in contact with the chip terminal by a size of the chip terminal.

6. The semiconductor package of claim 1, wherein the intermediate connection structure comprises at least one wire and a connection pad for transmitting an electrical signal, and
   wherein the connection pad connects the at least one wire and the chip terminal, or the at least one wire and the at least one wire, or the at least one wire and an external pad, and a metal density in the intermediate connection structure of an upper region or a lower region of the connection pad is higher than a metal density in the intermediate connection structure of a surrounding region in contact with the connection pad by a size of the connection pad.

7. The semiconductor package of claim 1, wherein the intermediate connection structure comprises a redistributed structure and an insulating structure,
   wherein the redistributed structure comprises an external pad protruding to the upper surface of the intermediate connection structure,
   wherein the external connection terminal is electrically connected to the external pad, and a part of the external connection terminal is physically in contact with an upper surface of the insulating structure,
   wherein the intermediate connection structure comprises at least one wire and a connection pad for transmitting an electrical signal, and
   wherein the connection pad connects the at least one wire and the chip terminal, or the at least one wire and the at least one wire, or the at least one wire and the external pad, and a metal density in the intermediate connection structure of an upper region or a lower region of the connection pad is higher than a metal density in the intermediate connection structure of a surrounding region in contact with the connection pad by a size of the connection pad.

8. The semiconductor package of claim 1,
   wherein the intermediate connection structure comprises at least one wire and a connection pad for transmitting an electrical signal, and
   wherein the connection pad connects the at least one wire and the chip terminal, or the at least one wire and the at least one wire, or the at least one wire and an external pad, and a metal density in the intermediate connection structure of an upper region or a lower region of the connection pad is higher than a metal density in the intermediate connection structure of a surrounding region in contact with the connection pad by a size of the connection pad.

9. The semiconductor package of claim 1, wherein the intermediate connection structure comprises a redistributed structure comprising a metal, a first insulating structure comprising a photosensitive material, and a second insulating structure comprising a non-photosensitive material, and
   wherein the metal is 5 wt. % to 30 wt. %, the photosensitive material is 0 wt. % to 20 wt. %, and a remaining amount is the non-photosensitive material.

10. The semiconductor package of claim 1, wherein the intermediate connection structure comprises a redistributed structure and an insulating structure,
 wherein the redistributed structure comprises an external pad protruding to the upper surface of the intermediate connection structure,
 wherein the external connection terminal is electrically connected to the external pad, and a part of the external connection terminal is physically in contact with an upper surface of the insulating structure,
 wherein the intermediate connection structure comprises the redistributed structure comprising a metal, a first insulating structure comprising a photosensitive material, and a second insulating structure comprising a non-photosensitive material, and
 wherein the metal is 5 wt. % to 30 wt. %, the photosensitive material is 0 wt. % to 20 wt. %, and a remaining amount is the non-photosensitive material.

11. The semiconductor package of claim 1,
 wherein the intermediate connection structure comprises a redistributed structure comprising a metal, a first insulating structure comprising a photosensitive material, and a second insulating structure comprising a non-photosensitive material, and
 wherein the metal is 5 wt. % to 30 wt. %, the photosensitive material is 0 wt. % to 20 wt. %, and a remaining amount is the non-photosensitive material.

12. The semiconductor package of claim 1, wherein the intermediate connection structure comprises a plurality of insulating layers.

13. The semiconductor package of claim 12, wherein a thickness of an external pad protruding above an uppermost insulating layer of the plurality of insulating layers and disposed inside the external connection terminal is 1 to 1.2 times with respect to a thickness of the plurality of insulating layers, and a thickness of the semiconductor chip is about 1.4 to 2.5 times with respect to the thickness of the plurality of insulating layers.

14. The semiconductor package of claim 12, wherein an effective coefficient of thermal expansion (CTE) of any one of the plurality of insulating layers is 7 ppm/° C. to 40 ppm/° C.,
 wherein the plurality of insulating layers comprise a thin insulating layer and a thick insulating layer adjacent to each other, and an effective CTE of the thick insulating layer is 7 ppm/° C. to 40 ppm/° C., and
 wherein an effective CTE of the semiconductor chip and the effective CTE of the plurality of insulating layers are similar to a CTE of the external device.

15. The semiconductor package of claim 12, wherein at least one insulating layer of the plurality of insulating layers comprises a filler having a diameter smaller than a thickness of the at least one insulating layer, and the at least one insulating layer comprising the filler is thickest among the plurality of insulating layers,
 wherein the at least one insulating layer comprising the filler is an uppermost insulating layer of the plurality of insulating layers, and a coefficient of thermal expansion (CTE) of the filler is greater than a CTE of the at least one insulating layer comprising the filler, and
 wherein the filler has a diameter of ¼ times or less compared to the thickness of the at least one insulating layer comprising the filler.

16. The semiconductor package of claim 12, wherein the lower structure comprises a non-conductive material and comprises a protective layer disposed to surround a side portion and a lower portion of the semiconductor chip.

17. The semiconductor package of claim 2, wherein a thickness of the semiconductor chip is 1.4 to 2.5 times with respect to a thickness of the plurality of insulating layers, and a coefficient of thermal expansion (CT) of an uppermost insulating layer is 7 ppm/PC to 40 ppm/° C.

18. The semiconductor package of claim 12, wherein a density ratio between a first metal density and a second metal density is 1:0.01 to 1:0.8.

* * * * *